(12) United States Patent
Iwakuma et al.

(10) Patent No.: US 7,829,204 B2
(45) Date of Patent: Nov. 9, 2010

(54) MATERIAL FOR ORGANIC ELECTROLUMINESCENT DEVICE AND ORGANIC ELECTROLUMINESCENT DEVICE USING SAME

(75) Inventors: Toshihiro Iwakuma, Chiba (JP); Seiji Tomita, Chiba (JP); Mitsunori Ito, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 979 days.

(21) Appl. No.: 10/582,963

(22) PCT Filed: Dec. 13, 2004

(86) PCT No.: PCT/JP2004/018960

§ 371 (c)(1),
(2), (4) Date: Jan. 5, 2007

(87) PCT Pub. No.: WO2005/057987

PCT Pub. Date: Jun. 23, 2005

(65) Prior Publication Data

US 2007/0104976 A1    May 10, 2007

(30) Foreign Application Priority Data

Dec. 15, 2003   (JP) .............................. 2003-417066

(51) Int. Cl.
*H01L 51/54* (2006.01)
*C09K 11/06* (2006.01)

(52) U.S. Cl. ................. 428/690; 428/917; 313/504; 313/506; 257/E51.047; 548/440; 546/101; 540/587; 556/407

(58) Field of Classification Search .............. 428/690, 428/917; 313/504, 506; 257/E51.047; 548/440; 546/101; 540/587; 556/407
See application file for complete search history.

(56) References Cited

U.S. PATENT DOCUMENTS 6,097,147 A    8/2000   Baldo et al.

FOREIGN PATENT DOCUMENTS

| EP | 1 202 608 | 5/2002 |
|----|-----------|--------|
| JP | 3-200889 | 9/1991 |
| JP | 7-138561 | 5/1995 |
| JP | 8-239655 | 9/1996 |
| JP | 2000 021572 | 1/2000 |
| JP | 2000-186066 | 7/2000 |
| JP | 2000186066 A * | 7/2000 |
| JP | 2001 313179 | 11/2001 |
| JP | 2002 193952 | 7/2002 |
| JP | 2003 031371 | 1/2003 |
| WO | 01 41512 | 6/2001 |

OTHER PUBLICATIONS

Machine Translation of JP 2000-186066 A.*
U.S. Appl. No. 11/300,368, filed Dec. 15, 2005, Nakano, et al.
C. W. Tang, et al., "Organic electroluminescent diodes", Appl. Phys. Lett., vol. 51, No. 12, Sep. 1987, pp. 913-915.
D. F. O'Brien, et al., "Improved energy transfer in electrophosphorescent devices", Applied Physics Letters, vol. 74, No. 3, Jan. 18, 1999, pp. 442-444.
M. A. Baldo, et al., "Very high-efficiency green organic light-emitting devices based on electrophosphorescence", Applied Physics Letters, vol. 75, No. 1, Jul. 5, 1999, pp. 4-7.
U.S. Appl. No. 10/584,262, filed Jun. 26, 2002, Iwakuma, et al.
U.S. Appl. No. 11/392,604, filed Mar. 30, 2006, Nakano, et al.

* cited by examiner

*Primary Examiner*—David Wu
*Assistant Examiner*—Vu Nguyen
(74) *Attorney, Agent, or Firm*—Oblon, Spivak, McClelland, Maier & Neustadt, L.L.P.

(57) ABSTRACT

A material for organic electroluminescence device with specific structure having poor symmetry. An an organic electroluminescence device comprising a cathode, an anode and an organic thin film layer which is sandwiched between the cathode and the anode and comprises at least one layer, wherein at least one layer in the organic thin film layer contains a material for the organic electroluminescence device described above. An organic electroluminescence device with excellent efficiency of light emission, without pixel defects and which is superior in heat resistance is obtained.

3 Claims, No Drawings

MATERIAL FOR ORGANIC ELECTROLUMINESCENT DEVICE AND ORGANIC ELECTROLUMINESCENT DEVICE USING SAME

TECHNICAL FIELD

The present invention relates to a material for an organic electroluminescence device and an organic electroluminescence device employing the same. Particularly, the present invention relates to the material for the organic electroluminescence device with an enhanced efficiency of light emission, free from defects in pixels, superior in heat resistance and with prolonged lifetime, together with the organic electroluminescence device employing the material.

BACKGROUND ART

An organic electroluminescence ("electroluminescence" will be occasionally referred to as "EL", hereinafter) device is a spontaneous light emitting device which utilizes the principle that a fluorescent substance emits light by energy of recombination of holes injected from an anode and electrons injected from a cathode when an electric field is applied. Since an organic EL device of the laminate type driven under a low electric voltage was reported by C. W. Tang et al. of Eastman Kodak Company (C. W. Tang and S. A. Vanslyke, Applied Physics Letters, Volume 51, Pages 913, 1987), many studies have been conducted on organic EL devices using organic materials as the constituting materials. Tang et al. used a laminate structure using tris(8-hydroxyquinolinol aluminum) for the light emitting layer and a triphenyldiamine derivative for the hole transporting layer. Advantages of the laminate structure are that the efficiency of hole injection into the light emitting layer can be increased, that the efficiency of forming excited particles which are formed by blocking and recombining electrons injected from the cathode can be increased, and that excited particles formed among the light emitting layer can be enclosed. As the structure of the organic EL device, a two-layered structure having a hole transporting (injecting) layer and an electron transporting and light emitting layer and a three-layered structure having a hole transporting (injecting) layer, a light emitting layer and an electron transporting (injecting) layer are well known. To increase the efficiency of recombination of injected holes and electrons in the devices of the laminate type, the structure of the device and the process for forming the device have been studied.

As the light emitting material of the organic EL device, chelate complexes such as tris(8-quinolinolato)aluminum, coumarine derivatives, tetraphenylbutadiene derivatives, bis-styrylarylene derivatives and oxadiazole derivatives are known. It is reported that light in the visible region ranging from blue light to red light can be obtained by using these light emitting materials, and development of a device exhibiting color images is expected (refer to, for example, Patent Literatures 1 to 3 below).

Further, in late years, employing of a phosphorescent material other than the fluorescent material as the light emitting layer of the organic EL device is proposed (refer to, for example, Non-patent literatures 1 and 2 below). As described above, a great efficiency of light emission is achieved by utilizing an organic phosphorescent material excited to the singlet state and the triplet state in the light emitting layer of an organic EL device. It is considered that singlet excimers and triplet excimers are formed in relative amounts of 1:3 due to the difference in the multiplicity of spin when electrons and holes are recombined in an organic EL device. Therefore, it is expected that an efficiency of light emission 3 to 4 times as great as that of a device utilizing fluorescence alone can be achieved by utilizing a phosphorescent light emitting material.

In the organic EL devices such as those described above, constructions in which layers such as an anode, an organic light emitting layer, an electron transporting layer (a hole blocking layer), an electron injecting layer and a cathode are successively laminated are used so that light emission in the condition excited to the triplet state or from excimers in the triplet state is not quenched. In the organic light emitting layer, a host compound and the phosphorescent light emitting compound are employed (refer to, for example, Patent Literatures 4 and 5 below). In these patent literature, 4,4-N,N dicarbazole biphenyl have been used as a host compound. However, there were problems that the host compound tends to crystallize because its glass transition temperature is 110° C. or less and further, because it is too symmetrical and that short circuit or pixel defect generates in the heat resistance test of the organic EL device.

Furthermore, it was found that a crystal growth generates at the position where there is a foreign matter or a protrusion of an electrode in an occasion of vapor deposition, and that the defects generate more than the primary stage before the heat resistance test. Still further, carbazole derivatives having symmetry of order 3 are used as the host compound. However, it is too symmetrical to evade the crystal growth generation at the position where there is a foreign matter or a protrusion of an electrode in an occasion of vapor deposition, or the defects generation more than the primary stage before the heat resistance test.

Moreover, inventions about a use of a compound of a host compound and a phosphorus photoluminescent compound for an organic light emitting layer are disclosed (refer to, for example, Patent Literatures 6 to 8 below). Despite an improvement of heat resistance in Patent Literature 6, compounds disclosed in it still have favorably symmetric because they have phenylene structures composing the compounds with bonding styles coupling at almost all para positions, remaining only central benzene ring bonding at meta position, and accordingly, a problem of crystallization was unavoidable. Also, Patent Literatures 7 and 8 below disclose host materials introducing heterocyclic skeleton such as triazine skeleton in addition to carbazole skeleton, however, triazine rings bonding via phenylenes at para positions of carbazole skeleton keep high linearity of the compound, resultantly reducing triplet excitation energy of the host. Accordingly, it was difficult to convey energy from the host to the phosphorus photoluminescent dopant, and there were problems of causing degradation in efficiency of light emission particularly about blue phosphorus photoluminescent devices. Still further, although Patent Literature 9 below discloses a compound made by bonding a group having 5 or more benzene rings with carbazole skeleton, the compound is highly symmetric about its skeleton, easily crystallizable, and highly linear about the group having 5 or more benzene rings. Therefore, there was a problem that the compound reduces the triplet excitation energy.

Patent Literature 1: Japanese Unexamined Patent Application Laid-Open No. Heisei 8(1996)-239655
Patent Literature 2: Japanese Unexamined Patent Application Laid-Open No. Heisei 7(1995)-138561
Patent Literature 3: Japanese Unexamined Patent Application Laid-Open No. Heisei 3(1991)-200889
Patent Literature 4: U.S. Pat. No. 6,097,147
Patent Literature 5: International PCT Publication No. WO 01/41512

Patent Literature 6: Japanese Unexamined Patent Application Laid-Open No. 2003-31371

Patent Literature 7: Japanese Unexamined Patent Application Laid-Open No. 2002-193952

Patent Literature 8: European Patent Publication No. EP 1202608

Patent Literature 9: Japanese Unexamined Patent Application Laid-Open No. 2001-313179

Non-patent Literature 1: D. F. O'Brien and M. A. Baldo et al "Improved energy transfering electrophosphorescent devices" Applied Physics letters Vol. 74 No. 3, pp442-444, Jan. 18, 1999

Non-patent Literature 2: M. A. Baldo et al "Very high-efficiency green organic light-emitting devices based on electrophosphorescence" Applied Physics letters Vol. 75 No. 1, pp4-6, Jul. 5, 1999

DISCLOSURE OF THE INVENTION

The present invention has been made to overcome the above problems and has an object of providing a material for the organic electroluminescence device with an enhanced efficiency of light emission, free from defects in pixels, superior in heat resistance and with prolonged lifetime, together with the organic electroluminescence device employing the material.

As a result of intensive and extensive researches for overcoming the above problems, the inventors have found that using a compound with great molecular weight and with poor symmetry as a host material enables to achieve an organic EL device with an enhanced efficiency of light emission, free from defects in pixels, superior in heat resistance and with prolonged lifetime. The present invention has been accomplished on the basis of the above finding.

Namely, the present invention provides a material for an organic electroluminescence device comprising a compound represented by any one of following general formulae (1) to (3):

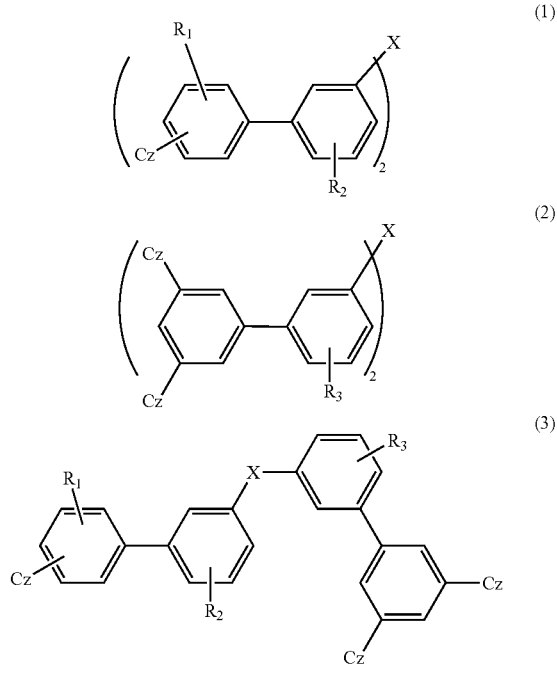

wherein $R_1$ to $R_3$ each independently represents a hydrogen atom, a halogen atom, an alkyl group having 1 to 40 carbon atoms and further may have a substituent, a heterocyclic group having 3 to 30 carbon atoms and further may have a substituent, an alkoxy group having 1 to 40 carbon atoms and further may have a substituent, an aryl group having 6 to 40 carbon atoms and further may have a substituent, an aryloxy group having 6 to 40 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent; each of $R_1$ to $R_3$ may plurally exist, and an adjacent group may form a saturated or an unsaturated ring structure between each other respectively;

X is a group expressed by any one of following general formulae (4) to (9):

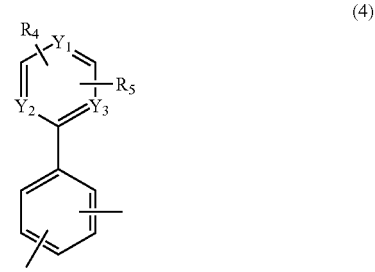

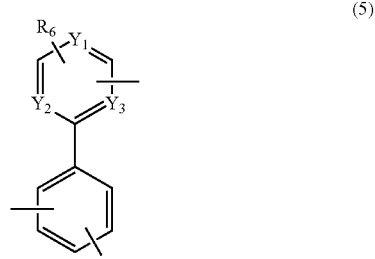

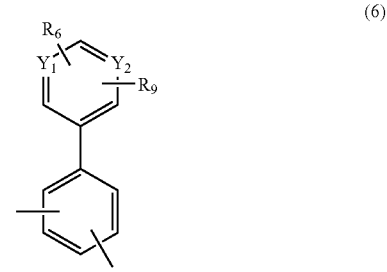

-continued

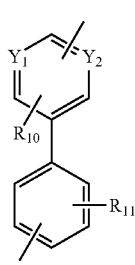

(7)

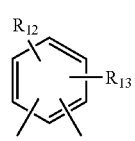

(8)

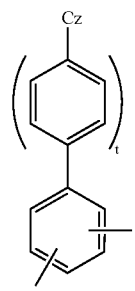

(9)

wherein $R_4$ to $R_{18}$ each independently represents a hydrogen atom, a halogen atom, an alkyl group having 1 to 40 carbon atoms and further may have a substituent, a heterocyclic group having 3 to 30 carbon atoms and further may have a substituent, an alkoxy group having 1 to 40 carbon atoms and further may have a substituent, an aryl group having 6 to 40 carbon atoms and further may have a substituent, an aryloxy group having 6 to 40 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent; each of $R_4$ to $R_{18}$ may plurally exist, and an adjacent group may form a saturated or an unsaturated ring structure between each other respectively;

$Y_1$ to $Y_3$ each independently represents —CR or a nitrogen atom while R represents a hydrogen atom, a group which bonds to X in any one of the above general formulae (1) to (3), or any one of $R_4$, $R_5$, $R_6$, $R_8$, $R_9$ and $R_{10}$; and when any of $Y_1$ to $Y_3$ represents a nitrogen atom, it exists at least 2 in the same group.

In the general formula (9), t represents an integer of 0 or 1.

Cz is a group expressed by a following general formula (10) or a following general formula (11).

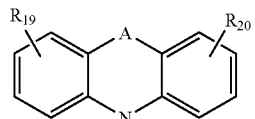

(10)

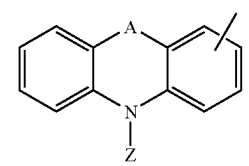

(11)

wherein A represents a single bond, —($C_{14}R_{15}$)n—, —$SiR_{16}R_{17}$—, —$NR_{18}$—, —O— or —S—; while a couple of $R_{14}$ and $R_{15}$, and a couple of $R_{16}$ and $R_{17}$ may bond each other to form a saturated or an unsaturated ring structure; and n represents an integer of 1 to 3;

$R_4$ to $R_{18}$ each independently represents a hydrogen atom, a halogen atom, an alkyl group having 1 to 40 carbon atoms and further may have a substituent, a heterocyclic group having 3 to 30 carbon atoms and further may have a substituent, an alkoxy group having 1 to 40 carbon atoms and further may have a substituent, an aryl group having 6 to 40 carbon atoms and further may have a substituent, an aryloxy group having 6 to 40 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent; each of $R_{19}$ to $R_{20}$ may plurally exist, and an adjacent group may form a saturated or an unsaturated ring structure between each other respectively; Z represents an alkyl group having 1 to 20 carbon atoms which may be substituted, an aryl group having 1 to 18 carbon atoms which may be substituted or an aralkyl group having 7 to 40 carbon atoms which may be substituted.

Further, the present invention provides an organic electroluminescence device comprising an anode, a cathode and at least one organic thin film layer having a light emitting layer sandwiched between the anode and the cathode, wherein at least one of the organic thin film layer comprises the foregoing material for an organic electroluminescence device.

INDUSTRIAL APPLICABILITY

Employing the compound represented by any one of general formulae (1) to (3) of the present invention as the material for an organic electroluminescence device provides the organic electroluminescence device with an enhanced current efficiency of light emission, without any pixel defects, with superiority in heat resistance and with prolonged lifetime. Therefore, the organic EL device of the present invention is very useful for applications such as light sources of various electronic instruments.

THE PREFERRED EMBODIMENT TO CARRY OUT THE INVENTION

The present invention provides a material for an organic electroluminescence device comprising a compound represented by any one of following general formulae (1) to (3):

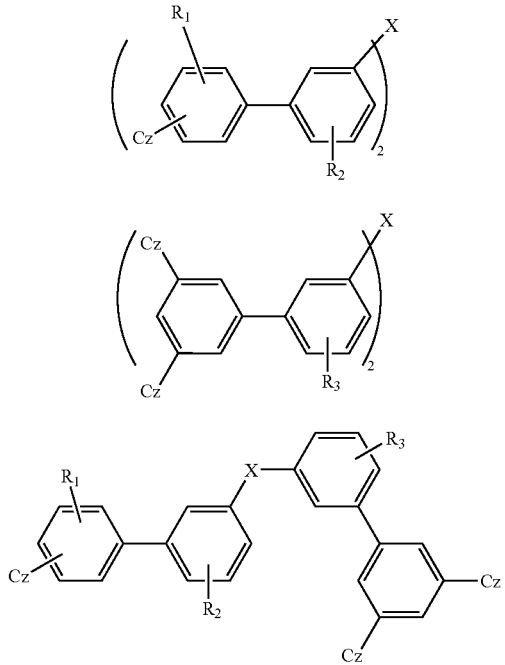

The above general formula (1) is defined as any one of following structures (1'), (1") and (1'").

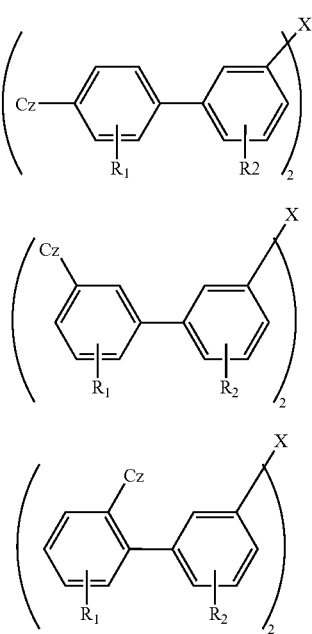

The above general formula (3) is defined as any one of following structures (3'), (3") and (3'").

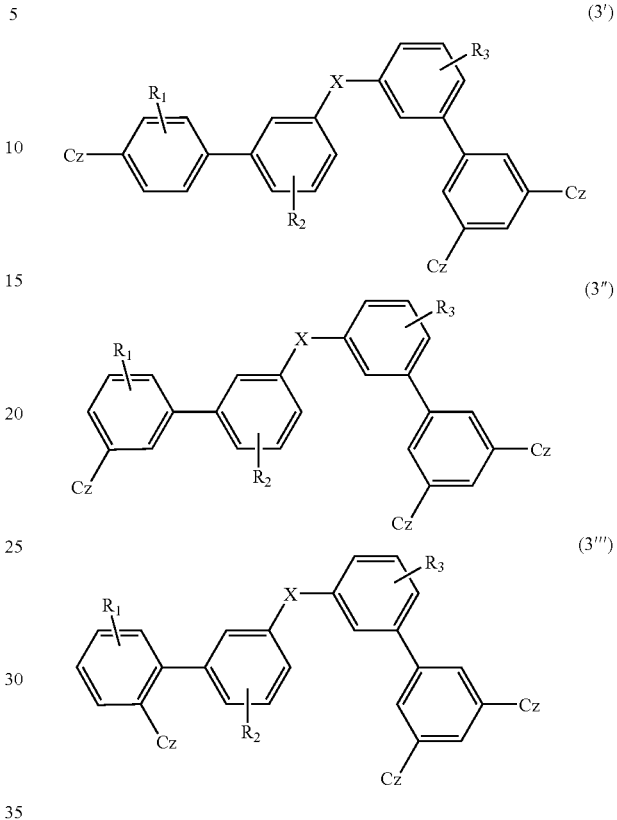

Among those, a compound with the structure (1') or the structure (3') is particularly preferable.

In the general formulae (1) to (3), $R_1$ to $R_3$ each independently represents a hydrogen atom, a halogen atom, an alkyl group having 1 to 40 (preferably 1 to 30) carbon atoms and further may have a substituent, a heterocyclic group having 3 to 30 (preferably 3 to 20) carbon atoms and further may have a substituent, an alkoxy group having 1 to 40 (preferably 1 to 30) carbon atoms and further may have a substituent, an aryl group having 6 to 40 (preferably 6 to 30) carbon atoms and further may have a substituent, an aryloxy group having 6 to 40 (preferably 6 to 30) carbon atoms and further may have a substituent, an aralkyl group having 7 to 40 (preferably 7 to 30) carbon atoms and further may have a substituent, an alkenyl group having 2 to 40 (preferably 2 to 30) carbon atoms and further may have a substituent, an alkylamino group having 1 to 80 (preferably 1 to 60) carbon atoms and further may have a substituent, an arylamino group having 6 to 80 (preferably 6 to 60) carbon atoms and further may have a substituent, an aralkylamino group having 7 to 80 (preferably 7 to 60) carbon atoms and further may have a substituent, an alkylsilyl group having 3 to 10 (preferably 3 to 9) carbon atoms and further may have a substituent, and an arylsilyl group or a cyano group having 6 to 30 (preferably 8 to 20) carbon atoms and further may have a substituent. Each of $R_1$ to $R_3$ may plurally exist, and an adjacent group may form a saturated or an unsaturated ring structure between each other respectively.

Examples of the halogen atom represented by $R_1$ to $R_3$ include fluorine atom, chlorine atom, bromine atom, iodine atom, etc.

Examples of the alkyl group represented by $R_1$ to $R_3$ each having 1 to 40 carbon atoms and further may have a substituent include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentyl hexyl group, 1-butylpentyl group, 1-heptyloctyl group, 3-methylpentyl group, hydroxymethyl group, 1-hydroxyethyl group, 2-hydroxyethyl group, 2-hydroxy isobutyl group, 1,2-dihydroxy ethyl group, 1,3-dihydroxy isopropyl group, 2,3-dihydroxy-t-butyl group, 1,2,3-trihydroxy propyl group, chloromethyl group, 1-chloroethyl group, 2-chloroethyl group, 2-chloro isobutyl group, 1,2-dichloroethyl group, 1,3-dichloro isopropyl group, 2,3-dichloro-t-butyl group, 1,2,3-trichloropropyl group, bromomethyl group, 1-bromoethyl group, 2-bromoethyl group, 2-bromo isobutyl group, 1,2-dibromo ethyl group, 1,3-dibromo isopropyl group, 2,3-dibromo-t-butyl group, 1,2,3-tribromopropyl group, iodomethyl group, 1-iodo ethyl group, 2-iodo ethyl group, 2-iodo isobutyl group, 1,2-diiodo ethyl group, 1,3-diiodo isopropyl group, 2,3-diiodo-t-butyl group, 1,2,3-triiodopropyl group, aminomethyl group, 1-amino ethyl group, 2-amino ethyl group, 2-amino isobutyl group, 1,2-diamino ethyl group, 1,3-diamino isopropyl group, 2,3-diamino-t-butyl group, 1,2,3-triamino propyl group, cyanomethyl group, 1-cyanoethyl group, 2-cyanoethyl group, 2-cyano isobutyl group, 1,2-dicyano ethyl group, 1,3-dicyano isopropyl group, 2,3-dicyano-t-butyl group, 1,2,3-tricyano propyl group, nitromethyl group, 1-nitroethyl group, 2-nitroethyl group, 1,2-dinitro ethyl group, 2,3-dinitro-t-butyl group, 1,2,3-trinitro propyl group, cyclopentyl group, cyclohexyl group, cyclo octyl group, 3,5-tetramethyl cyclohexyl group, etc.

Among those, methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 1-pentylhexyl group, 1-butylpentyl group, 1-heptyloctyl group, cyclohexyl group, cyclo octyl group and 3,5-tetramethyl cyclohexyl group are preferable.

Examples of the above heterocyclic group represented by $R_1$ to $R_3$ each having 3 to 30 carbon atoms and further may have a substituent include 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-iso indolyl group, 2-iso indolyl group, 3-iso indolyl group, 4-iso indolyl group, 5-iso indolyl group, 6-iso indolyl group, 7-iso indolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 6-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carboline-1-yl group, β-carboline-3-yl group, β-carboline-4-yl group, β-carboline-5-yl group, β-carboline-6-yl group, β-carboline-7-yl group, β-carboline-8-yl group, β-carboline-9-yl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl) pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, 4-t-butyl 3-indolyl group, etc.

Among those, 2-pyridinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-iso indolyl group, 2-iso indolyl group, 3-iso indolyl group, 4-iso indolyl group, 5-iso indolyl group, 6-iso indolyl group, 7-iso indolyl group, 1-carbazolyl group, 2-carbazolyl group, 3-carbazolyl group, 4-carbazolyl group and 9-carbazolyl group are preferable.

The alkoxy group represented by $R_1$ to $R_3$ each having 1 to 40 carbon atoms and further may have a substituent is expressed by —OY and specific examples of Y are the same as described about the foregoing alkyl group including the preferable examples.

Examples of the aryl group represented by $R_1$ to $R_3$ each having 6 to 40 carbon atoms and further may have a substituent include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenyl-yl group, 4"-t-butyl-p-terphenyl-4-yl group, o-cumenyl group, m-cumenyl group, p-cumenyl group, 2,3-xylyl group, 3,4-xylyl group, 2,6-xylyl group, mesityl group, etc.

Among those, phenyl group, 1-naphthyl group, 2-naphthyl group, 9-phenanthryl group, 2-biphenylyl group, 3-biphenylyl group, 4-biphenylyl group, p-tolyl group and 3,4-xylyl group are preferable.

The aryloxy group represented by $R_1$ to $R_3$ each having 6 to 40 carbon atoms and further may have a substituent is expressed by —OAr and specific examples of Ar are the same as described about the foregoing aryl group including the preferable examples.

Examples of the aralkyl group represented by $R_1$ to $R_3$ each having 7 to 40 carbon atoms and further may have a substituent include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1 chloro-2-phenylisopropyl group, etc.

Among those, benzyl group, p-cyanobenzyl group, m-cyanobenzyl group, o-cyanobenzyl group, 1-phenylethyl group, 2-phenylethyl group, 1-phenylisopropyl group, 2-phenylisopropyl group are preferable.

Examples of the alkenyl group represented by $R_1$ to $R_3$ each having 2 to 40 carbon atoms and further may have a substituent include vinyl group, aryl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylaryl group, 1,1-dimethylaryl group, 2-methylaryl group, 1-phenylaryl group, 2-phenylaryl group, 3-phenylaryl group, 3,3-diphenylaryl group, 1,2-dimethylaryl group, 1-phenyl-1-butenyl group and 3-phenyl-1-butenyl group and so on, preferably styryl group, 2,2-diphenylvinyl group, 1,2-diphenylvinyl group, etc.

The alkylamino group represented by $R_1$ to $R_3$ each having 1 to 80 carbon atoms and further may have a substituent, the arylamino group represented by $R_1$ to $R_3$ each having 6 to 80 carbon atoms and further may have a substituent, and the aralkylamino group represented by $R_1$ to $R_3$ each having 7 to 80 carbon atoms and further may have a substituent are expressed as —$NQ_1Q_2$, and further, specific examples of $Q_1$ and $Q_2$ are each independently the same as described about the foregoing alkyl group, the foregoing aryl group and the foregoing aralkyl group including the preferable examples respectively.

Examples of the alkylsilyl group represented by $R_1$ to $R_3$ each having 3 to 10 carbon atoms and further may have a substituent include trimethylsilyl group, triethylsilyl group, t-butyldimethylsilyl group, vinyldimethylsilyl group, propyldimethylsilyl group, etc.

Examples of the arylsilyl group represented by $R_1$ to $R_3$ each having 6 to 30 carbon atoms and further may have a substituent include triphenylsilyl group, phenyldimethylsilyl group, t-butyldiphenylsilyl group, etc.

Further, examples of the ring structure formed when $R_1$ to $R_3$ plurally exist include an unsaturated 6-member ring such as benzene ring or so, a saturated or an unsaturated 5-member ring structure or a saturated or an unsaturated 7-member ring structure, etc.

In the general formulae (1) to (3), X is a group shown by any one of the following general formulae (4) to (9).

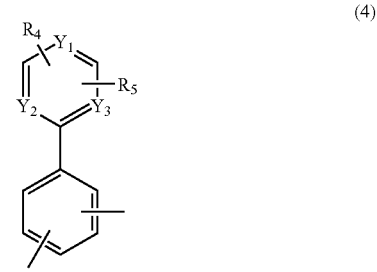

(4)

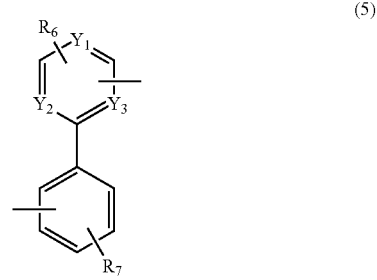

(5)

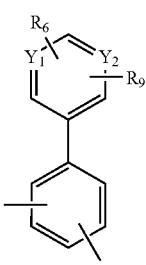
(6)

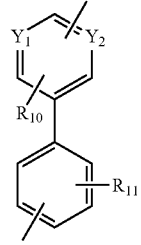
(7)

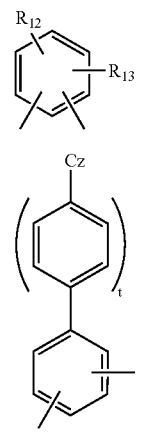
(8)

(9)

In the general formulae (4) to (9), $R_4$ to $R_{18}$ each independently represents a hydrogen atom, a halogen atom, an alkyl group having 1 to 40 (preferably 1 to 30) carbon atoms and further may have a substituent, a heterocyclic group having 3 to 30 (preferably 3 to 20) carbon atoms and further may have a substituent, an alkoxy group having 1 to 40 (preferably 1 to 30) carbon atoms and further may have a substituent, an aryl group having 6 to 40 (preferably 6 to 30) carbon atoms and further may have a substituent, an aryloxy group having 6 to 40 (preferably 6 to 30) carbon atoms and further may have a substituent, an aralkyl group having 7 to 40 (preferably 7 to 30) carbon atoms and further may have a substituent, an alkenyl group having 2 to 40 (preferably 2 to 30) carbon atoms and further may have a substituent, an alkylamino group having 1 to 80 (preferably 1 to 60) carbon atoms and further may have a substituent, an arylamino group having 6 to 80 (preferably 6 to 60) carbon atoms and further may have a substituent, an aralkylamino group having 7 to 80 (preferably 7 to 60) carbon atoms and further may have a substituent, an alkylsilyl group having 3 to 10 (preferably 3 to 9) carbon atoms and further may have a substituent, and an arylsilyl group or a cyano group having 6 to 30 (preferably 8 to 20) carbon atoms and further may have a substituent. Each of $R_4$ to $R_{18}$ may plurally exist, and an adjacent group may form a saturated or an unsaturated ring structure between each other respectively.

Specific examples of the group represented by $R_4$ to $R_{18}$ are the same as described about the foregoing $R_1$ to $R_3$ including the preferable examples.

In the general formulae (4) to (9), $Y_1$ to $Y_3$ each independently represents —CR or a nitrogen atom while R represents a hydrogen atom, a group which bonds to X in any one of the above general formulae (1) to (3), or any one of $R_4$, $R_5$, $R_6$, $R_8$, $R_9$ and $R_{10}$; and when any of $Y_1$ to $Y_3$ represents a nitrogen atom, it exists at least 2 in the same group.

In the general formula (9), t represents an integer of 0 or 1.

It is preferable that the group represented by the general formula (4) is any one among following structures.

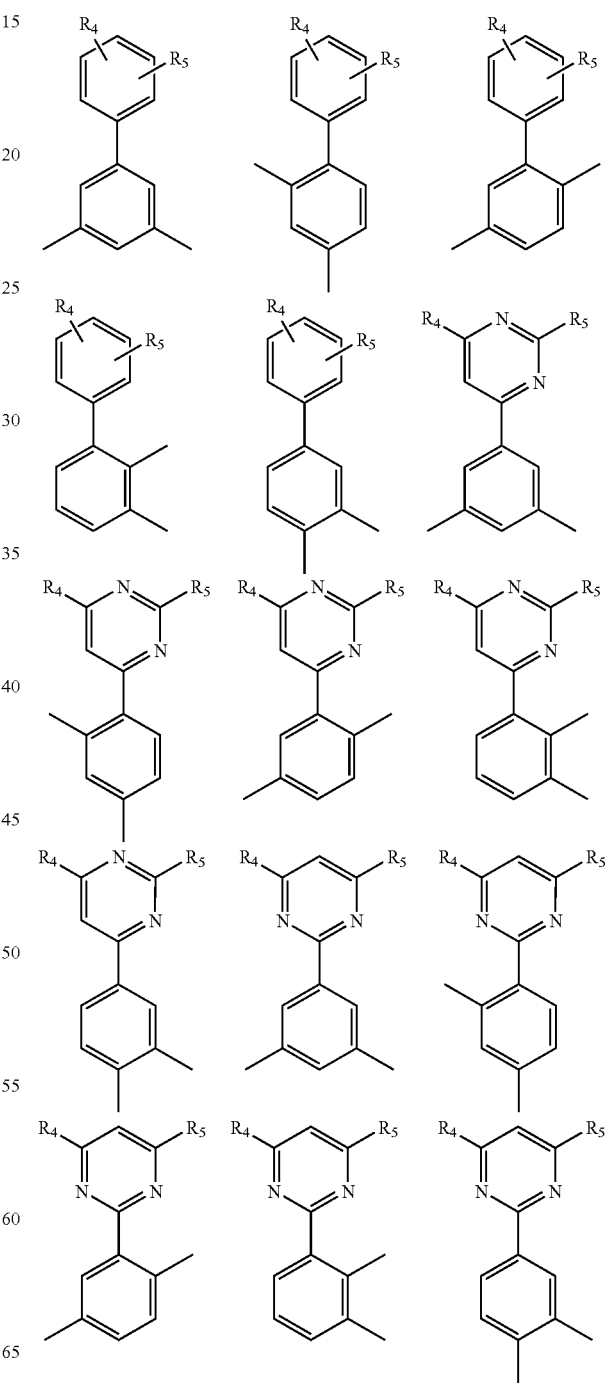

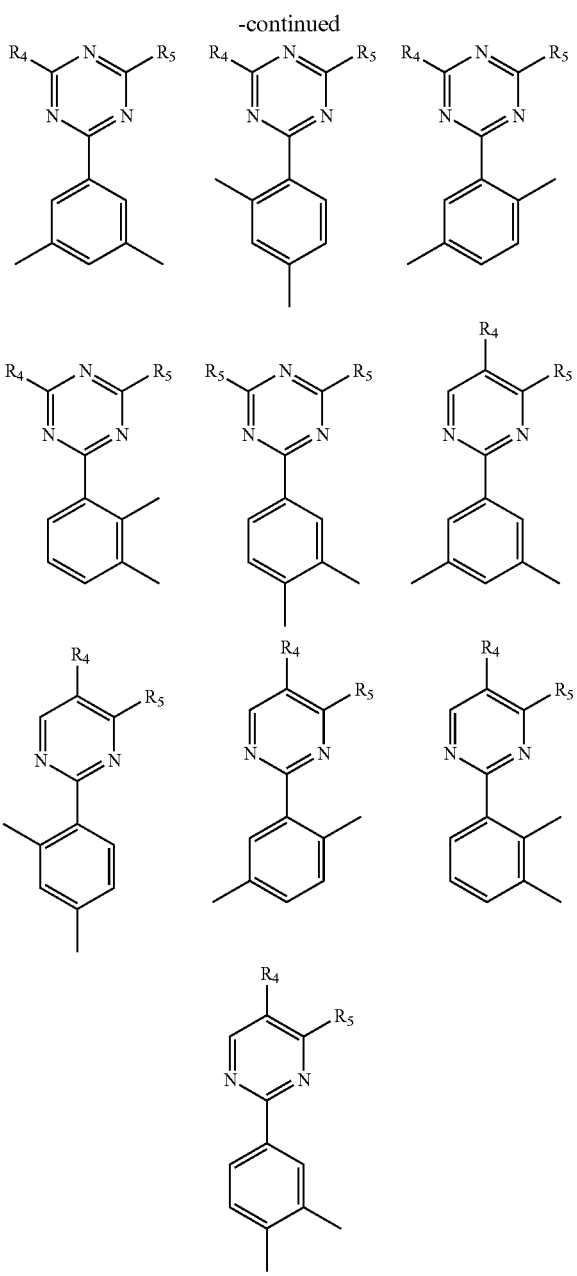
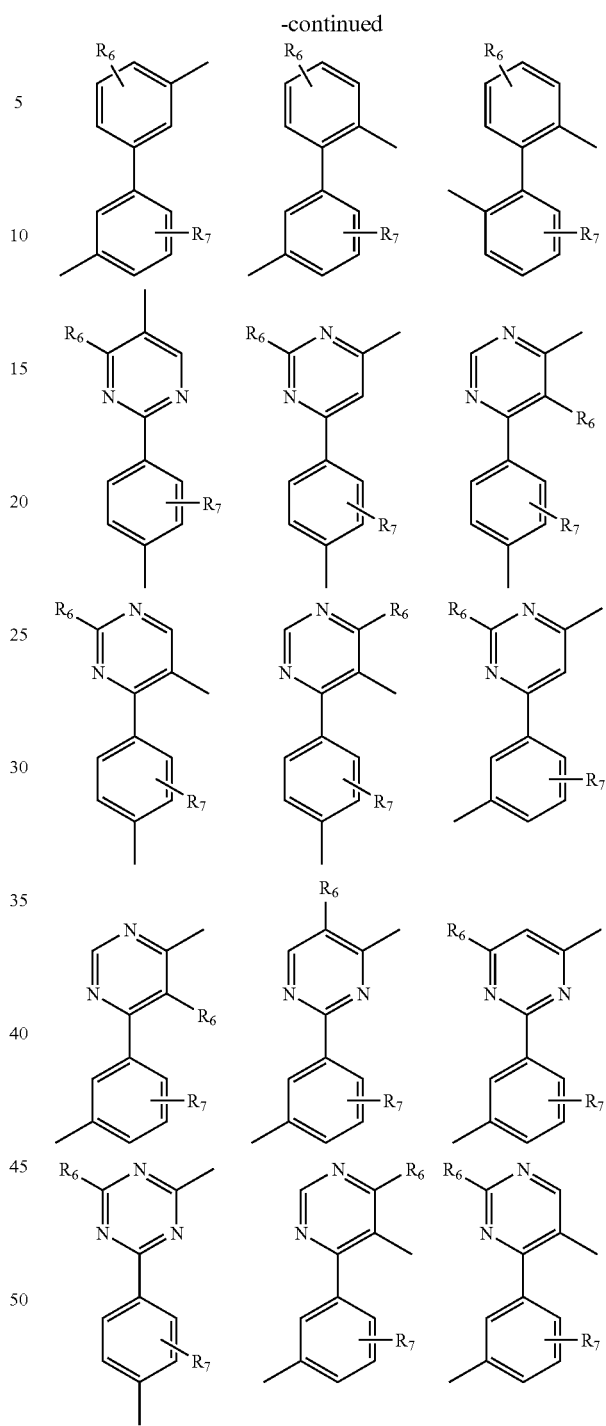
It is preferable that the group represented by the general formula (5) is any one among following structures.
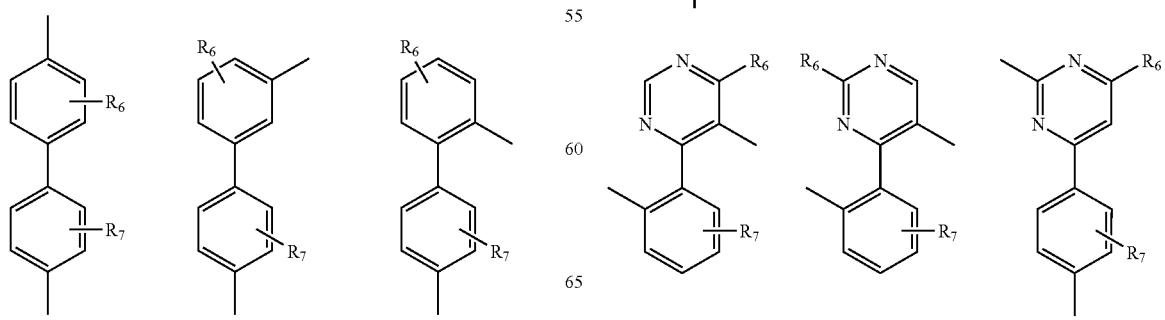

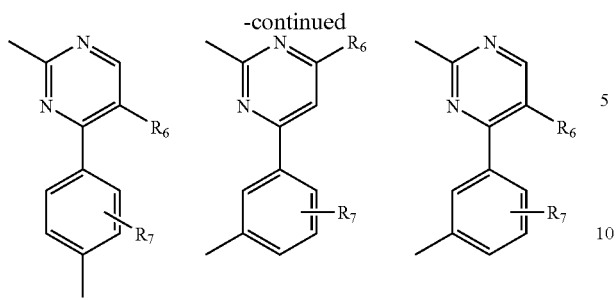
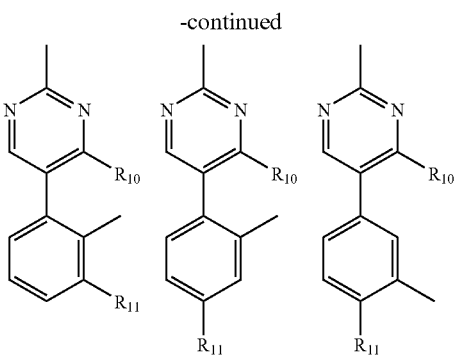
It is preferable that the group represented by the general formula (6) is any one among following structures.
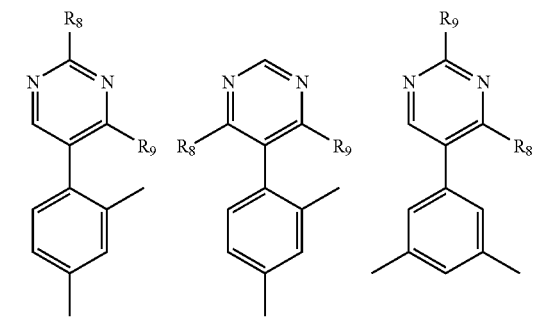
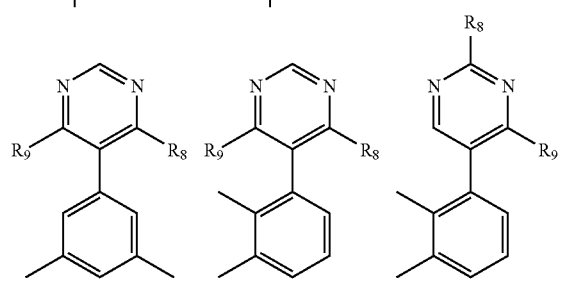
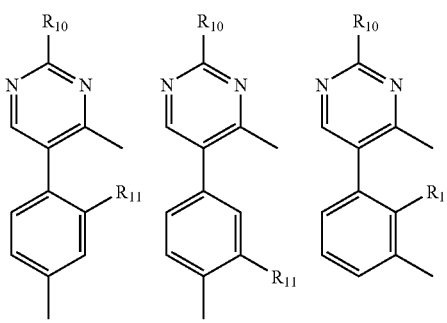
It is preferable that the group represented by the general formula (7) is any one among following structures.
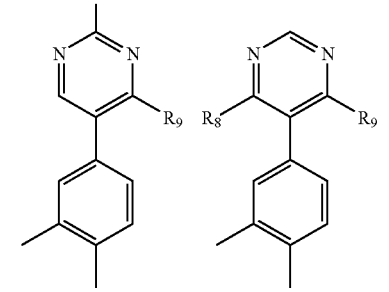
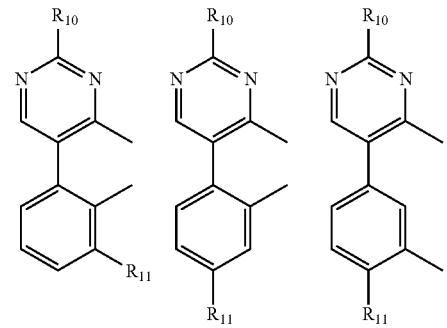
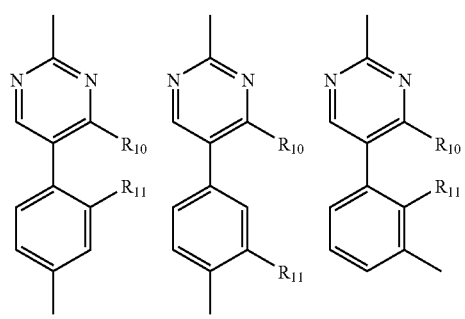
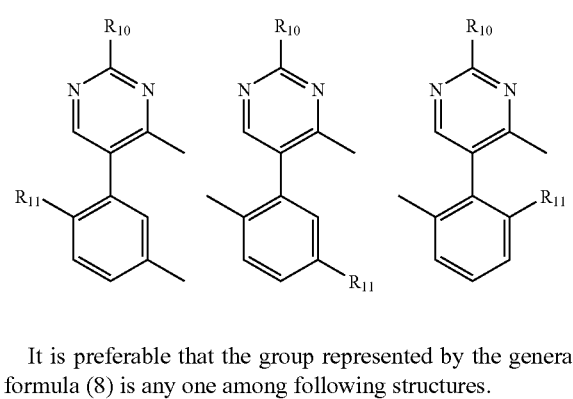
It is preferable that the group represented by the general formula (8) is any one among following structures.

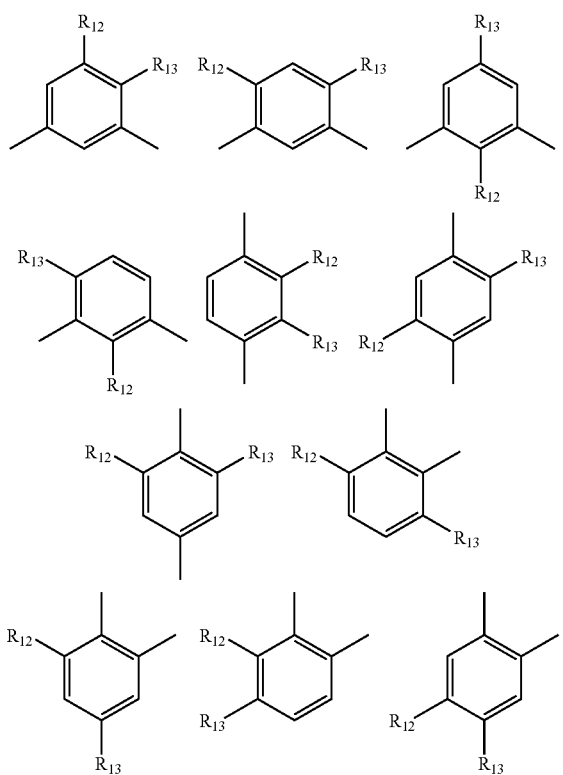

It is preferable that the group represented by the general formula (9) is any one among following structures.

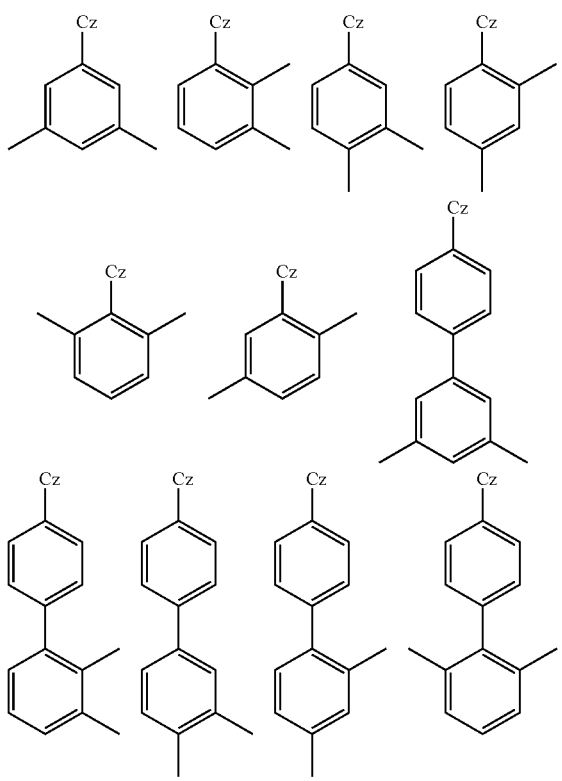

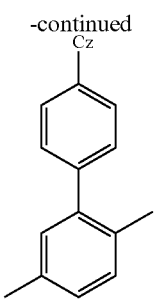

In the general formulae (1) to (3), Cz is a group expressed by a following general formula (10) or a following general formula (11).

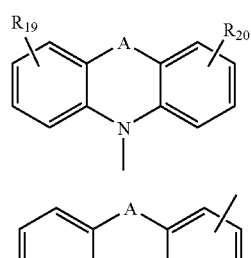

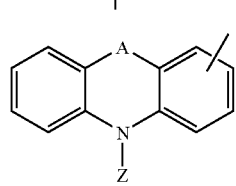

In the general formula (10) or the general formula (11), A represents a single bond, —$(CR_4R_{15})n$—, —$SiR_{16}R_{17}$—, —$NR_{18}$—, —O— or —S—; while a couple of $R_{14}$ and $R_{15}$, and a couple of $R_{16}$ and $R_{17}$ may bond each other to form a saturated or an unsaturated ring structure; and n represents an integer of 1 to 3; $R_{14}$ to $R_{20}$ each independently represents a hydrogen atom, a halogen atom, an alkyl group having 1 to 30 carbon atoms and further may have a substituent, a heterocyclic group having 3 to 20 carbon atoms and further may have a substituent, an alkoxy group having 1 to 30 carbon atoms and further may have a substituent, an aryl group having 6 to 40 carbon atoms and further may have a substituent, an aryloxy group having 6 to 30 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent; $R_{19}$ and $R_{20}$ may each plurally exist. Specific examples of the group represented by $R_{14}$ to $R_{20}$ are the same as described about the foregoing $R_1$ to $R_8$ including the preferable examples.

Z represents an alkyl group having 1 to 20 carbon atoms which may be substituted, an aryl group having 1 to 18 carbon atoms which may be substituted or an aralkyl group having 7 to 40 carbon atoms which may be substituted.

Examples of the alkyl group having 1 to 20 carbon atoms represented by Z include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group and so on; while methyl group, ethyl group, propyl group, n-hexyl group, n-heptyl group or so is preferable.

Examples of the aryl group represented by Z include phenyl group, naphthyl group, tolyl group, biphenyl group, terphenyl group and so on; while phenyl group, biphenyl group, tolyl group or so is preferable.

Examples of the aralkyl group represented by Z include α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, benzyl group, p-cyanobenzyl group, m-cyanobenzyl group, o-cyanobenzyl group, 1-phenylethyl group, 2-phenylethyl group, 1-phenylisopropyl group, 2-phenylisopropyl group and so on; while benzyl group, p-cyano benzyl group or so is preferable.

It is preferable that the foregoing Cz has any one of following structures:

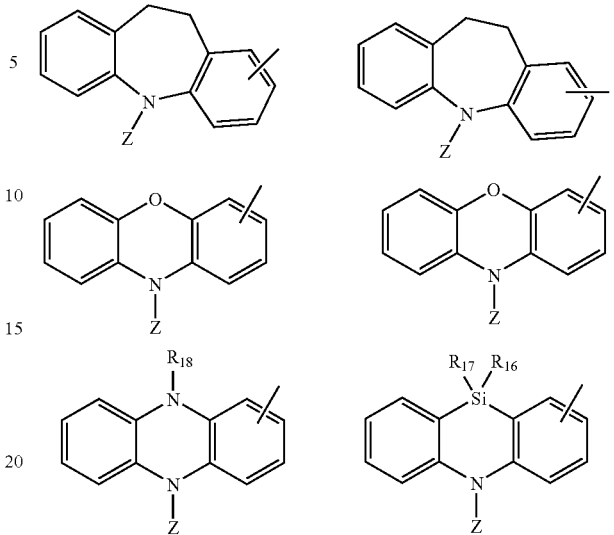

It is more preferable that the foregoing Cz has any one of following structures:

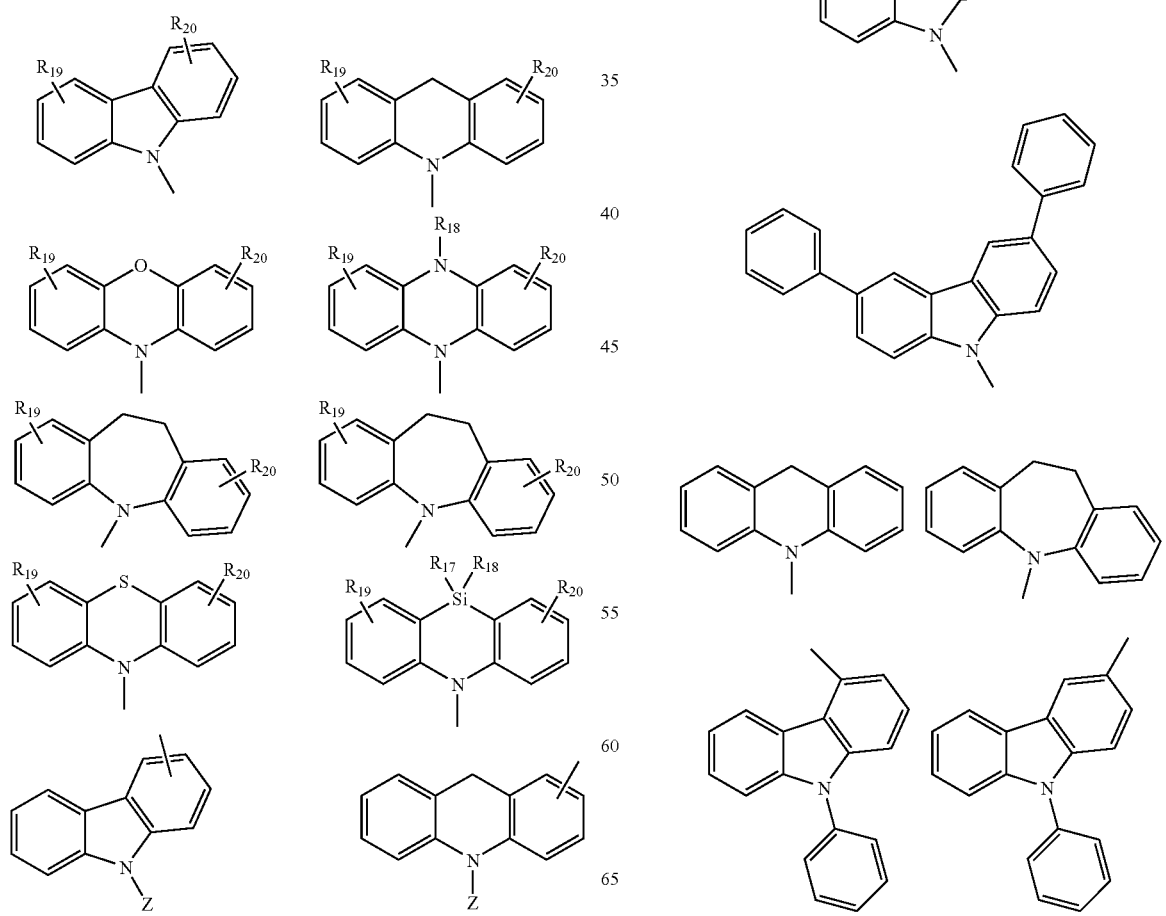

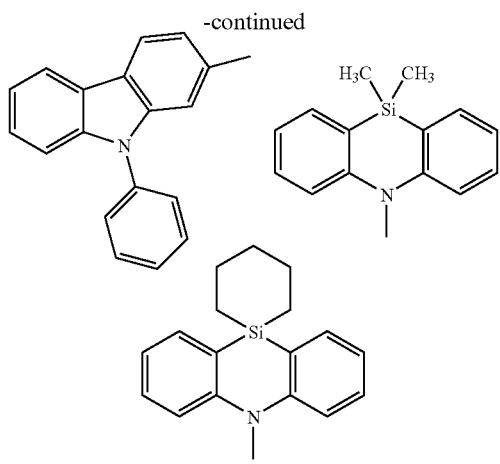

Further, it is particularly preferable that Cz is carbazolyl group which may have a substituent or arylcarbazolyl group which may have a substituent.

Examples of the substituent for the group illustrated above about the general formulae (1) to (3) include halogen atoms, hydroxyl group, amino group, nitro group, cyano group, alkyl groups, alkenyl groups, cycloalkyl groups, alkoxyl groups, aromatic hydrocarbon groups, aromatic heterocyclic groups, aralkyl groups, aryloxyl groups, alkoxycarbonyl groups, etc.

Specific examples of the material for organic EL devices comprising the compounds represented by any one the general formulae (1) to (3) of the present invention include the following compounds, though not limited thereto.

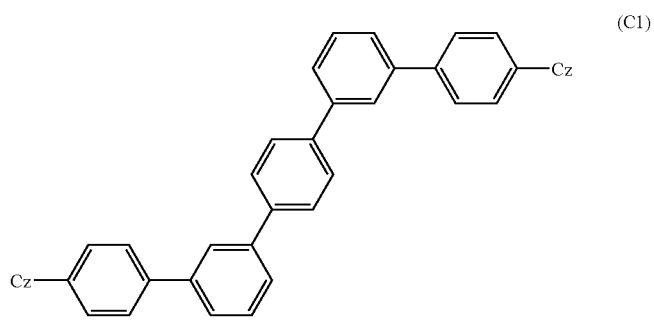

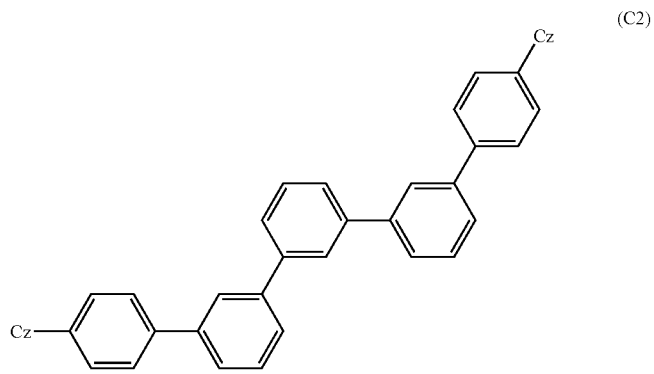

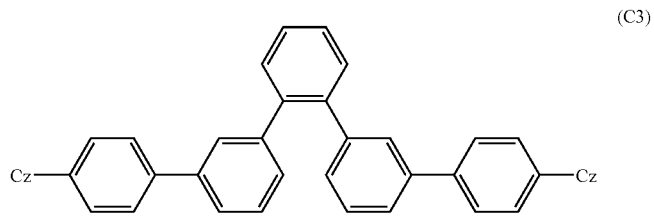

-continued
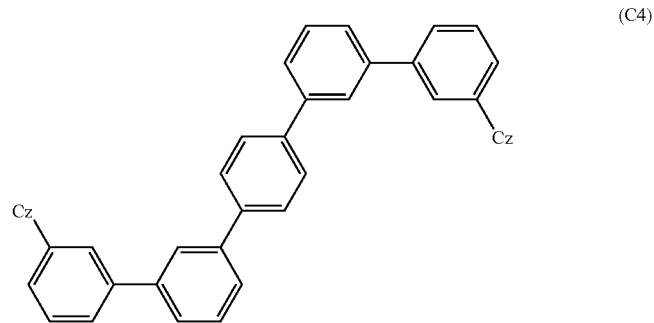
(C4)
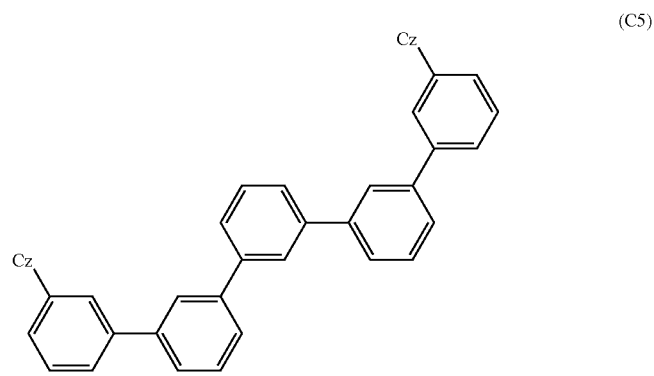
(C5)
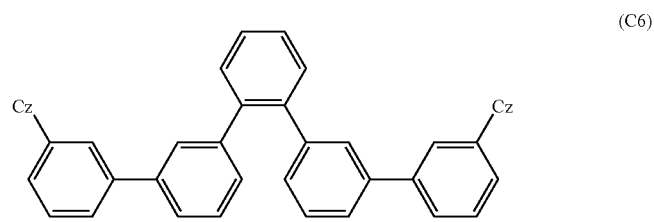
(C6)
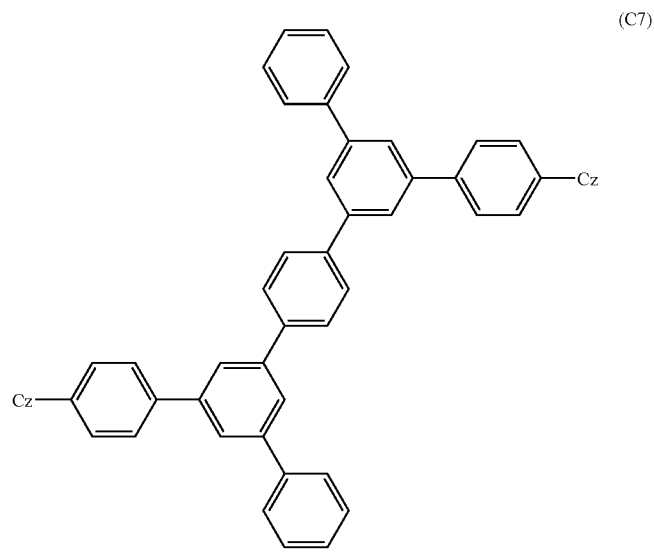
(C7)

-continued
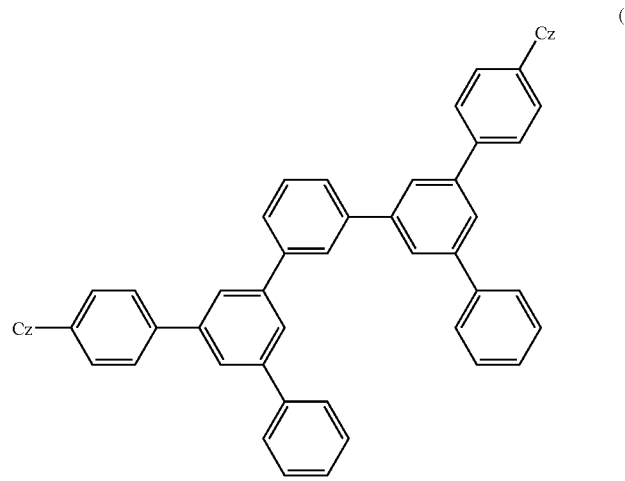
(C8)
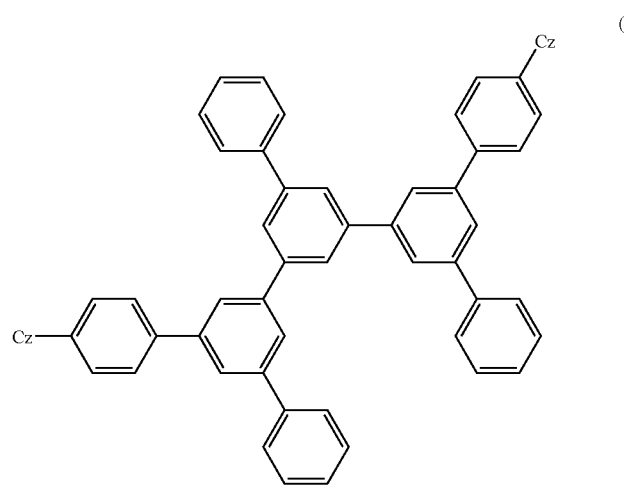
(C9)
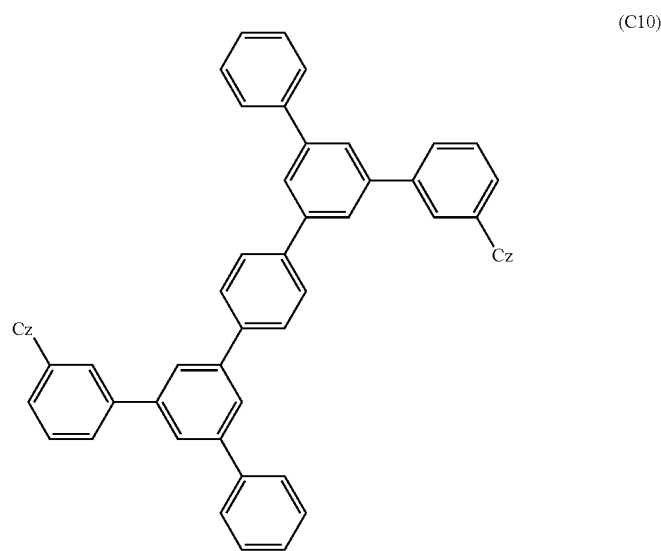
(C10)

-continued
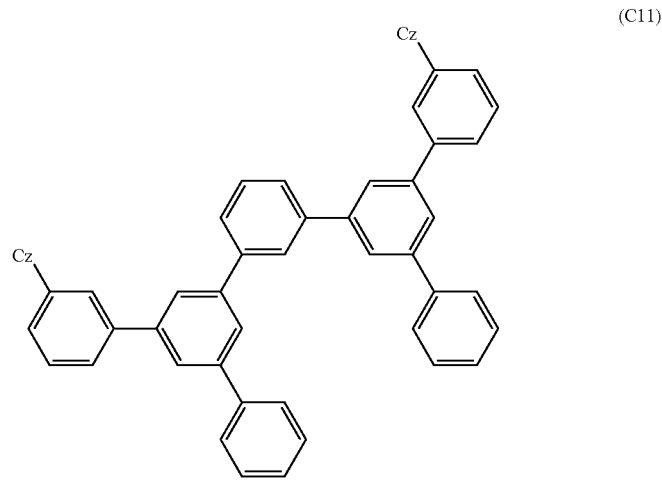
(C11)
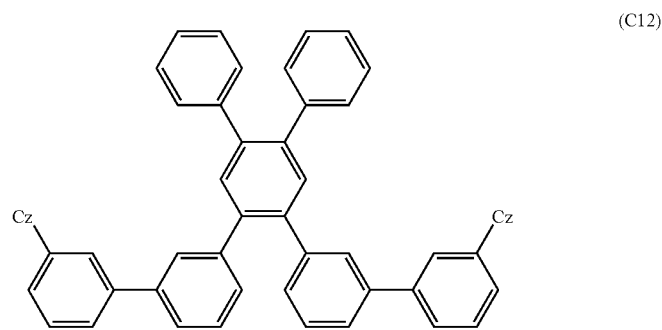
(C12)
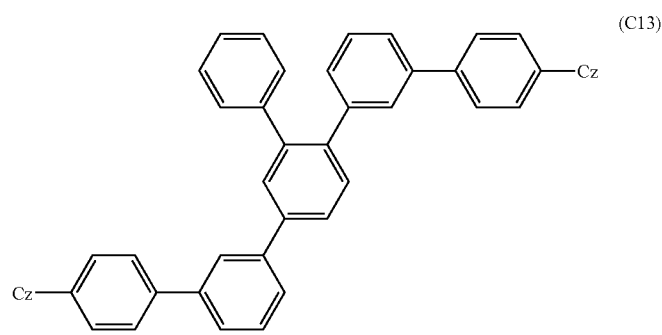
(C13)
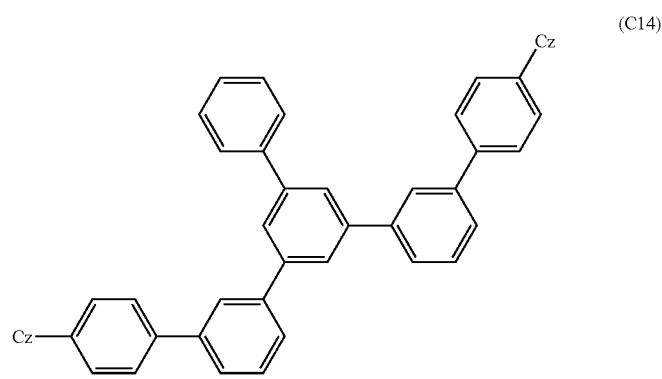
(C14)

-continued
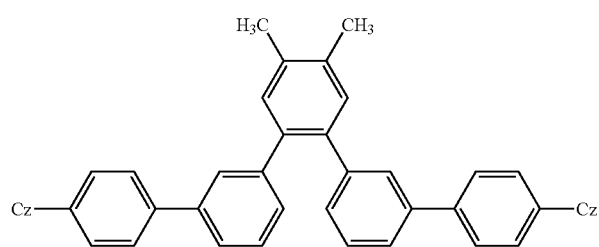
(C15)
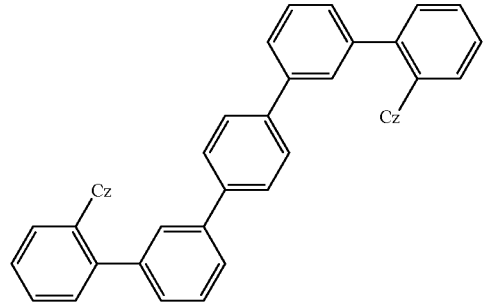
(C16)
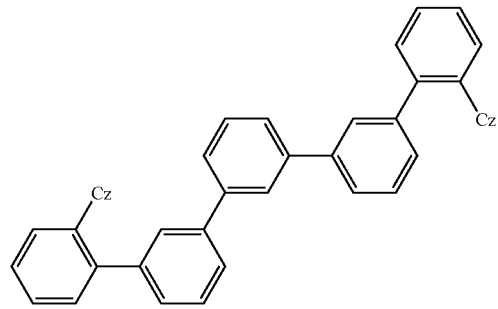
(C17)
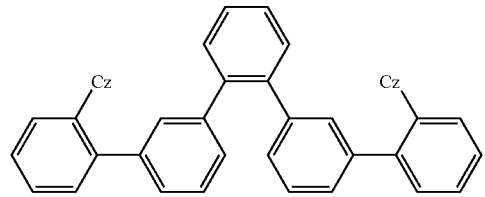
(C18)
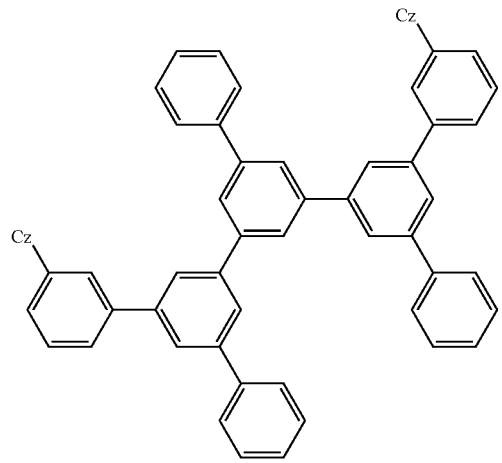
(C19)

-continued
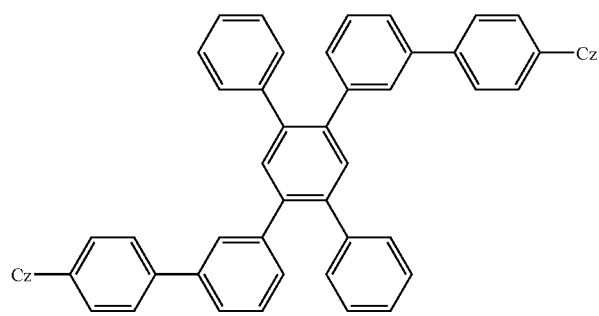
(C20)
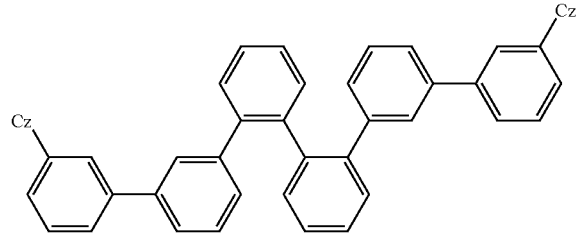
(C21)
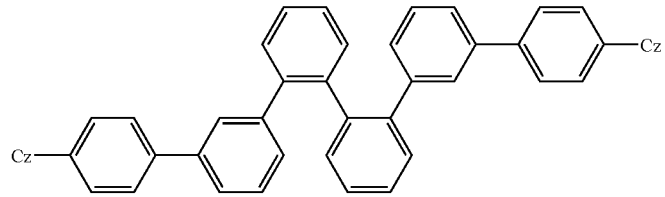
(C22)
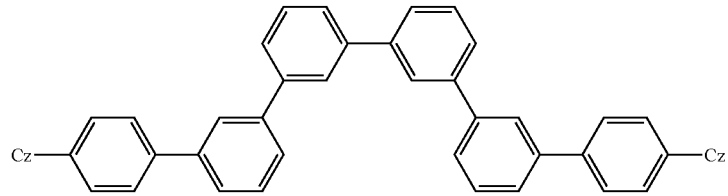
(C23)
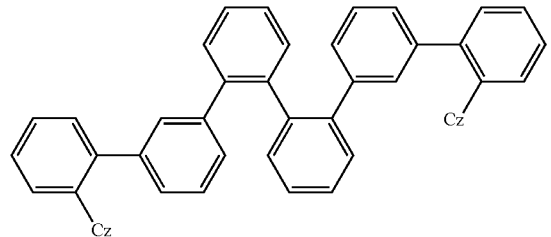
(C24)
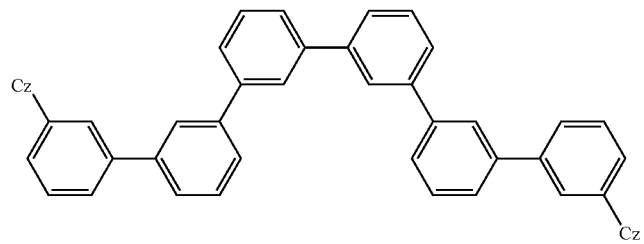
(C25)

-continued
(C26)
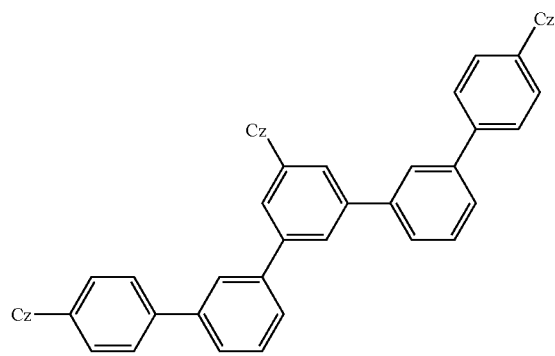
(C27)
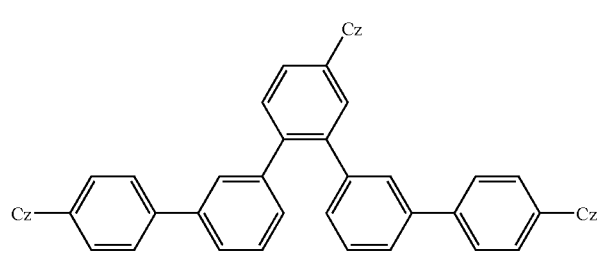
(C28)
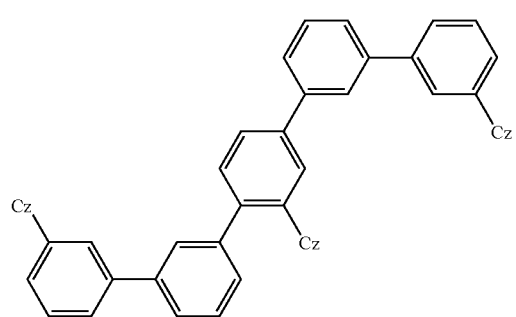
(C29)
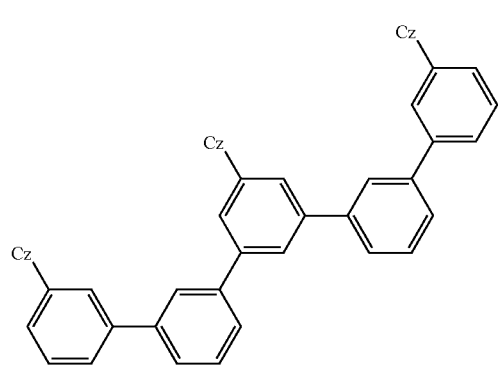
(C30)
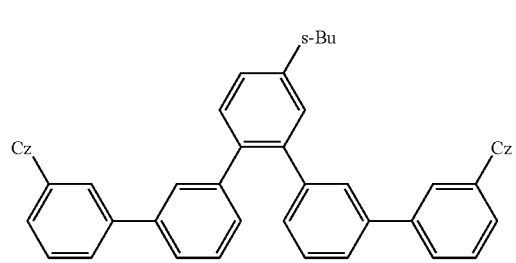

-continued
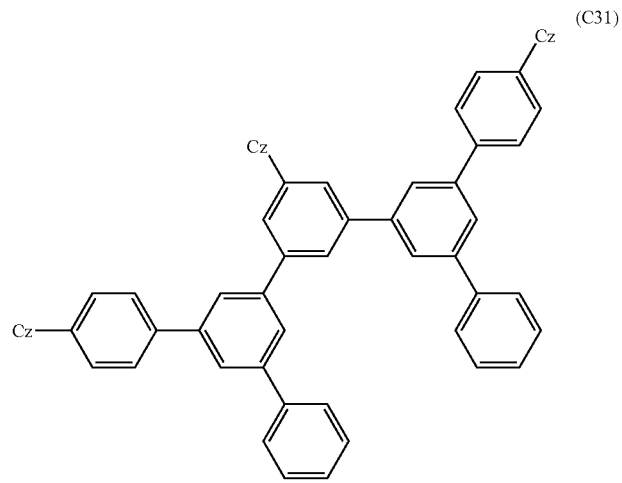
(C31)
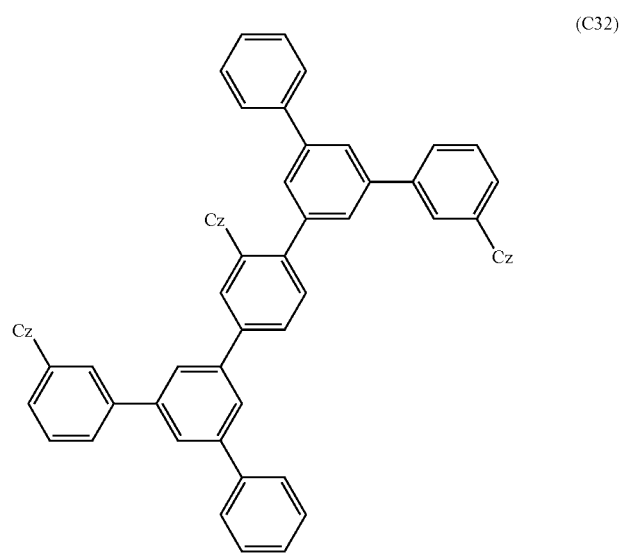
(C32)
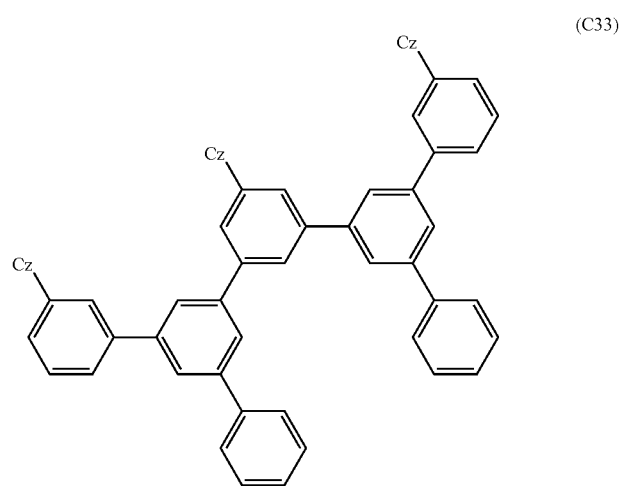
(C33)

-continued
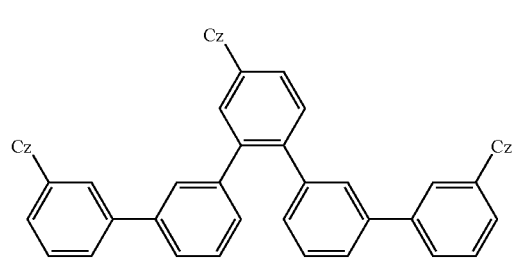
(C34)
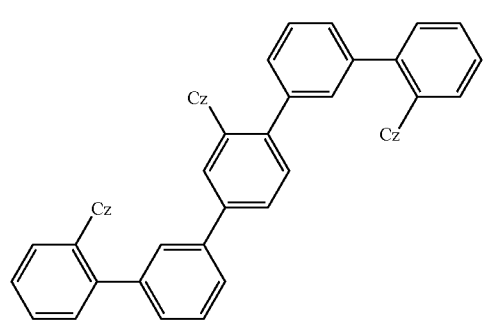
(C35)
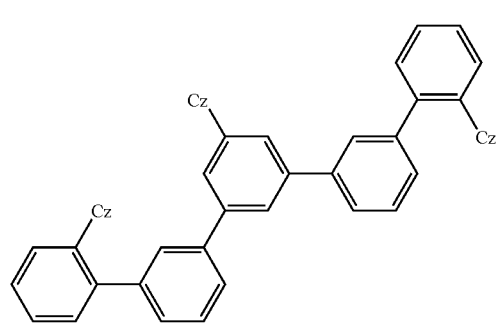
(C36)
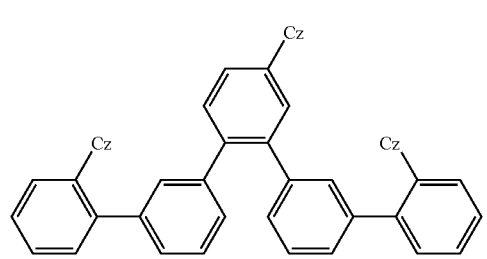
(C37)
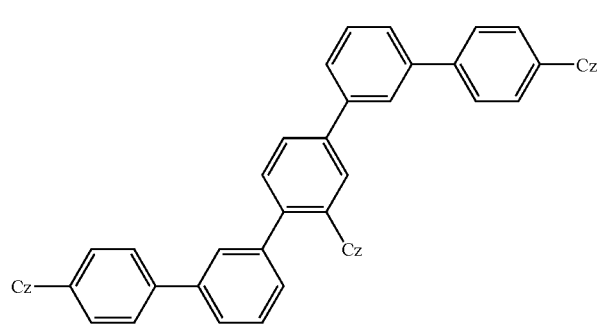
(C38)

-continued
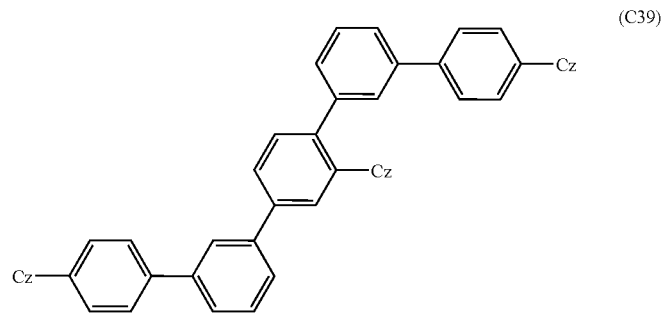
(C39)
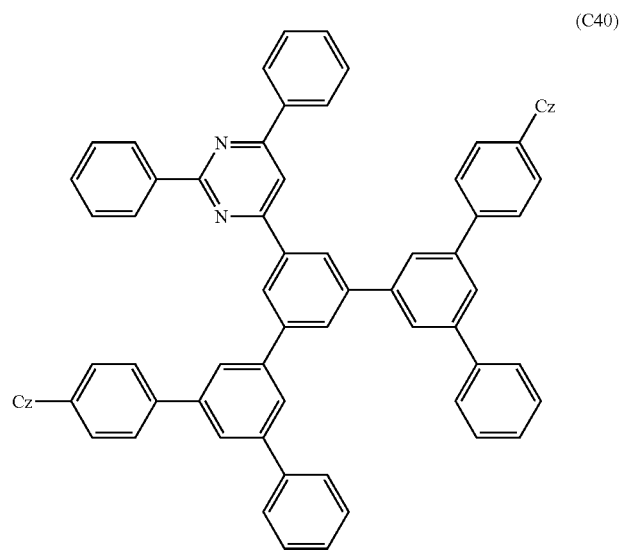
(C40)
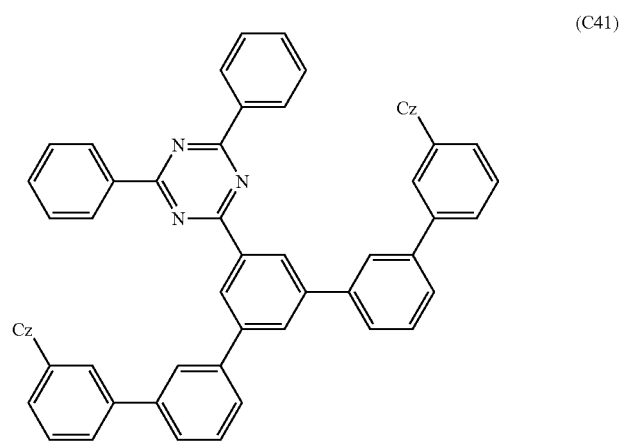
(C41)
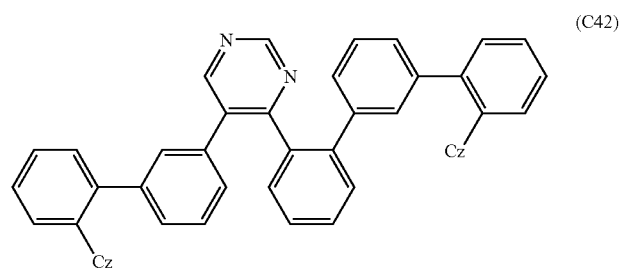
(C42)

-continued
(C43)
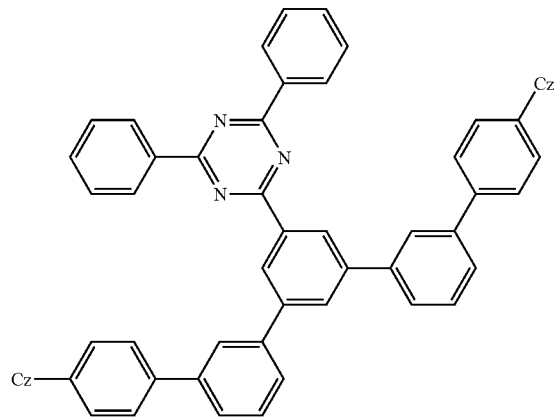
(C44)
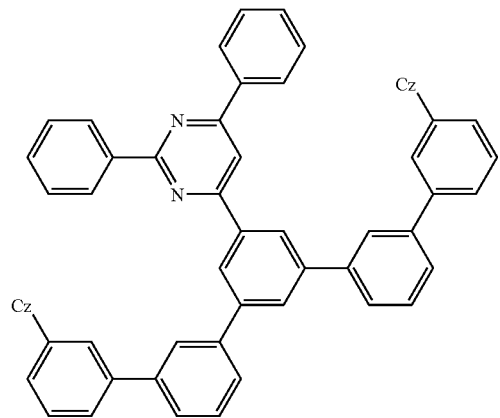
(C45)
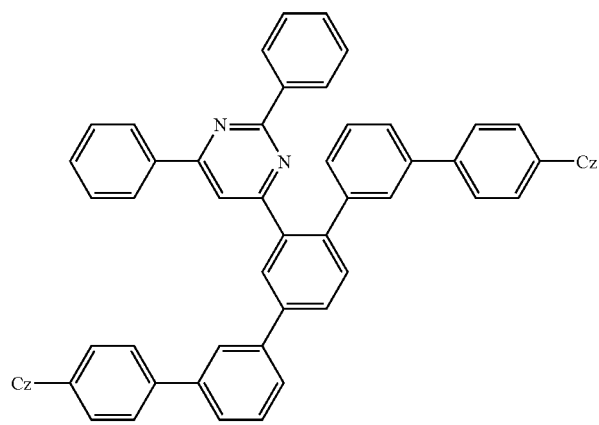
(C46)
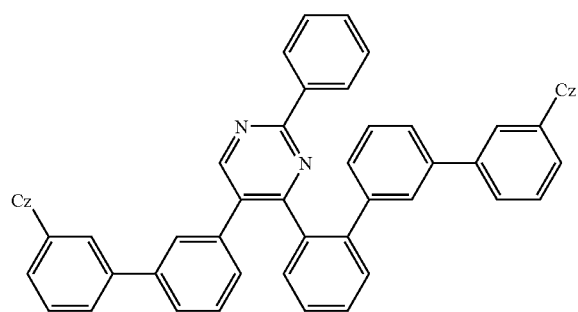

-continued
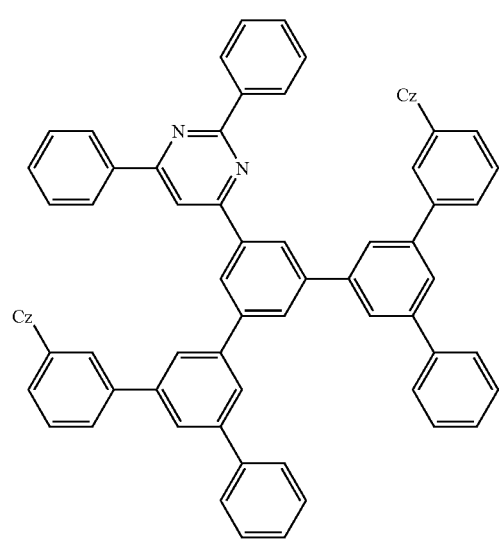
(C47)
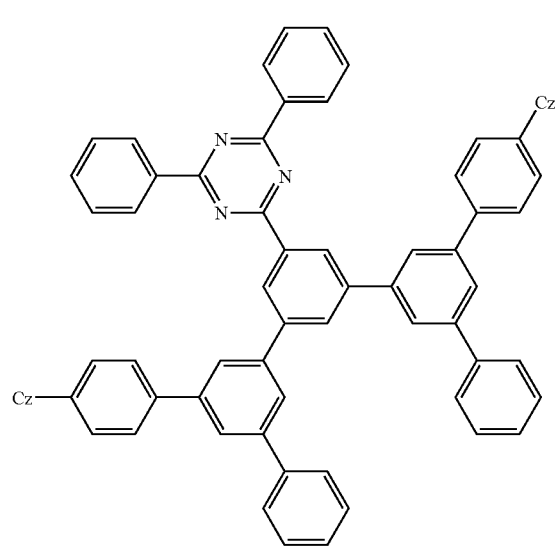
(C48)
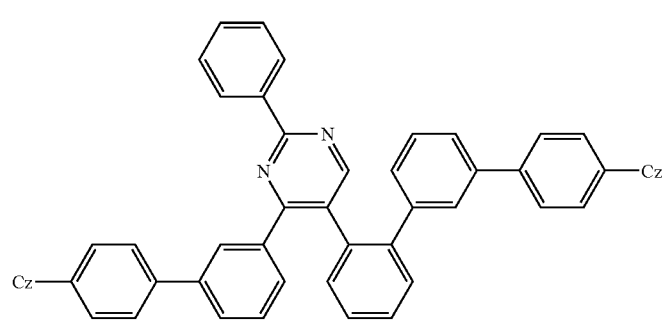
(C49)

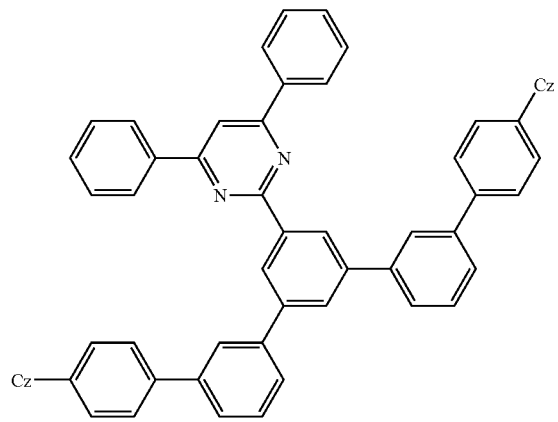
(C50)
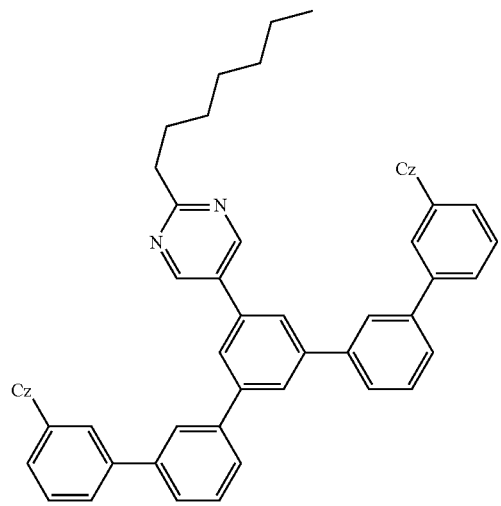
(C51)
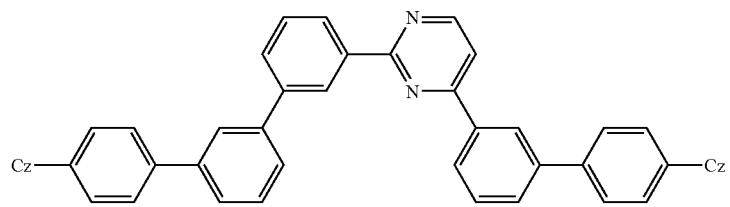
(C52)
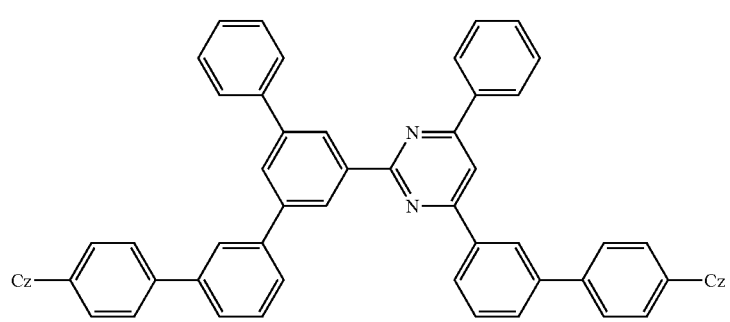
(C53)

(C54)
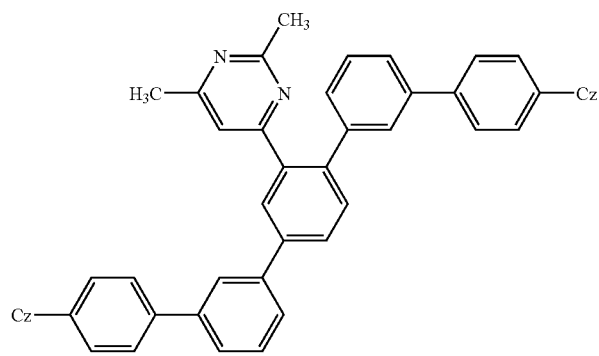
(C55)
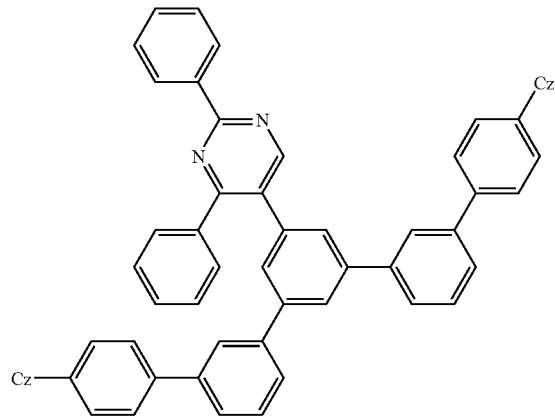
(C56)
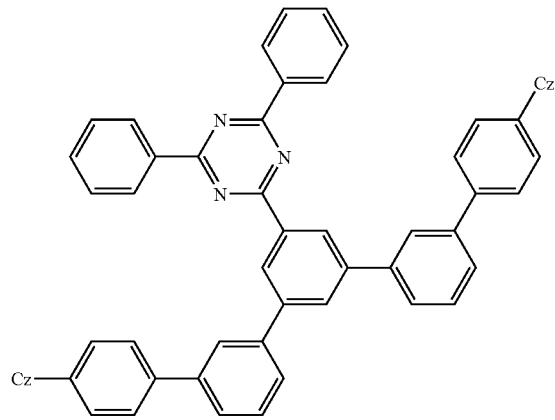
(C57)
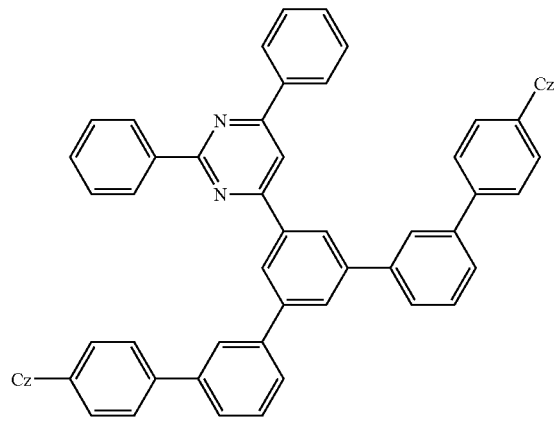

-continued
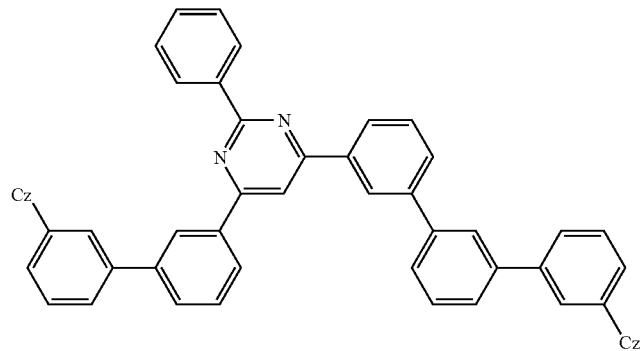
(C58)
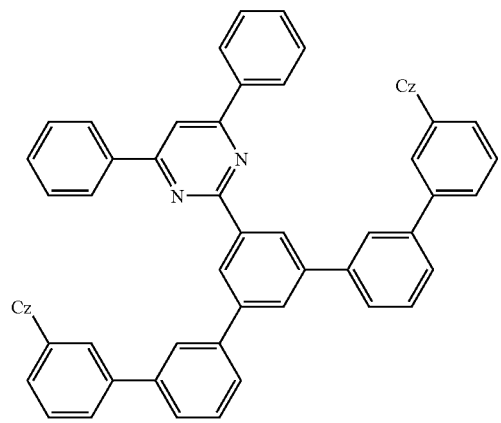
(C59)
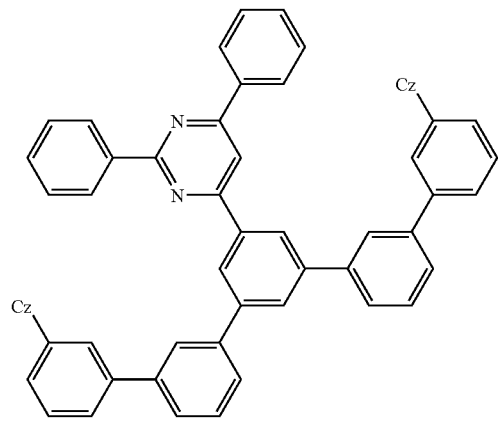
(C60)
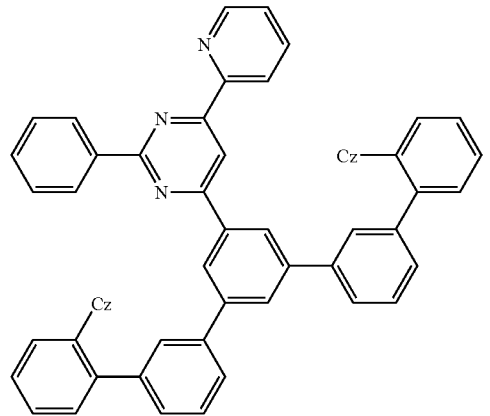
(C61)

-continued
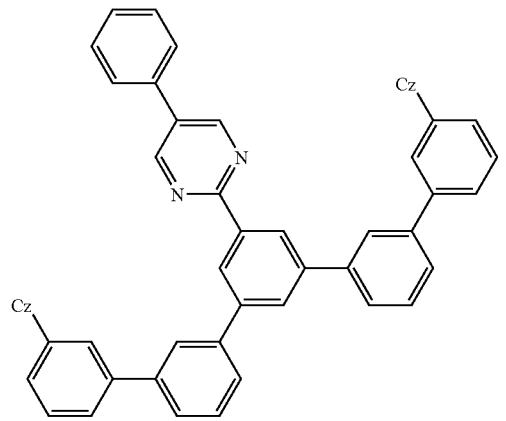
(C62)
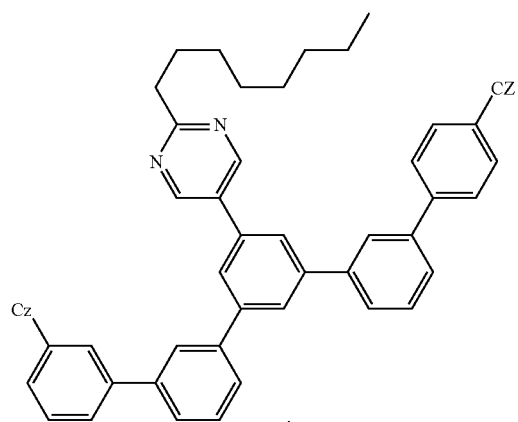
(C63)
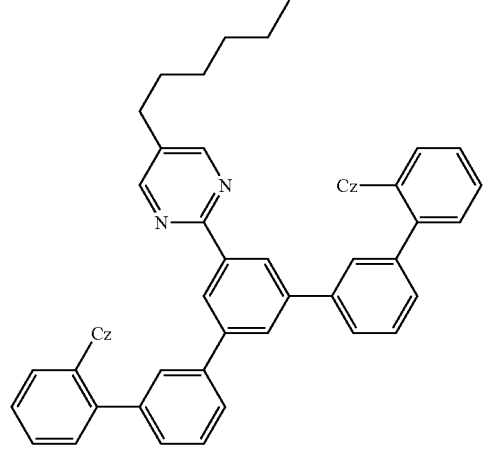
(C64)
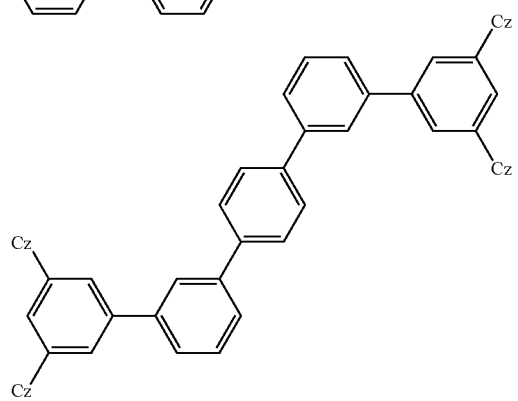
(C65)

-continued
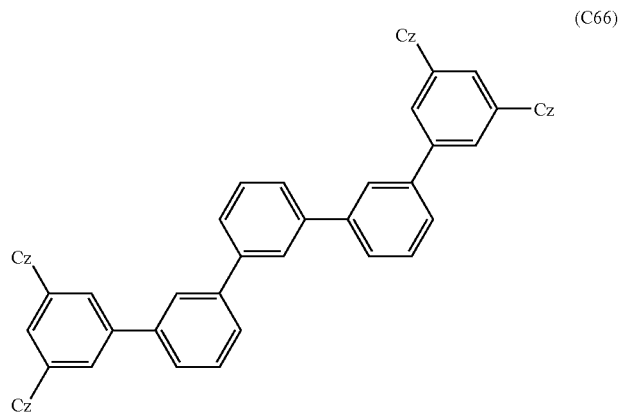
(C66)
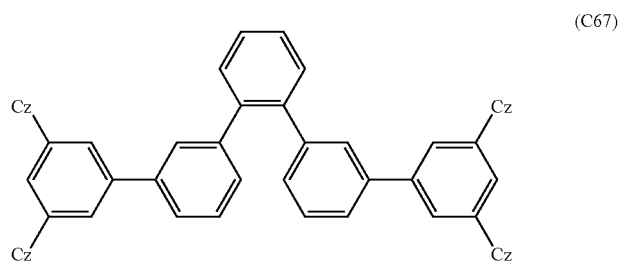
(C67)
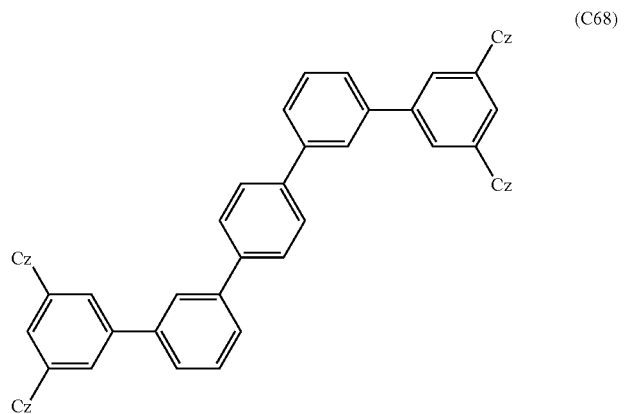
(C68)
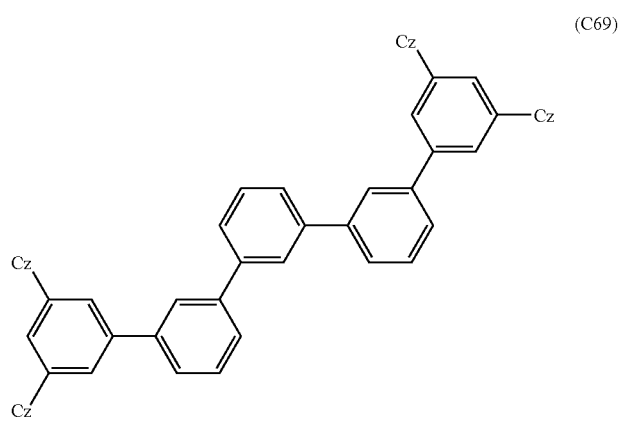
(C69)

-continued
(C70)
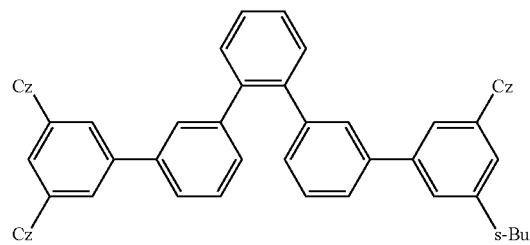
(C71)
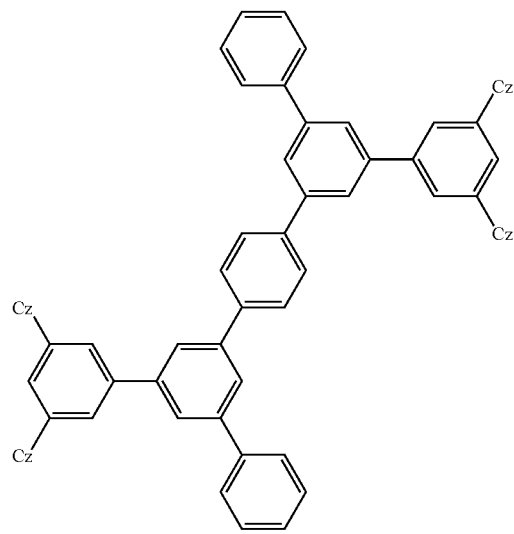
(C72)
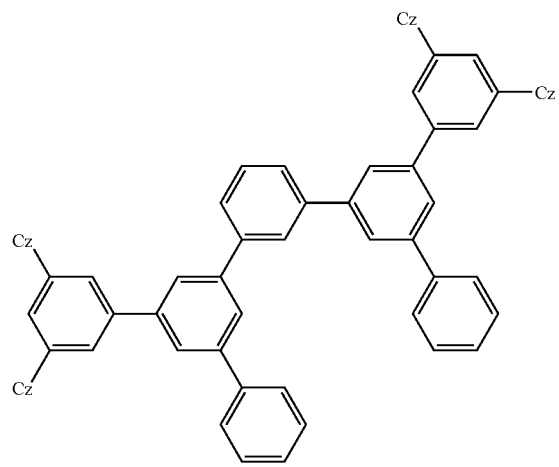
(C73)
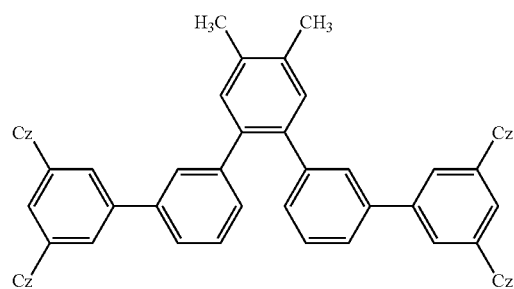

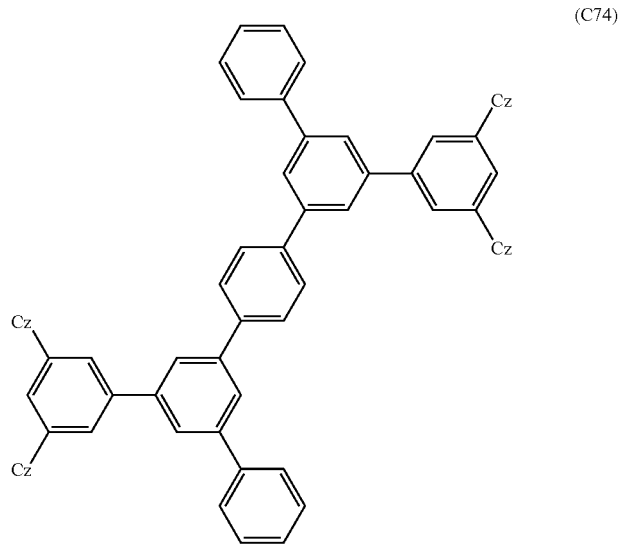
(C74)
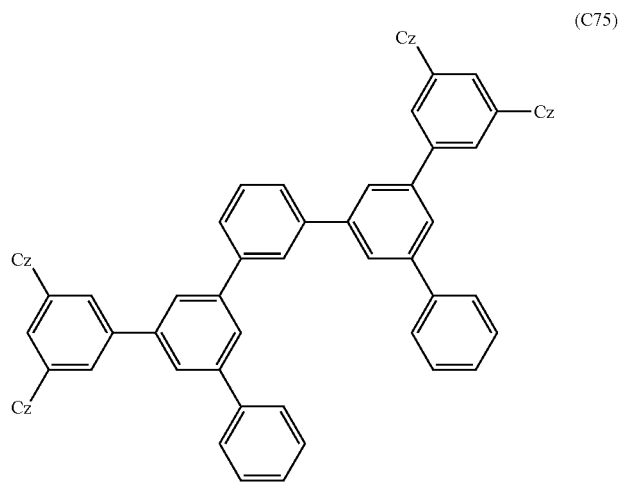
(C75)
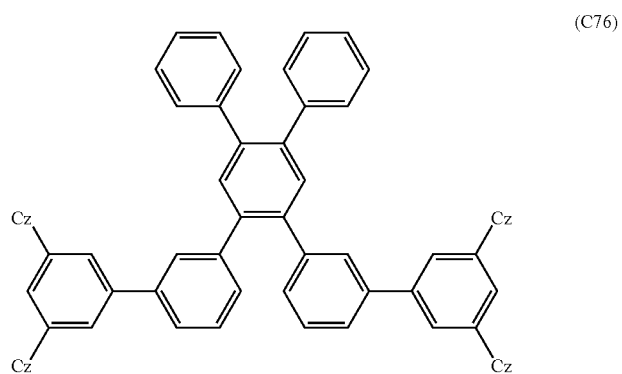
(C76)

-continued
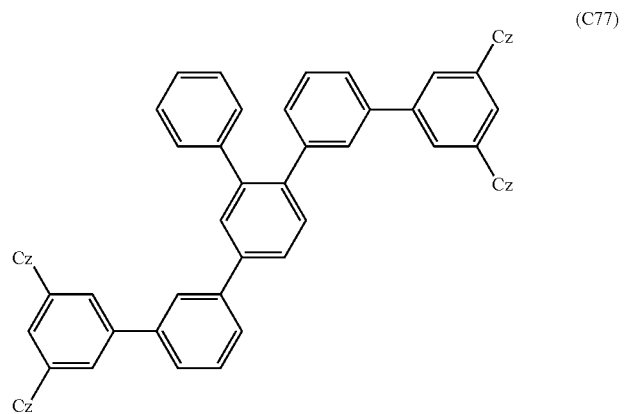
(C77)
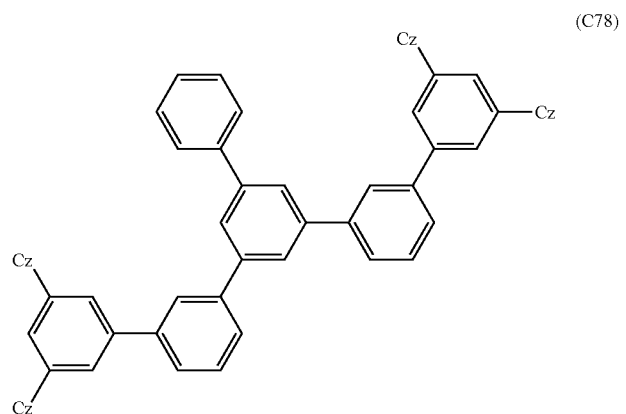
(C78)
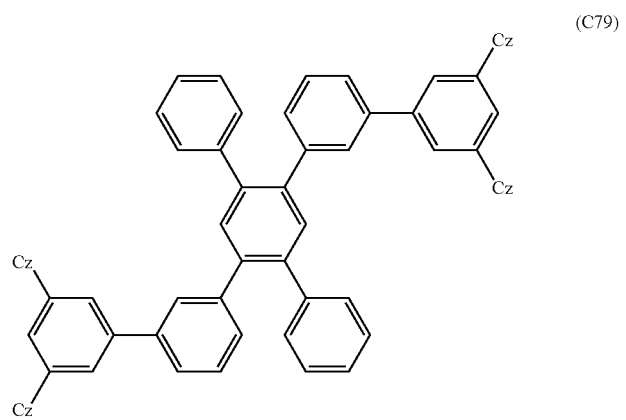
(C79)
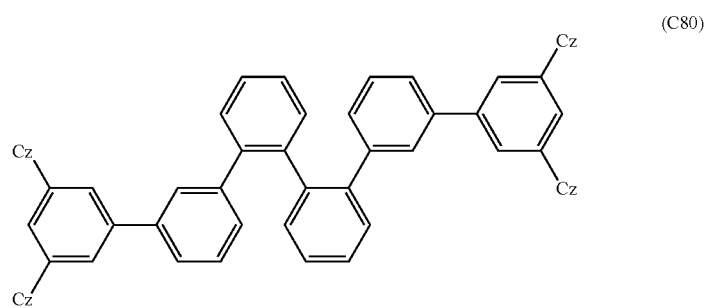
(C80)

-continued
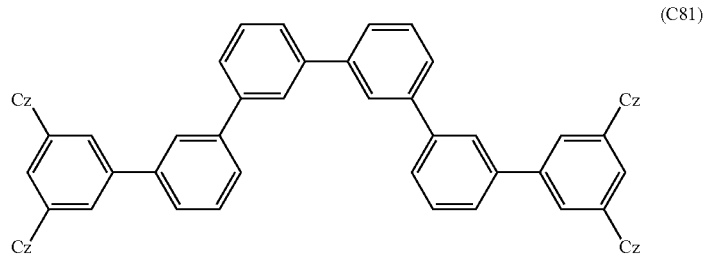
(C81)
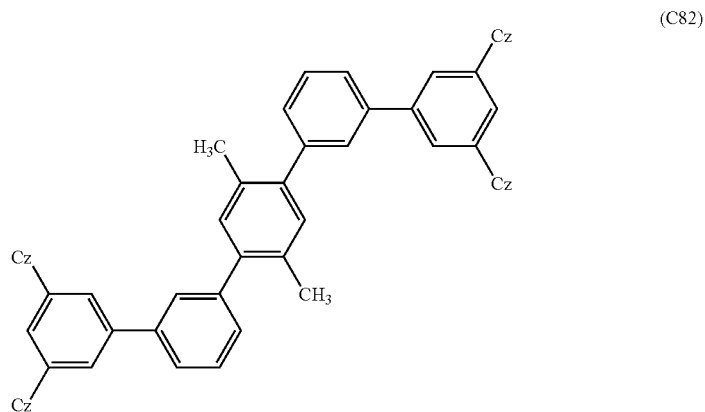
(C82)
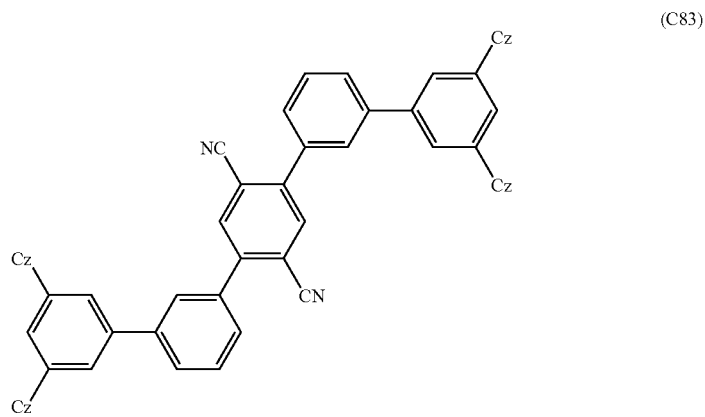
(C83)
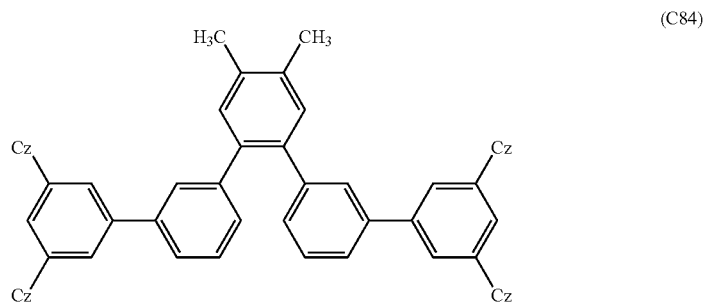
(C84)

-continued
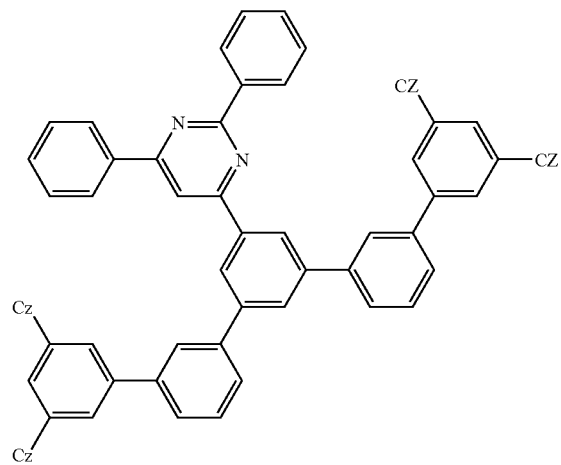
(C85)
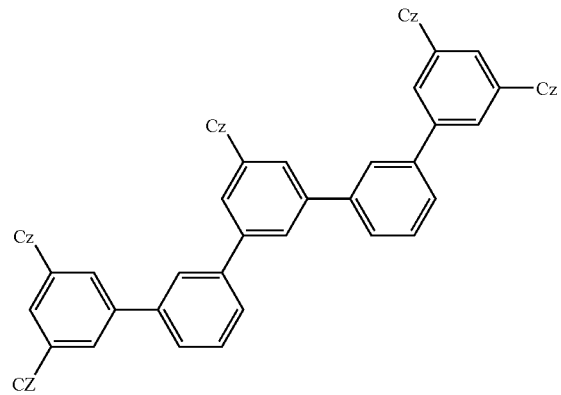
(C86)
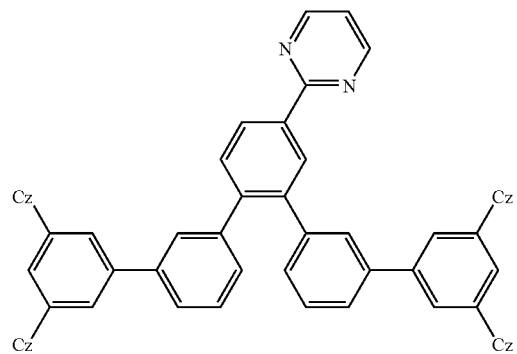
(C87)
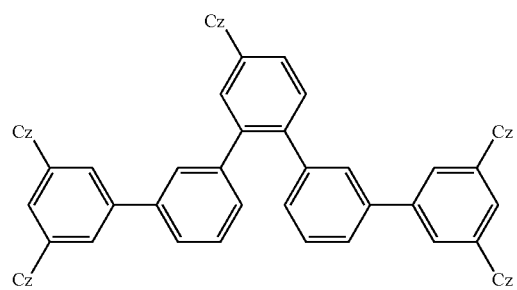
(C88)

-continued
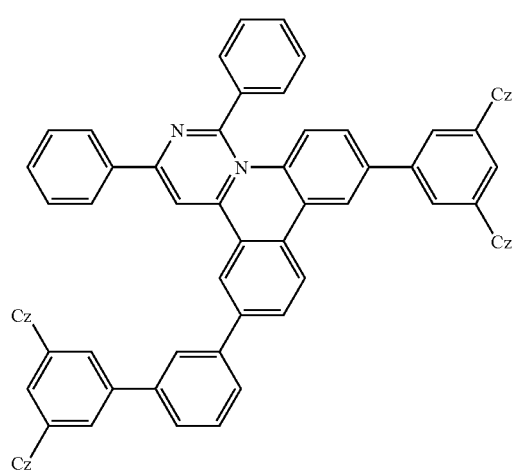
(C89)
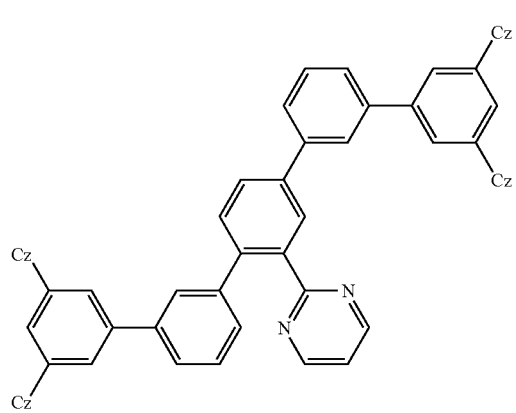
(C90)
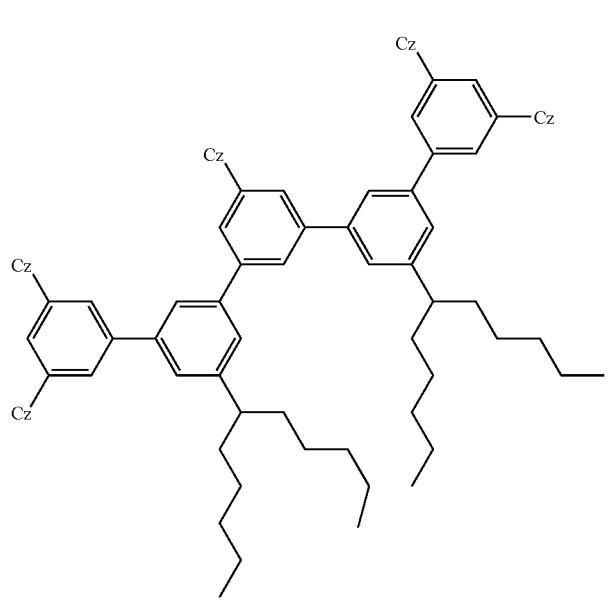
(C91)

(C92)
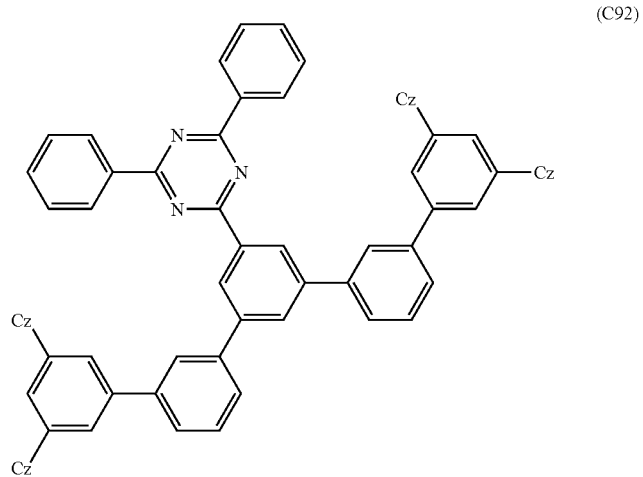
(C93)
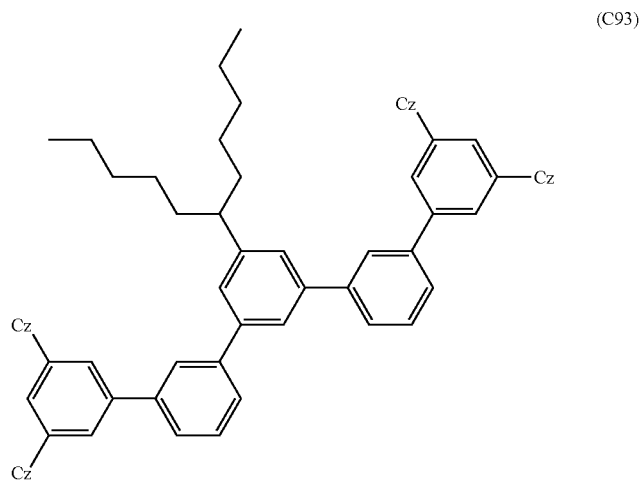
(C94)
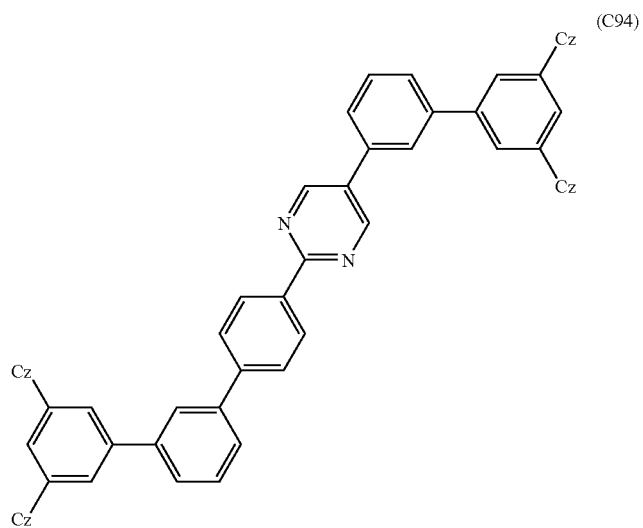

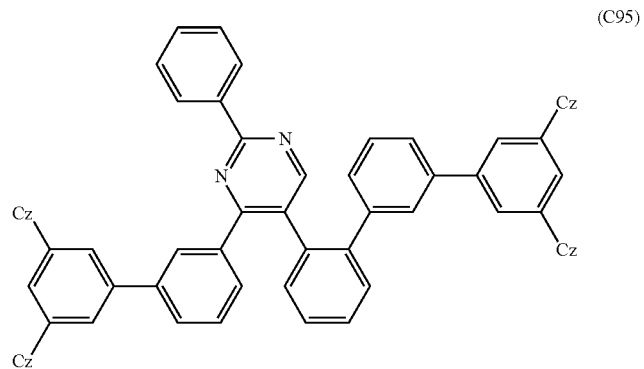
(C95)
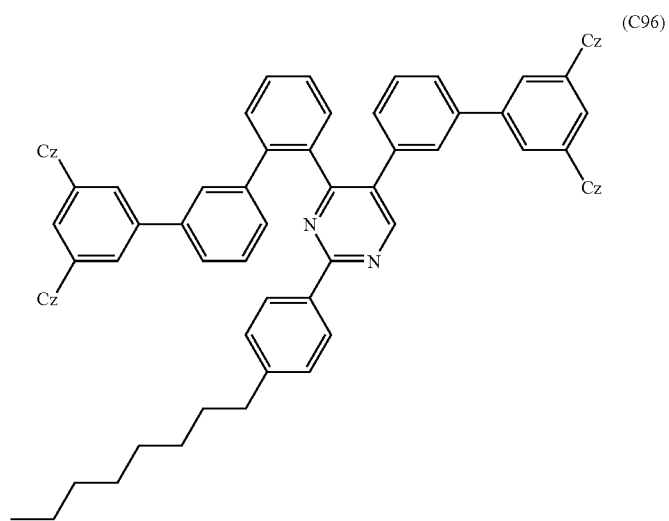
(C96)
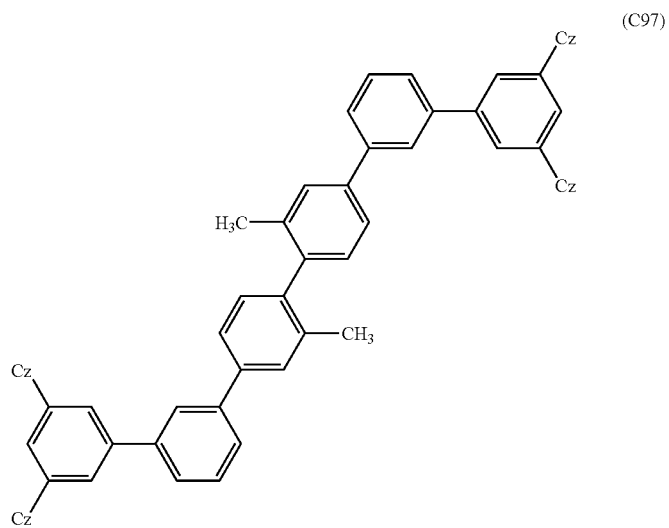
(C97)

-continued
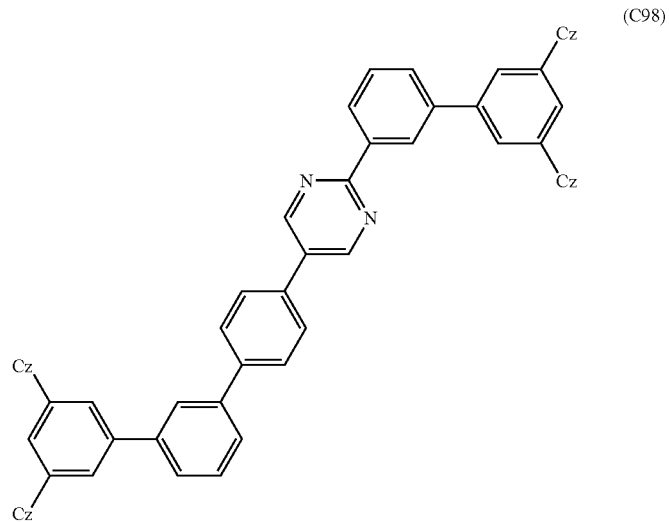
(C98)
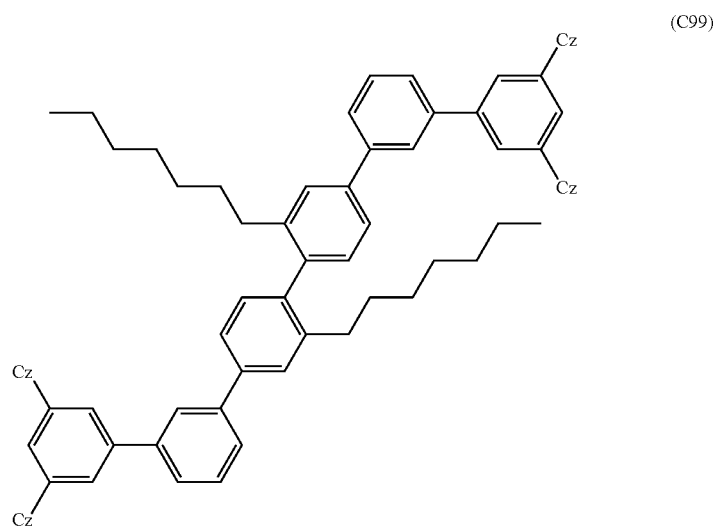
(C99)
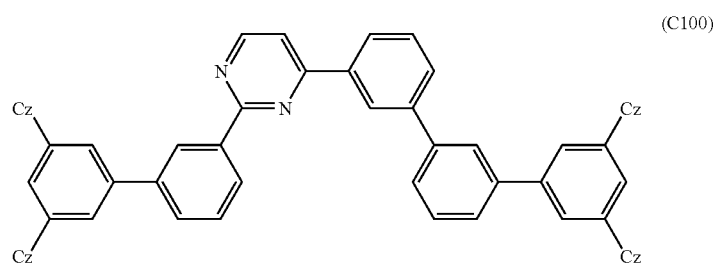
(C100)
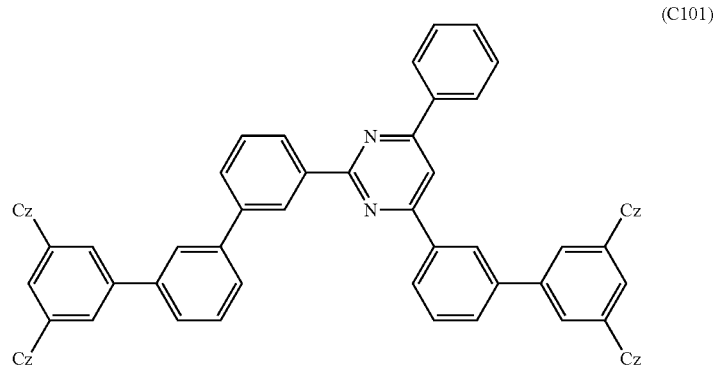
(C101)

-continued
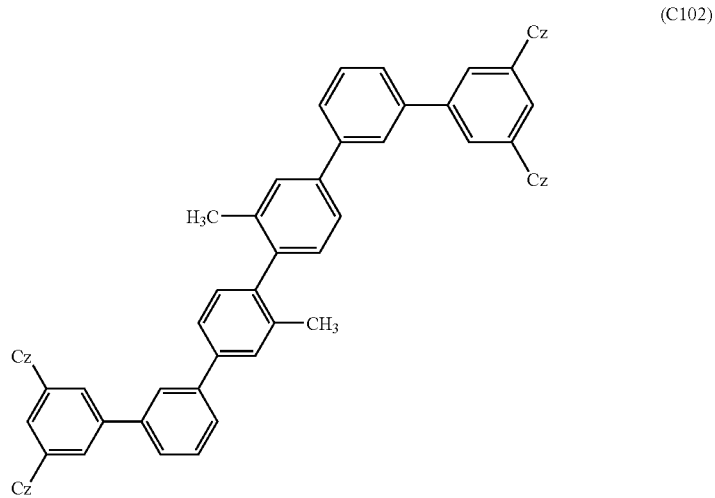
(C102)
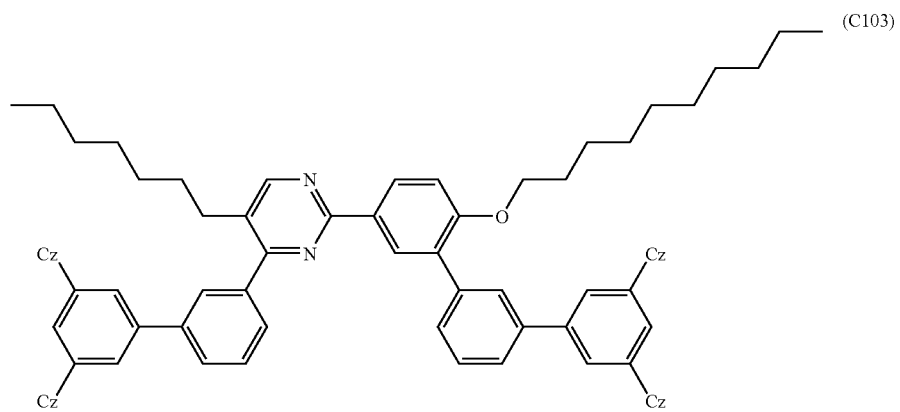
(C103)
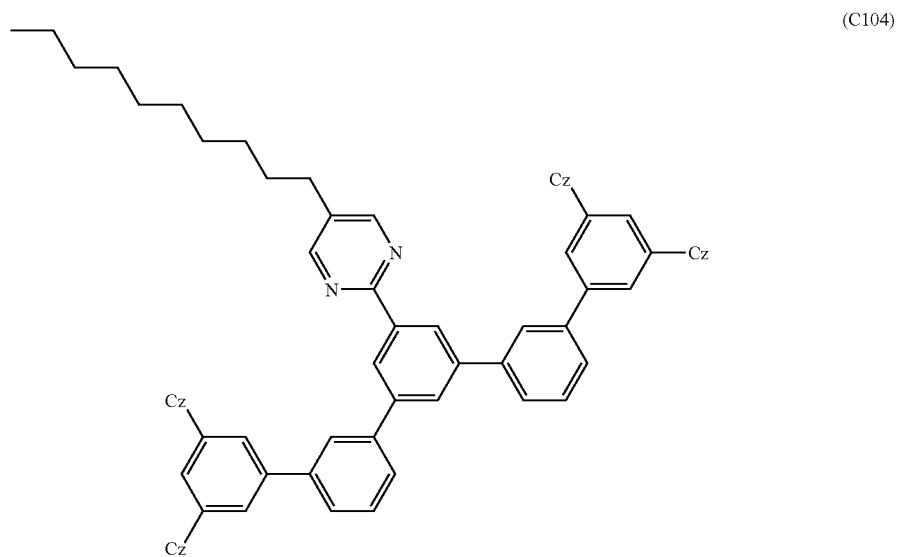
(C104)

-continued
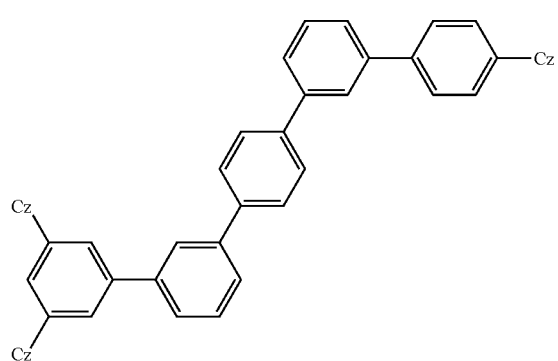
(C105)
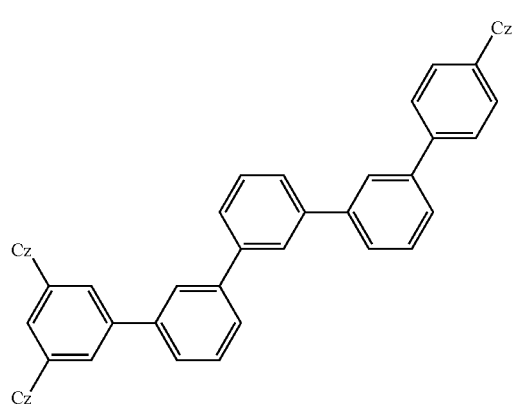
(C106)
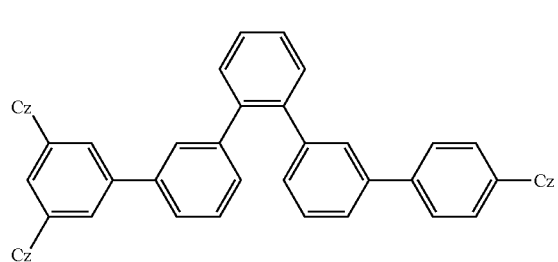
(C107)
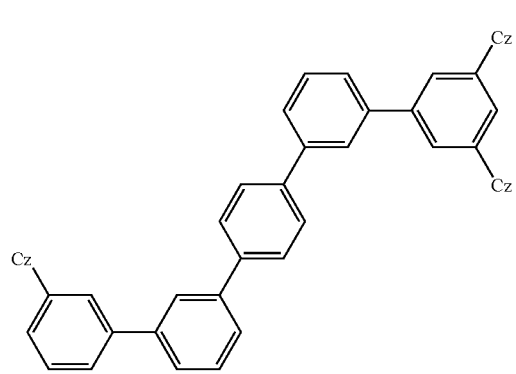
(C108)

-continued
(C109)
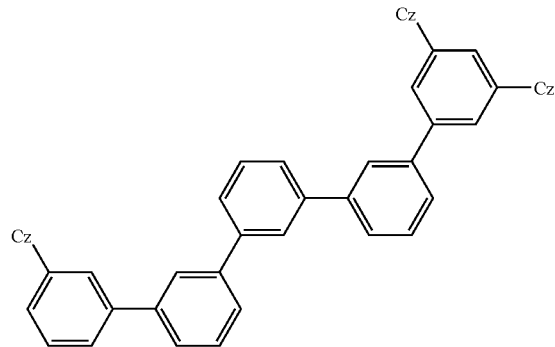
(C110)
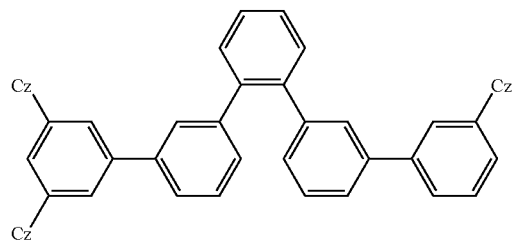
(C111)
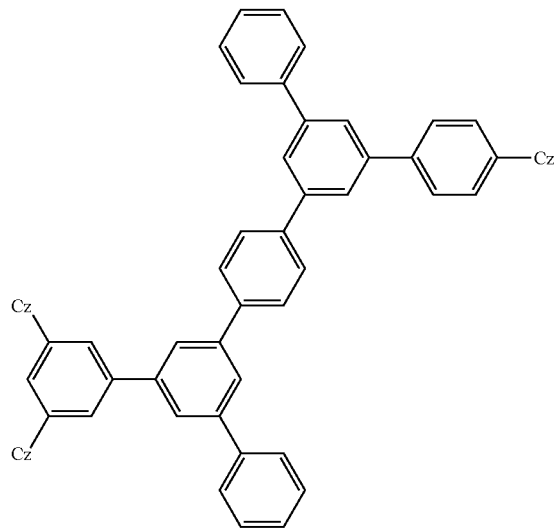
(C112)
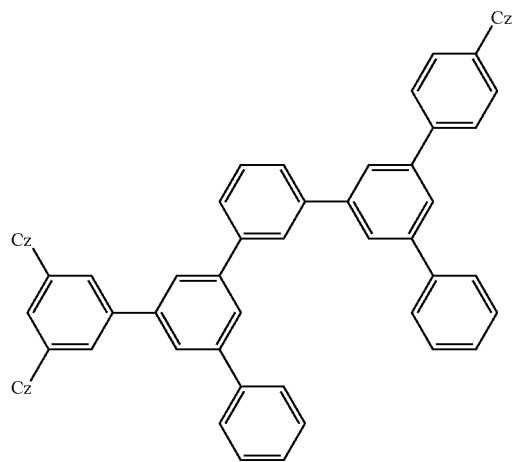

-continued
(C113)
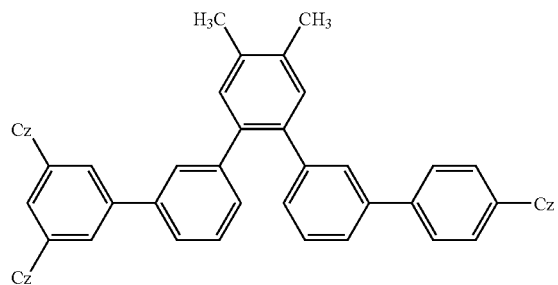
(C114)
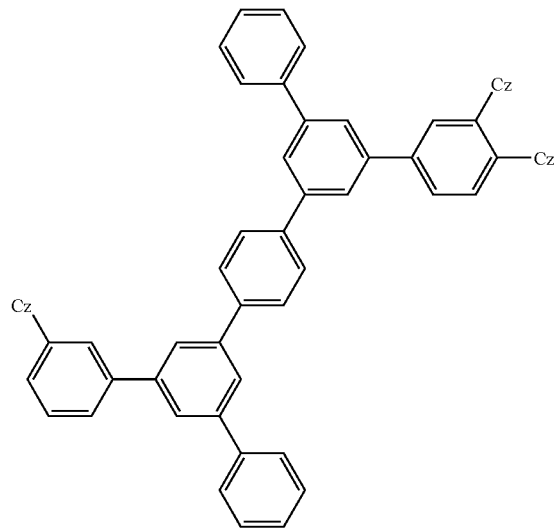
(C115)
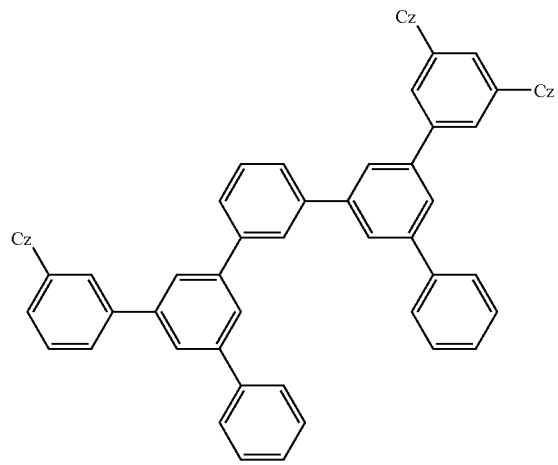
(C116)
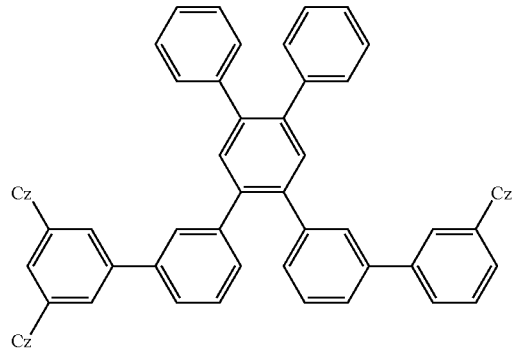

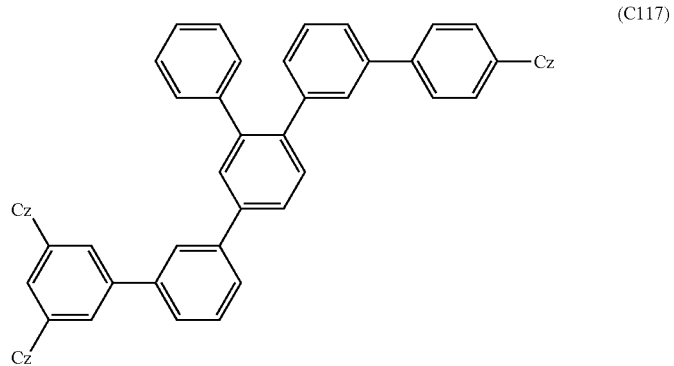
(C117)
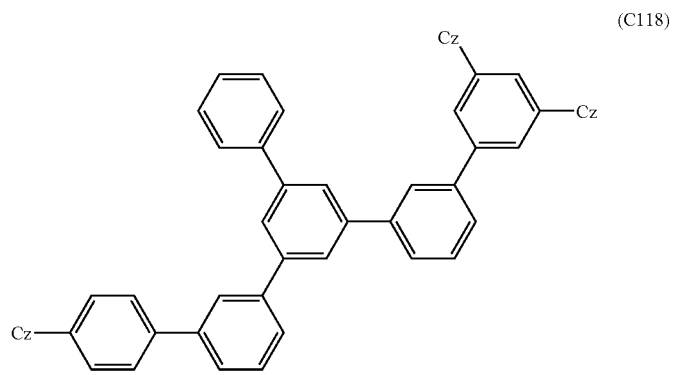
(C118)
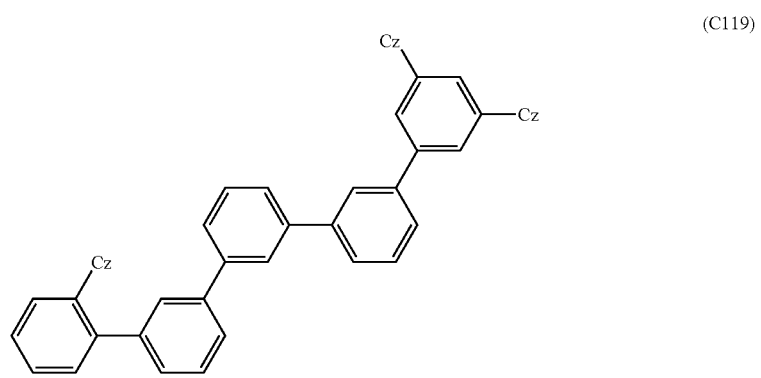
(C119)
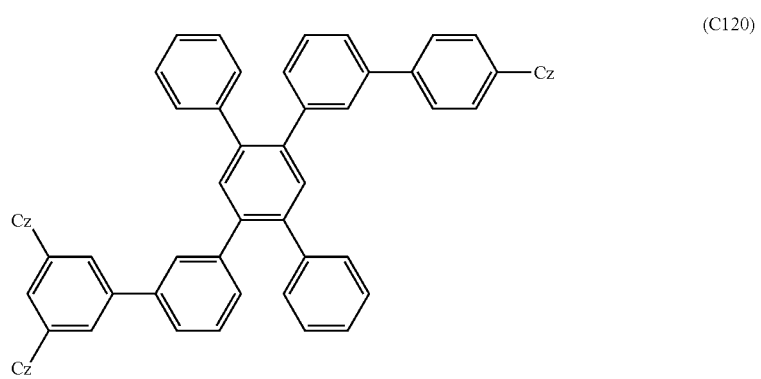
(C120)

-continued
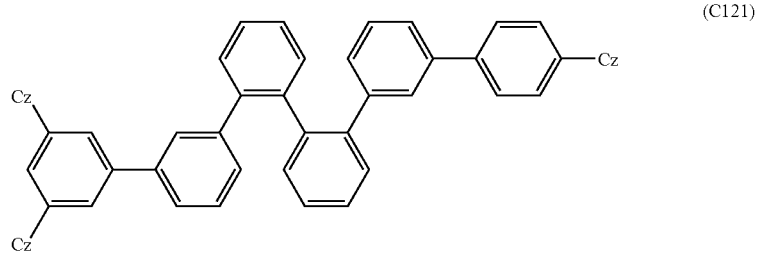
(C121)
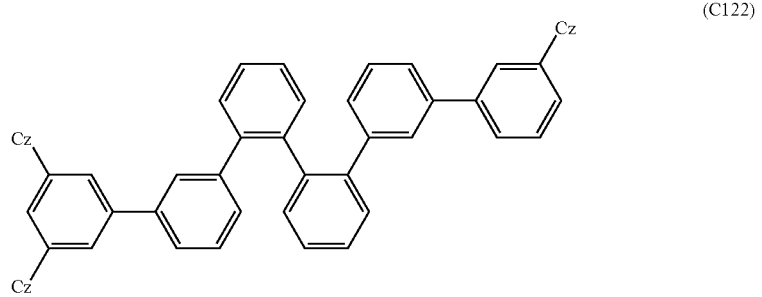
(C122)
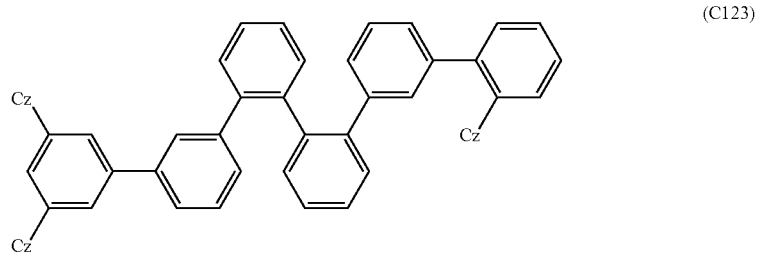
(C123)
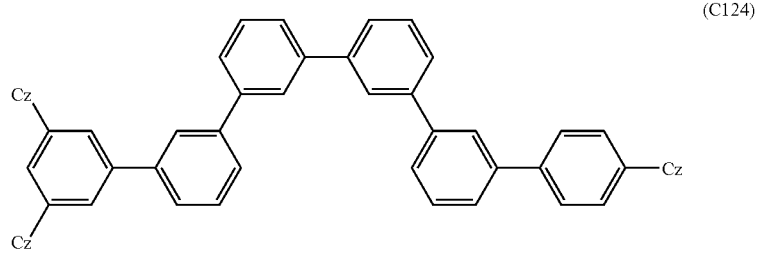
(C124)
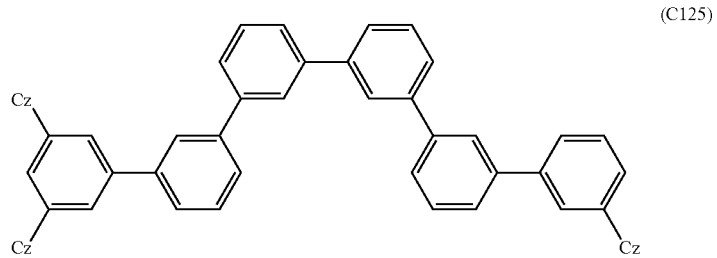
(C125)
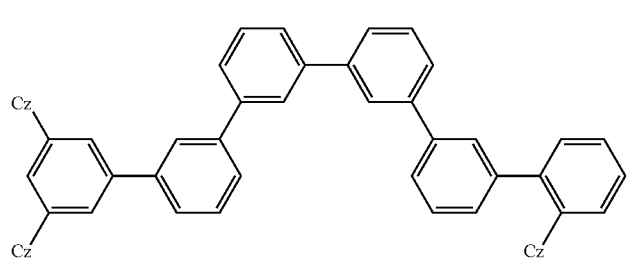
(C126)

(C127)
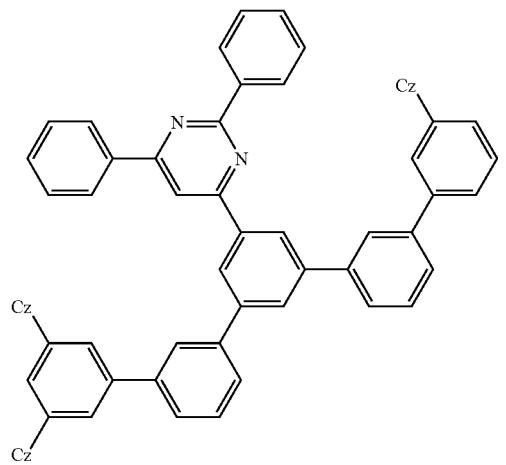
(C128)
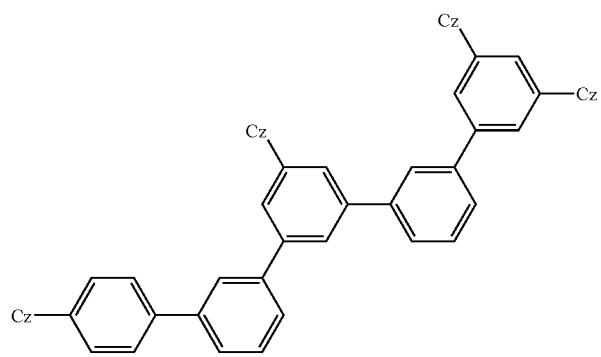
(C129)
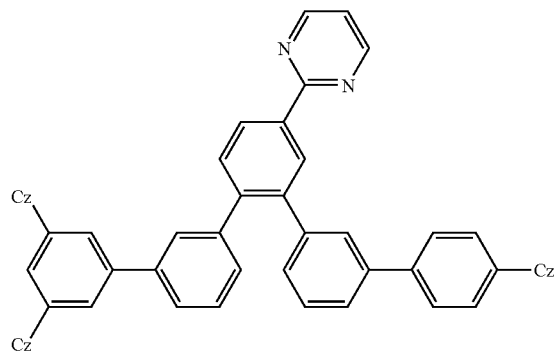
(C130)
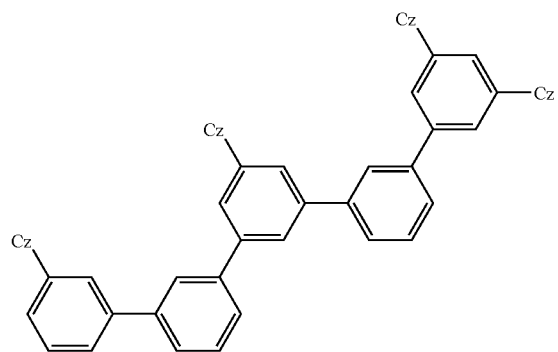

-continued
(C131)
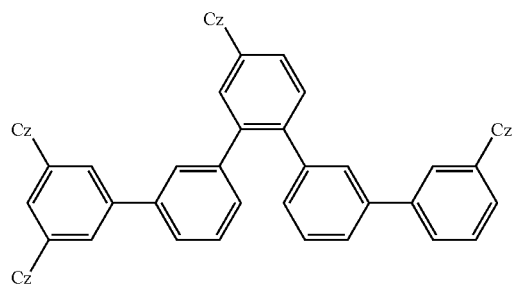
(C132)
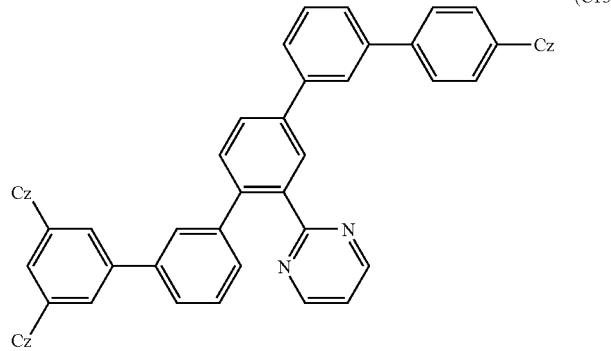
(C133)
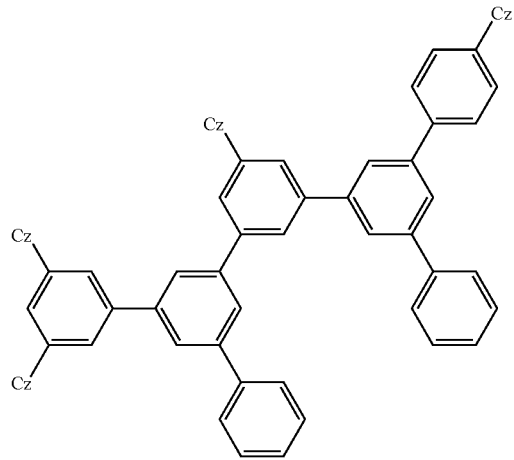
(C134)
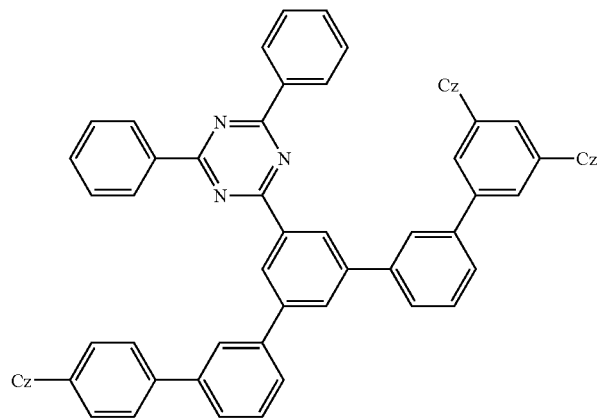

-continued
(C135)
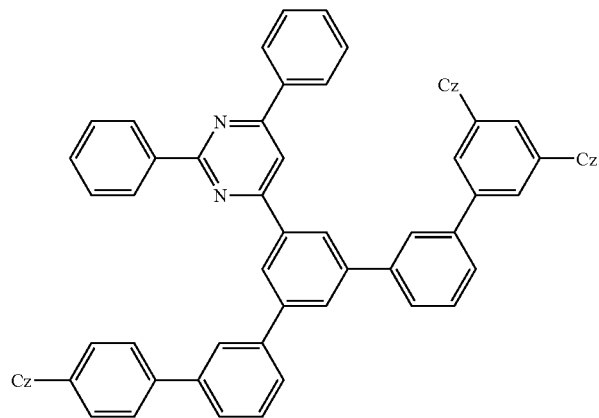
(C136)
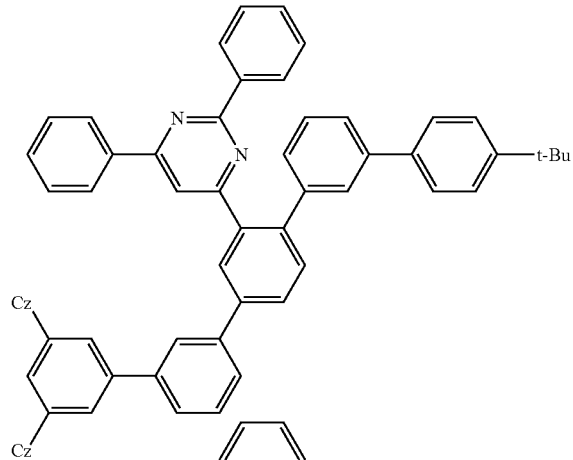
(C137)
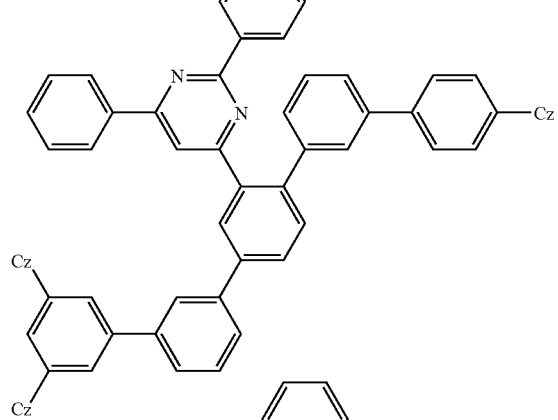
(C138)
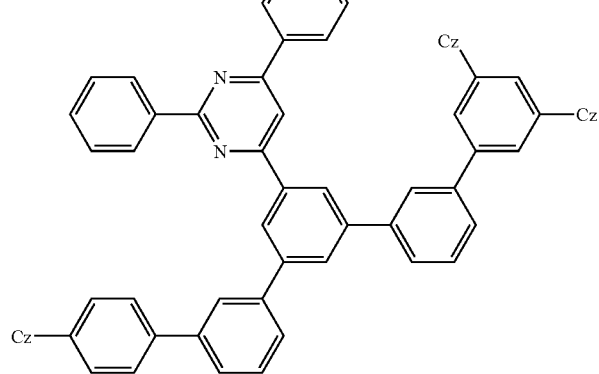

-continued
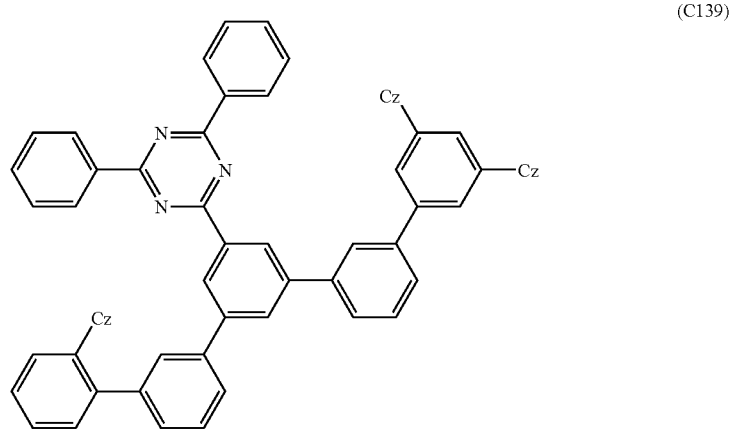
(C139)
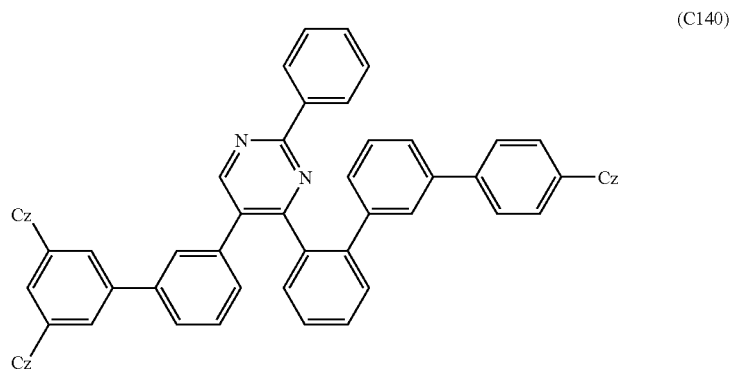
(C140)
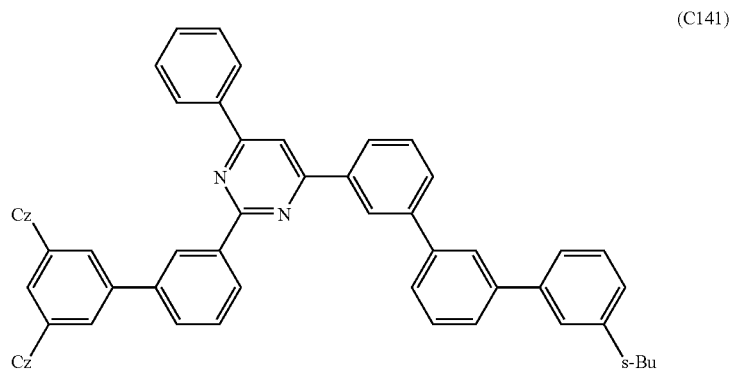
(C141)
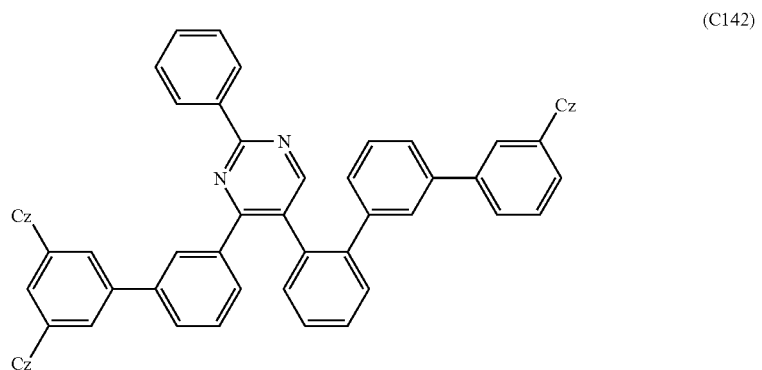
(C142)

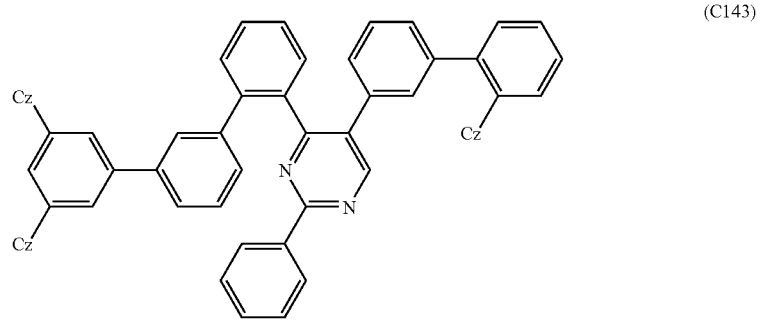
(C143)
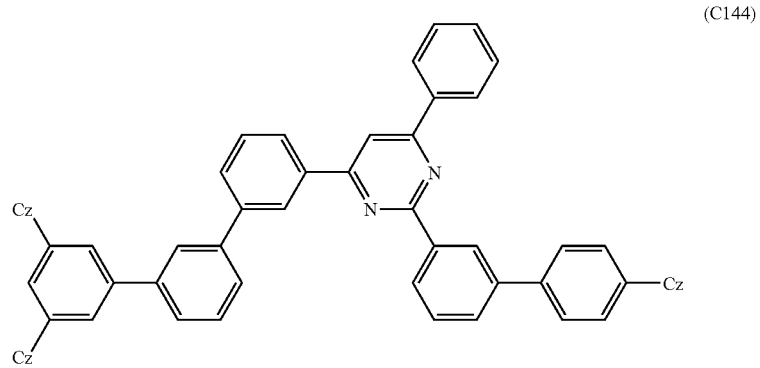
(C144)
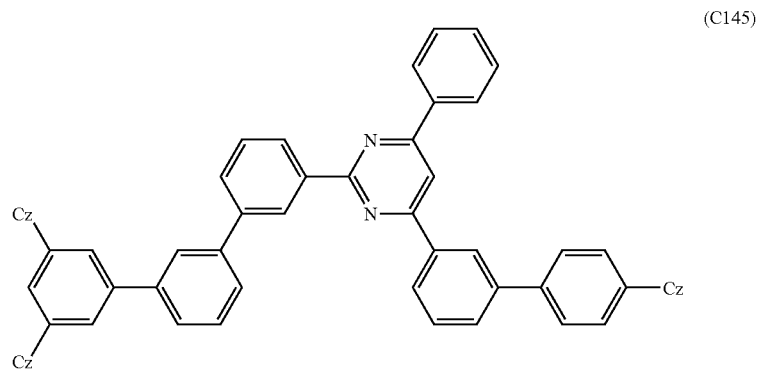
(C145)
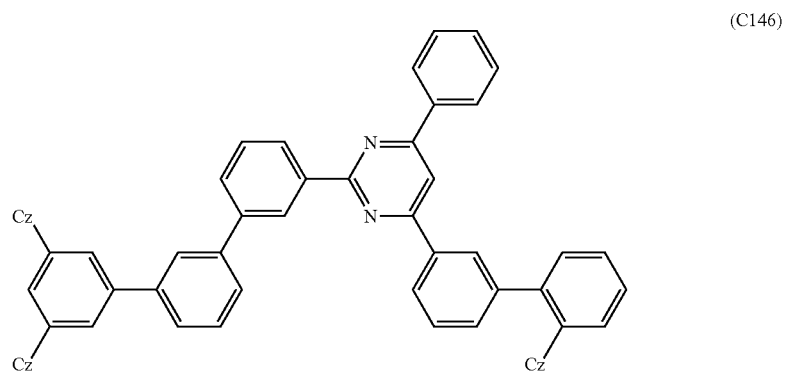
(C146)

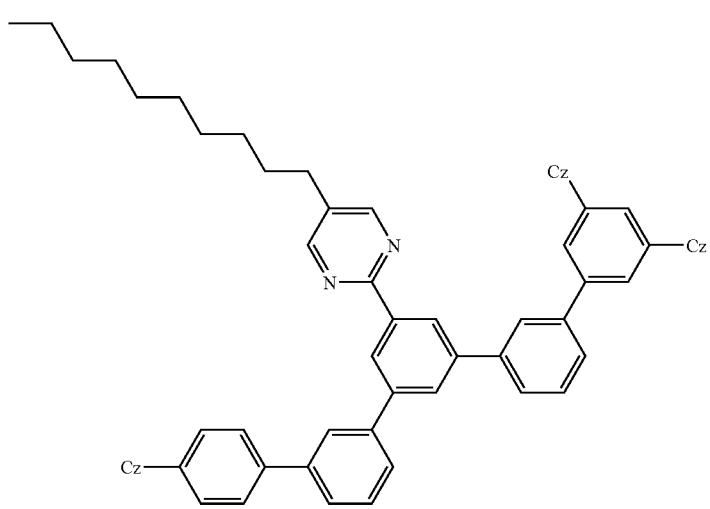

(C147)

Further, it is preferable that the material for the organic electroluminescence device of the present invention works as a host material in the organic EL device.

The construction of the organic EL device of the present invention will be explained below.

The present invention provides an organic electroluminescence device which comprises at least one organic thin film layer comprising a light emitting layer sandwiched between a pair of electrode consisting of an anode and a cathode, wherein at least one of the organic thin film layer comprises the material for the organic EL device of the present invention. Typical examples of the construction of the organic EL device of the multi-layer type include an anode/a hole transporting layer (a hole injecting layer)/a light emitting layer/a cathode; an anode/a light emitting layer/an electron transporting layer (an electron injecting layer)/a cathode; an anode/a hole transporting layer (a hole injecting layer)/a light emitting layer/an electron transporting layer (an electron injecting layer)/a cathode; an anode/a hole transporting layer (a hole injecting layer)/a light emitting layer/a hole barrier layer/an electron transporting layer (an electron injecting layer)/a cathode; etc.

The light emitting layer essentially consists of the host material and a phosphorus luminescent material wherein the host material preferably comprises the foregoing material for the organic EL device.

As the phosphorus luminescent material, iridium complexes, osmium complexes and platinum complexes are preferable, iridium complexes and platinum complexes are more preferable, and iridium complexes in the form of ortho metal are most preferable each since the quantum yield of phosphorescence is great and the external quantum efficiency of the light emitting device can be further increased respectively. As for the further preferable form of ortho metal complex, following iridium complexes are desirable.

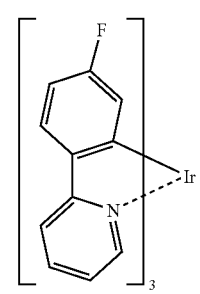

(K-1)

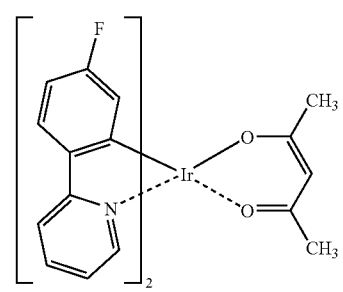

(K-2)

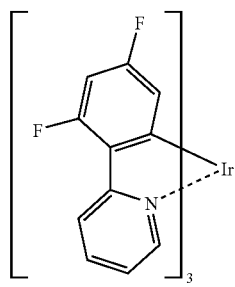

(K-3)

-continued
(K-4)
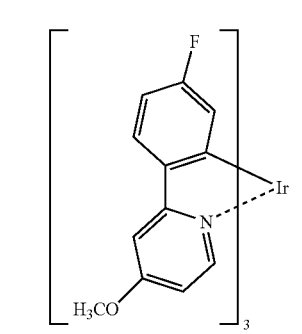
(K-5)
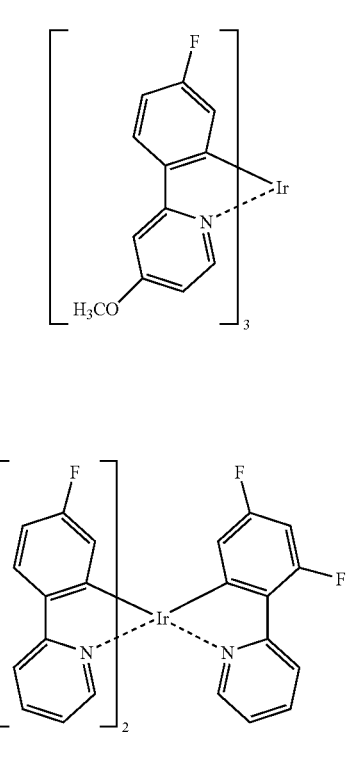
(K-6)
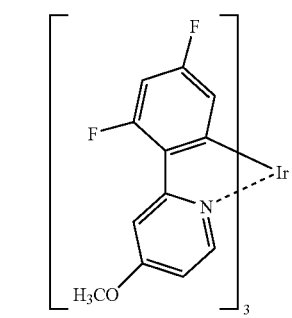
(K-7)
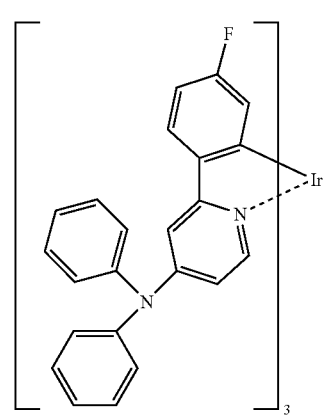
-continued
(K-8)
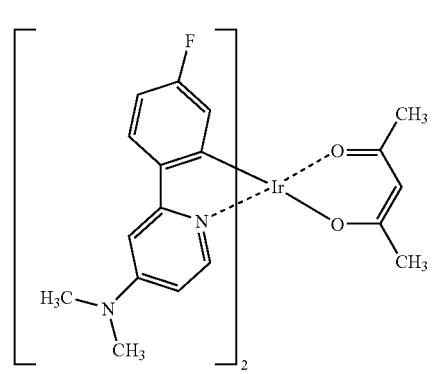
(K-9)
(K-10)
(K-11)
(K-12)

-continued (K-13)
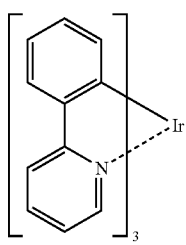

(K-14)
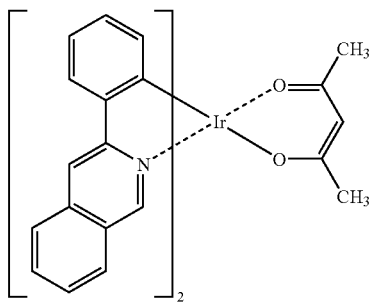

(K-15)
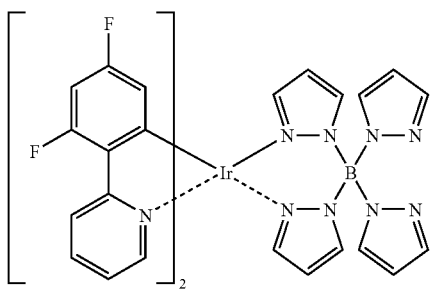

(K-16)
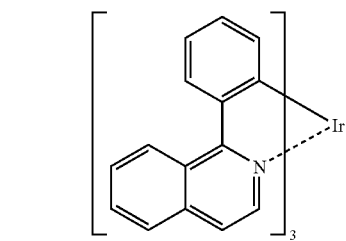

In the present invention, it is preferable that the reductive dopant is added in the interfacial region between the cathode and the organic thin film layer of the organic EL device.

Examples of the reductive dopant include at least one compound selected from alkali metals, alkali metal complexes, alkali metal compounds, alkaline earth metals, alkaline earth metal complexes, alkaline earth metal compounds, rare earth metals, rare earth metal complexes and rare earth metal compounds.

Examples of the alkali metal include Na (the work function: 2.36 eV), K (the work function: 2.28 eV), Rb (the work function: 2.16 eV), Cs (the work function: 1.95 eV) and so on; whose work function of 2.9 eV or smaller is particularly preferable. Among those, more preferable alkali metals include K, Rb and Cs, the latter Rb or Cs being farther more preferable and the last Cs being the most preferable.

Examples of the alkaline earth metal include Ca (the work function: 2.9 eV), Sr (the work function: 2.0 to 2.5 eV) and Ba (the work function: 2.52 eV). Alkaline earth metals with a work function of 2.9 eV or smaller is preferable.

Examples of the rare earth metal include Sc, Y, Ce, Tb and Yb. Rare earth metals with a work function of 2.9 eV or smaller is preferable.

Those alkaline metals have particularly high reducing capability, and only an addition of relatively small amount of them into an electron injection region enables to expect both improvement of luminance and lifetime extension of the organic EL device.

Examples of the alkali metal compound described above include alkali metal oxides such as $Li_2O$, $Cs_2O$ and $K_2O$ and alkali metal halides such as LiF, NaF, CsF and KF. Among these compounds, alkali metal oxides and alkali metal fluorides such as LiF, $Li_2O$ and NaF are preferable.

Examples of the alkaline earth metal compound described above include BaO, SrO, CaO and mixtures thereof such as $Ba_xSr_{1-x}O$ ($0<x<1$) and $Ba_xCa_{1-x}O$ ($0<x<1$).

Examples of the rare earth metal compound described above include $YbF_3$, $ScF_3$, $ScO_3$, $Y_2O_3$, $Ce2O_3$, $GdF_8$ and $TbF_3$. Among these compounds, $YbF_3$, $ScF_3$ and $TbF_8$ are preferable.

The alkali metal complex, the alkaline earth metal complex and the rare earth metal complex are not particularly limited as long as the complexes contain at least one of the alkali metal ions, the alkaline earth metal ions and rare earth metal ions, respectively, as the metal ion. As the ligand, quinolinol, benzoquinolinol, acridinol, phenanthridinol, hydroxyphenyloxazole, hydroxyphenylthiazole, hydroxydiaryloxadiazoles, hydroxydiarylthiadiazoles, hydroxyphenylpyridine, hydroxyphenyl-benzimidazole, hydroxybenzotriazole, hydroxyfulvorane, bipyridyl, phenanthroline, phthalocyanine, porphyrin, cyclopentadiene, β-diketones, azomethines and derivatives of these compounds are preferable. However, the ligand is not limited to the ligands described above.

As for the addition form of the reductive dopant, it is preferable that the reductive dopant is added in a manner such that a layer or islands are formed in the interfacial zone described above. As the process for adding the reductive dopant, it is preferable that an organic material which is the light emitting material or the electron injecting material forming the interfacial region is vaporized while the reductive dopant is simultaneously vapor deposited in accordance with the resistance heating deposition method so that the reductive dopant is dispersed in the organic material. The concentration of the dispersion expressed as the ratio of the amounts by mole of the organic substance to the reductive dopant is in the range of 100:1 to 1:100 and preferably in the range of 5:1 to 1:5.

When the reductive dopant is added to form a layer, the reductive dopant alone is vapor deposited in accordance with the resistance heating deposition method to form a layer preferably having a thickness of 0.1 to 15 nm after a layer of the organic material such as the light emitting material and the electron injecting material is formed as the interfacial region.

When the reductive dopant is added to form islands, the reductive dopant alone is vapor deposited in accordance with the resistance heating deposition method to form islands preferably having a thickness of 0.1 to 15 nm after islands of the organic material such as the light emitting material and the electron injecting material were formed as the interfacial region.

It is preferable that the relative amounts by mole of the main component and the reductive dopant in the electron injecting layer of the organic EL device of the present invention is in the range of 5:1 to 1:5 and more preferably in the range of 2:1 to 1:2.

It is preferable that the organic EL device of the present invention has an electron injecting layer between the light emitting layer and the cathode and that the electron injecting layer comprises a compound with cyclic derivative structure having nitrogen atom as a main component.

An aromatic heterocyclic compound having at least one hetero atom in its molecular is preferably employed as the electron transporting material used in the electron injecting layer, a compound with cyclic derivative structure having nitrogen atom being particularly preferable.

For example, a specific compound represented by a following general formula (A) is preferable as the compound with cyclic derivative structure having nitrogen atom.

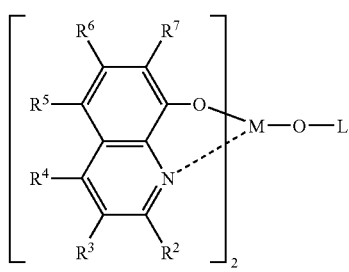

(A)

wherein $R_2$ to $R_7$ each independently represents a hydrogen atom, a halogen atom, an oxy group, an amino group or a hydrocarbon group having 1 to 40 carbon atoms, that may be substituted respectively.

Specific examples of the halogen atom are the same as the foregoing description. Further, examples of the above amino group which may be substituted are the same as about the foregoing alkylamino group, the foregoing arylamino group and the foregoing aralkylamino group.

Examples of the hydrocarbon group having 1 to 40 carbon atoms include a substituted or unsubstituted alkyl group, a substituted or unsubstituted alkenyl group, a substituted or unsubstituted cycloalkyl group, a substituted or unsubstituted alkoxy group, a substituted or unsubstituted aryl group, a substituted or unsubstituted heterocyclic group, a substituted or unsubstituted aralkyl group, a substituted or unsubstituted aryloxy group, a substituted or unsubstituted alkoxycarbonyl group, etc. Examples of the alkyl group, the alkenyl group, the cycloalkyl group, the alkoxy group, aryl, the heterocyclic group, the aralkyl group and the aryloxy group are the same as the foregoing description. The alkoxycarbonyl group is expressed by —COOY', while examples of Y' are the same as the examples of the above alkyl group.

M represents aluminum (Al), gallium (Ga) or indium (In), preferably In.

L in the general formula (A) is a group expressed by a following general formula (A') or a following general formula (A'').

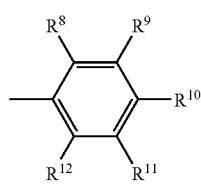

(A')

-continued

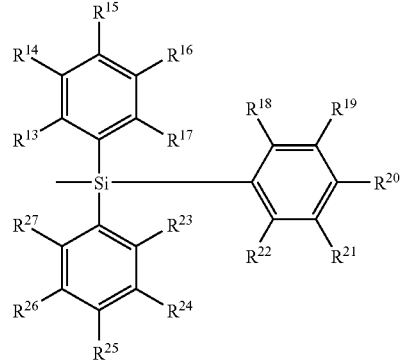

(A'')

wherein $R_3$ to $R_{12}$ each independently represents a hydrogen atom or a substituted or unsubstituted hydrocarbon group having 1 to 40 carbon atoms, while an adjacent group may form a ring structure between each other respectively. Further, $R_{18}$ to $R_{27}$ each independently represents a hydrogen atom or a substituted or unsubstituted hydrocarbon group having 1 to 40 carbon atoms, while an adjacent group may form a ring structure between each other respectively.

Examples of the hydrocarbon group having 1 to 40 carbon atoms represented by $R_8$ to $R_{12}$ in the general formula (A') and by $R_{18}$ to $R_{27}$ in the general formula (A'') are the same specific examples as the foregoing $R_2$ to $R_7$.

Furthermore, examples of a bivalent group made by bonding the adjacent groups among the above $R_8$ to $R_{12}$ and $R_{18}$ to $R_{27}$ to form a ring structure include tetramethylene group, pentamethylene group, hexamethylene group, diphenylmethane-2,2'-diyl group, diphenylethane-3,3'-diyl group, diphenylpropane-4,4'-diyl group, etc.

Specific examples of the metal chelate complex having a nitrogen atom represented by the general formula (A) include the following compounds, though not limited thereto.

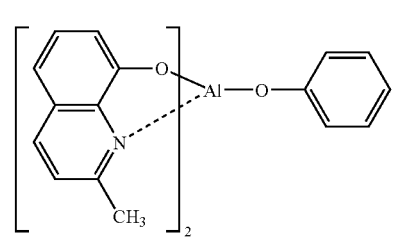

(A-1)

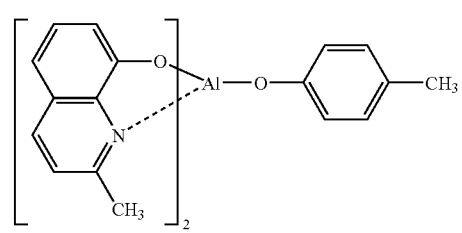

(A-2)

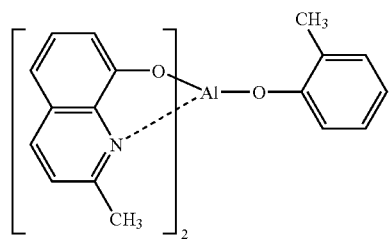 (A-3)
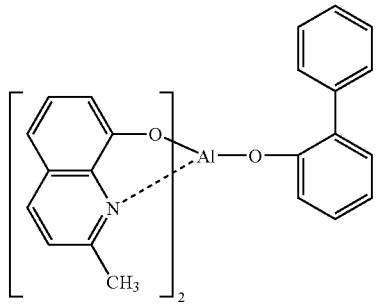 (A-4)
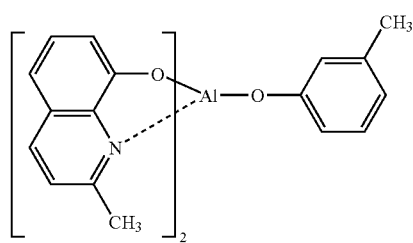 (A-5)
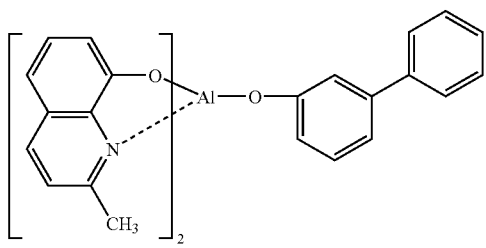 (A-6)
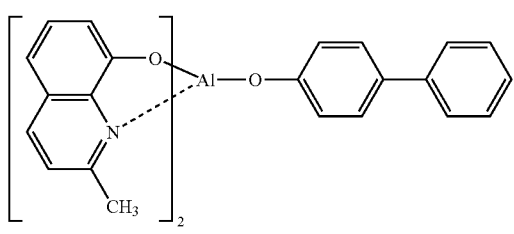 (A-7)
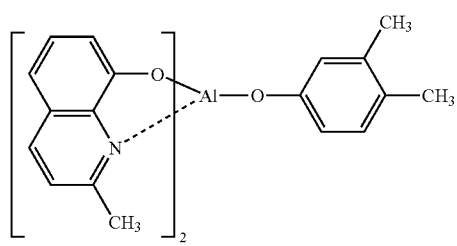 (A-8)
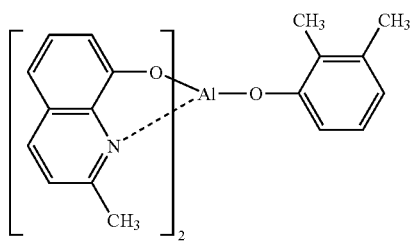 (A-9)
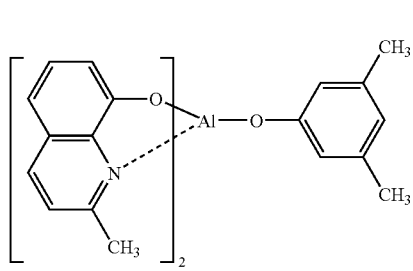 (A-10)
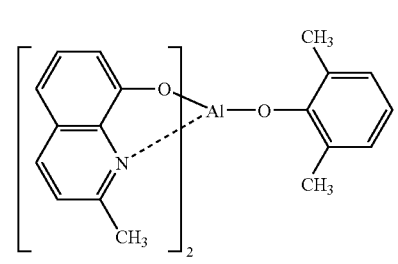 (A-11)
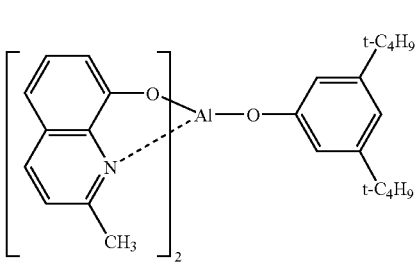 (A-12)
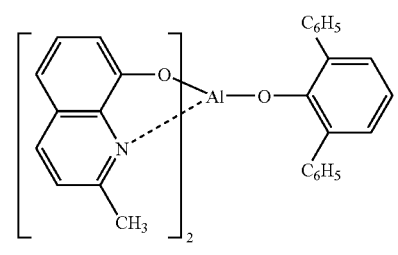 (A-13)
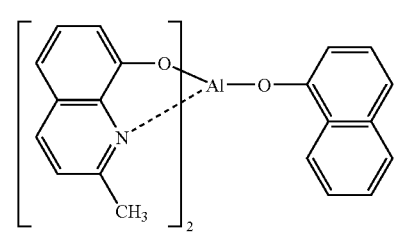 (A-14)

-continued
(A-15) 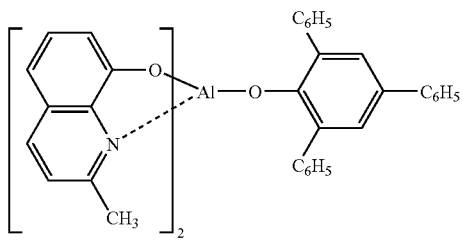
(A-16) 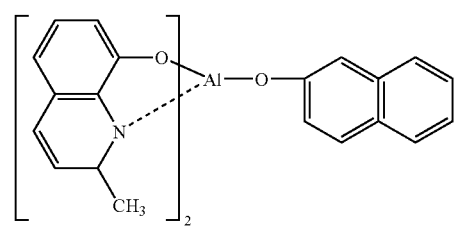
(A-17) 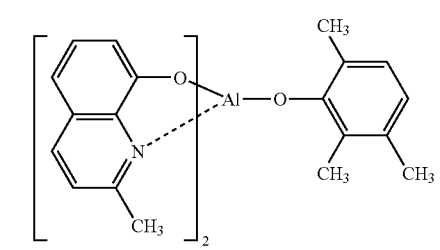
(A-18) 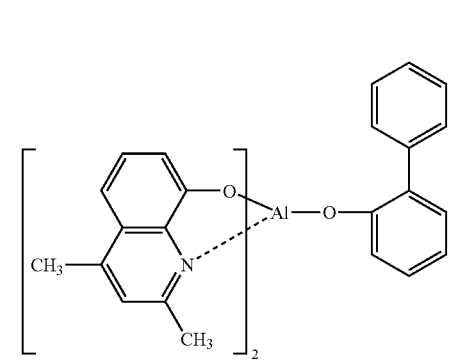
(A-19) 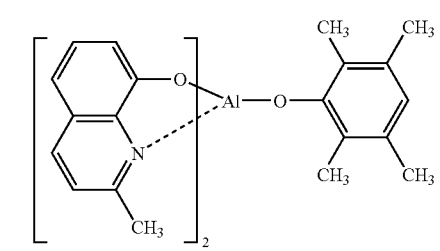
(A-20) 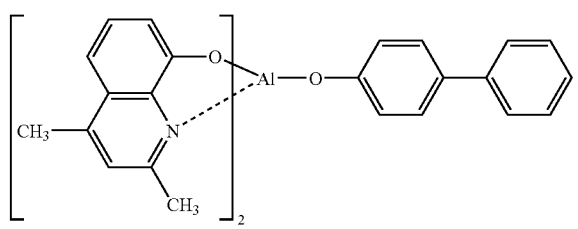
-continued
(A-21) 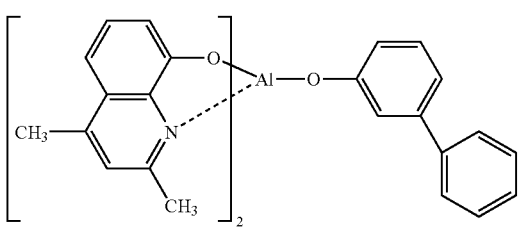
(A-22) 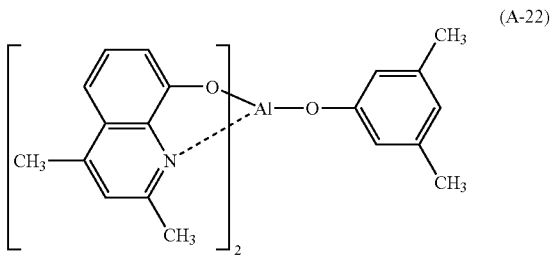
(A-23) 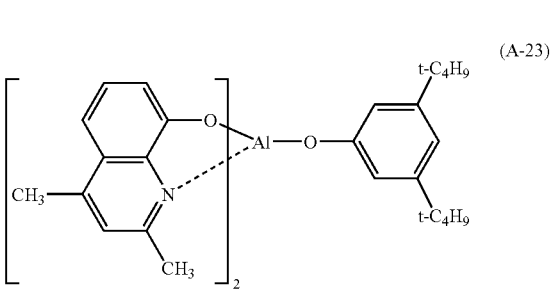
(A-24) 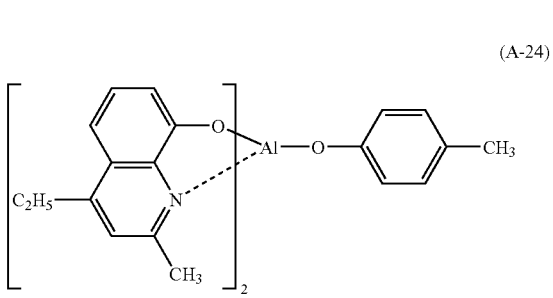
(A-25) 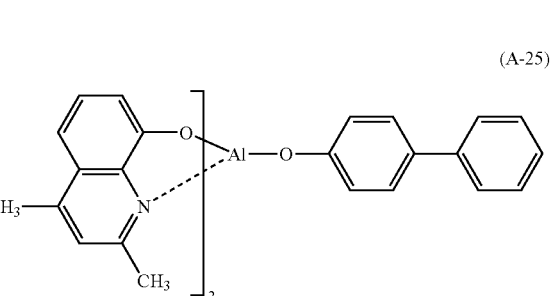
(A-26) 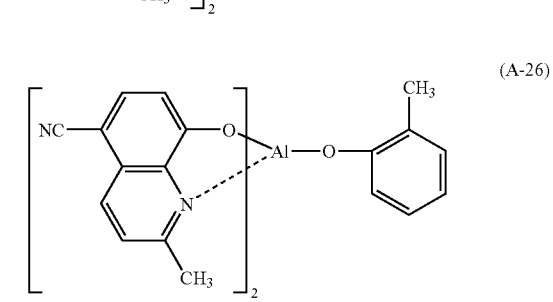

-continued (A-27)
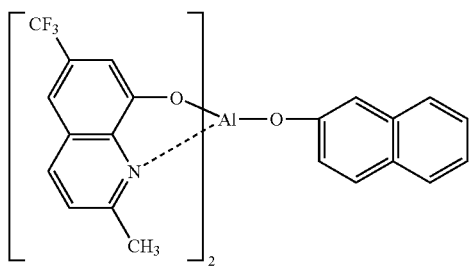

(A-28)
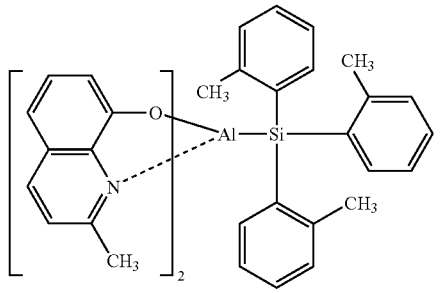

(A-29)
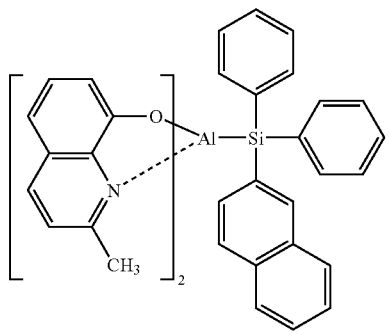

(A-30)
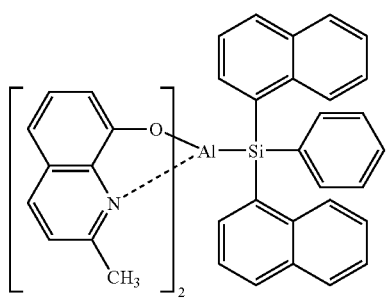

(A-31)
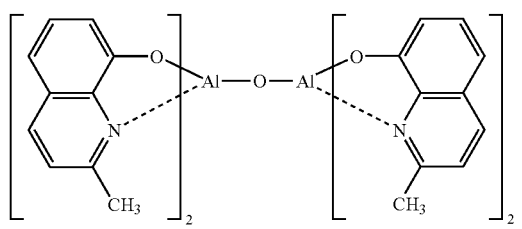

-continued (A-32)
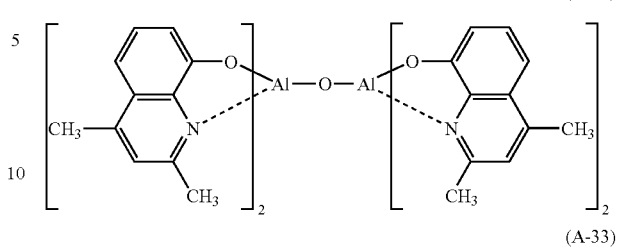

(A-33)
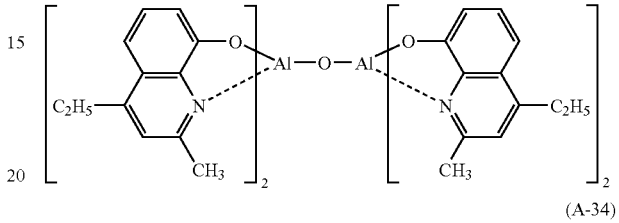

(A-34)
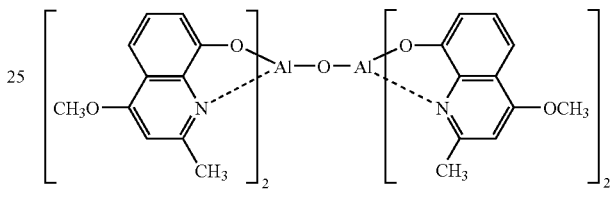

(A-35)
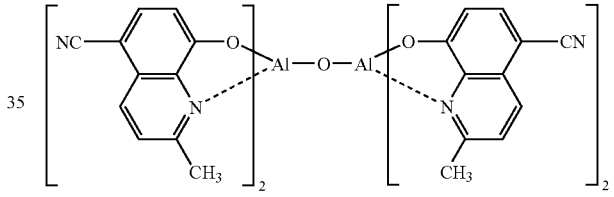

(A-36)
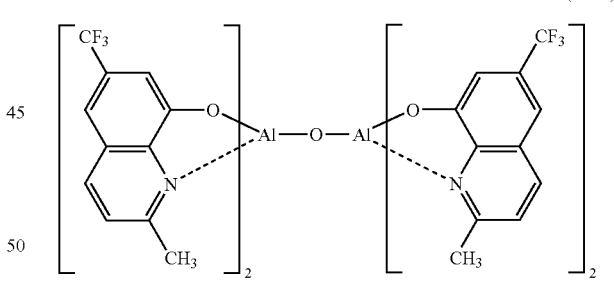

With regard to the compound of cyclic derivative having nitrogen atom as an essential component of the electron injecting layer, it is preferably a 5-member ring derivative having a nitrogen atom and examples of the 5-member ring include imidazole ring, triazole ring, tetrazole ring, oxadiazole ring, thiadiazole ring, oxatriazole ring, thiatriazole ring, etc. Examples of the 5-member ring derivative having a nitrogen atom include benzimidazole ring, benztriazole ring, pyridinoimidazole ring, pyrimidino imidazole ring and pyridazino imidazole ring; while the 5-member ring derivative having a nitrogen atom being particularly preferable to be represented by a following general formula (B):

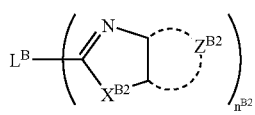
(B)

In the general formula (B), $L^B$ represents a bonding group with bivalent or more, examples include carbon atom, silicon atom, nitrogen atom, boron atom, oxygen atom, sulfur atom, metals (for example, barium, berylium), aromatic hydrocarbon ring, aromatic heterocycles and so on. Among those, carbon atom, nitrogen atom, silicon atom, boron atom, oxygen atom, sulfur atom, aryl group or aromatic heterocyclic group is preferable; and carbon atom, silicon atom, aryl group or aromatic heterocyclic group is further preferable.

The aryl group and the aromatic heterocyclic group represented by $L^B$ may have a substituent, and preferable examples of the substituent are alkyl group, alkenyl group, alkynyl group, aryl group, amino group, alkoxy group, aryloxy group, acyl group, alkoxycarbonyl group, aryloxy carbonyl group, acyl oxy group, acylamino group, alkoxycarbonylamino radical, aryloxy carbonylamino group, sulfonyl amino group, sulfamoyl group, carbamoyl group, alkylthio group, arylthio group, sulphonyl group, halogen atom, cyano group and aromatic heterocycle group; more preferable examples are alkyl group, aryl group, alkoxy group, aryloxy group, halogen atom, cyano group and aromatic heterocycle group; furthermore preferable examples are alkyl group, aryl group, alkoxy group, aryloxy group and aromatic heterocycle group; and particularly preferable examples are alkyl group, aryl group, alkoxy group and aromatic heterocycle group.

Specific examples of $L^B$ are as follows:

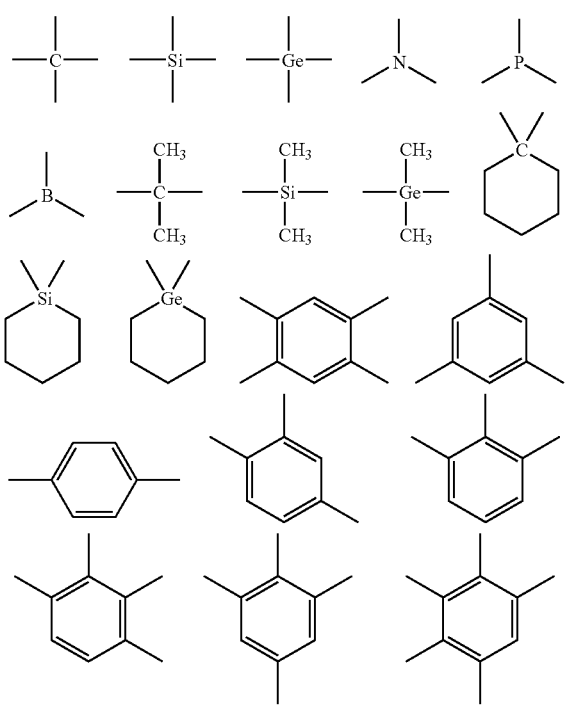

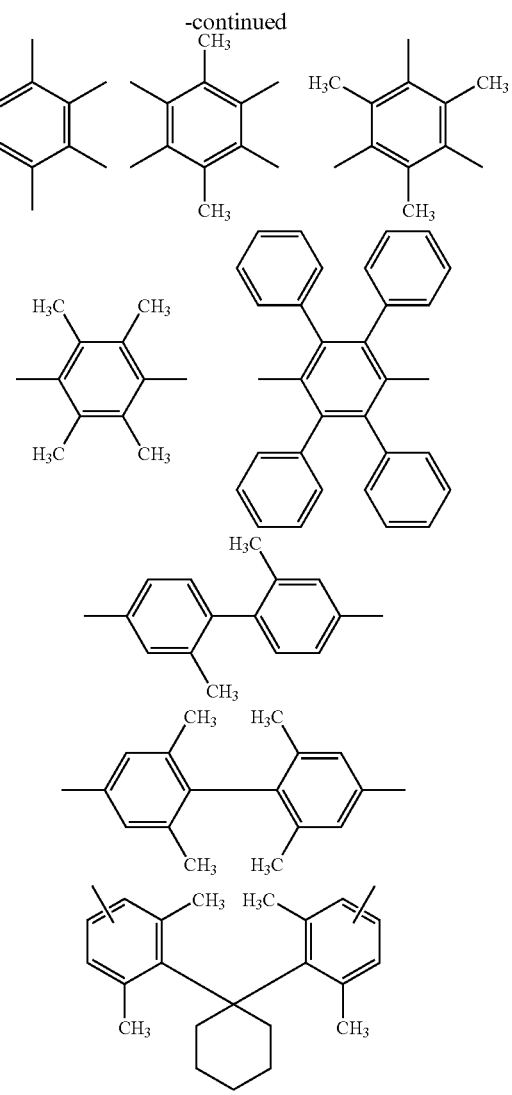

$X^{B2}$ in the general formula (B) represents —O—, —S— or =N—$R^{B2}$. $R^{B2}$ represents a hydrogen atom, an aliphatic hydrocarbon group, an aryl group or a heterocyclic group.

Examples of the aliphatic hydrocarbon group represented by $R^{B2}$ include linear, branched or cyclic alkyl group; linear, branched or cyclic alkenyl group; and linear, branched or cyclic alkynyl group. The linear, branched or cyclic alkyl group has preferably 1 to 20 carbon atoms, more preferably 1 to 12 carbon atoms, particularly preferably 1 to 8 carbon atoms and examples include methyl group, ethyl group, iso-propyl group, tert-butyl group, n-octyl group, n-decyl group, n-hexadecyl group, cyclopropyl group, cyclopentyl group, cyclohexyl group, etc. The linear, branched or cyclic alkenyl group has preferably 2 to 20 carbon atoms, more preferably 2 to 12 carbon atoms, particularly preferably 2 to 8 carbon atoms and examples include vinyl group, aryl group, 2-butenyl group, 3-pentenyl group, etc. The linear, branched or cyclic alkynyl group has preferably 2 to 20 carbon atoms, more preferably 2 to 12 carbon atoms, particularly preferably 2 to 8 carbon atoms and examples include propargyl group, 3-pentinyl group, etc. Among those, the linear, branched or cyclic alkynyl group is most preferable.

The aryl group represented by $R^{B2}$ consists of single ring or condensed ring, having preferably 6 to 30 carbon atoms, more preferably 6 to 20 carbon atoms, further more preferably 6 to 12 carbon atoms and examples include phenyl 2-methylphenyl, 3-methylphenyl, 4-methylphenyl, 2-methoxyphenyl, 3-trifluoromethylphenyl, pentafluorophenyl, 1-naphthyl, 2-naphthyl, etc.

The heterocyclic group represented by $R^{B2}$ consists of single ring or condensed ring, having preferably 1 to 20 carbon atoms, more preferably 1 to 12 carbon atoms, further more preferably 1 to 10 carbon atoms and specifically, it is preferable to be an aromatic heterocyclic group having at least one selected from a group consisting of a nitrogen atom, an oxygen atom, a sulfur atom and a selenium atom. Examples of the heterocyclic group include pyrrolidine, piperidine, piperazine, morpholine, thiophene, selenophene, furan, pyrrole, glyoxaline, pyrazole, pyridine, pyrazine, pyridazine, pyrimidine, triazole, triazine, indole, indazole, purine, thiazoline, thiazole, thiadiazole, oxazoline, oxazole, oxadi azole, chinoline, isoquinoline, phthalazine, naphthyridine, quinoxaline, quinazoline, quinoliine, pteridine, acridine, phenanthroline, phenazine, tetrazole, benzimidazole, benz oxazole, benzothiazole, benz triazole, tetrazaindene, carbazole, azepin, etc.; while furan, thiophene, pyridine, pyrazine, pyrimidine, pyridazine, triazine, quinoline, phthalazine, naphthyridine, quinoxaline and quinazoline are preferable; furan, thiophene, pyridine and quinoline are more preferable; and quinoline is further more preferable.

The aliphatic hydrocarbon group, the aryl group and the heterocyclic group represented by $R^{B2}$ may have a substituent whose examples are the same as the above examples of the substituent of the foregoing $L^B$ including the preferable examples.

The aliphatic hydrocarbon group, the aryl group and the heterocyclic group are preferable as $R^{B2}$, the aliphatic hydrocarbon group having desirably 6 to 30 carbon atoms, more desirably 6 to 20 carbon atoms and further more desirably 6 to 12 carbon atoms or the aryl group are more preferable and the aliphatic hydrocarbon group having desirably 1 to 20 carbon atoms, more desirably 1 to 12 carbon atoms and further more desirably 2 to 10 carbon atoms is further more preferable.

In the general formula (B), $X^{B2}$ is preferably —O— or $=N—R^{B2}$ and particularly preferably $=N—R^{B2}$.

In the general formula (B), $Z^{B2}$ expresses necessary atom group in order to form aromatic ring. The aromatic group ring formed by $Z^{B2}$ may be any of an aromatic hydrocarbon ring or an aromatic heterocycles; examples include benzene ring, pyridine ring, pyrazine ring, pyrimidine ring, pyridazine ring, triazine ring, pyrrole ring, furan ring, thiophene ring, selenophene ring, tellurophene ring, imidazole ring, thiazole ring, selenazole ring, tellurazole ring, thiadiazole ring, oxadiazole ring, pyrazole ring, etc.; while benzene ring, pyridine ring, pyrazine ring, pyrimidine ring and pyridazine ring are preferable; benzene ring, pyridine ring and pyrazine ring are more preferable; benzene ring and pyridine ring are further more preferable; and pyridine ring is particularly preferable.

The aromatic group ring formed by $Z^{B2}$ may form a condensed ring with other ring or may have a substituent. Preferable substituent for $Z^{B2}$ are alkyl group, alkenyl group, alkynyl group, aryl group, amino group, alkoxy group, aryloxy radical, acyl group, alkoxycarbonyl group, aryloxy carbonyl group, acyl oxy group, acylamino group, alkoxycarbonylamino group, aryloxy carbonylamino group, sulfonyl amino group, sulfamoyl group, carbamoyl group, alkylthio group, arylthio group, sulfonyl group, halogen atom, cyano group and heterocyclic group; more preferable substituent for $Z^{B2}$ are alkyl group, aryl group, alkoxy group, aryloxy group, halogen atom, cyano group and heterocyclic group; further more preferable substituent for $Z^{B2}$ are alkyl group, aryl group, alkoxy group, aryloxy group and heterocyclic group; particularly preferable substituent for $Z^{B2}$ are alkyl group, aryl group, alkoxy group and heterocyclic group.

In the general formula (B), $n^{B2}$ represents an integer of 1 to 4, preferably an integer of 2 or 3.

Among the 5-member ring derivative having a nitrogen atom expressed by the foregoing general formula (B), further preferable derivatives are expressed by a following general formula (B'):

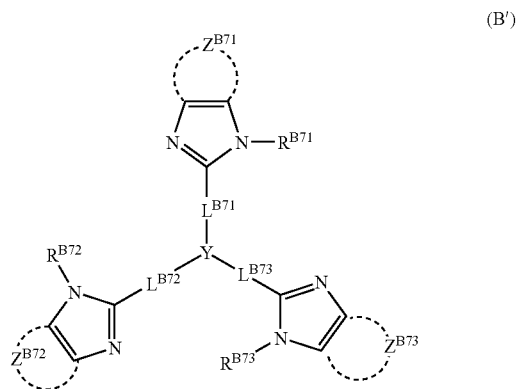

(B')

In the general formula (B'), $R^{B71}$, $R^{B72}$ and $R^{B73}$ each represents the same as $R^{B2}$ in the general formula (B) including the preferable examples.

In the general formula (B'), $Z^{B71}$, $Z^{B72}$ and $Z^{B73}$ each represents the same as $Z^{B2}$ in the general formula (B) including the preferable examples.

In the general formula (B'), $L^{B71}$, $L^{B72}$ and $L^{B73}$ each represents a bonding group of bivalent or more described as the examples of $L^B$ in the general formula (B); preferably a single bond, a bivalent aromatic hydrocarbon ring group, a bivalent aromatic heterocyclic group; and the bonding group formed by those combination; more preferably a single bond. $L^{B71}$, $L^{B72}$ and $L^{B73}$ may have a substituent, whose examples are the same as described as the substituent for $L^B$ in the general formula (B) including the preferable examples.

Y represents a nitrogen atom, a 1,3,5-benzenetriyl group or a 2,4,6-triazinetriyl group. The 1,3,5-benzenetriyl group may have substituent at 2, 4 and 6-positions, examples of the substituent include alkyl group, aromatic hydrocarbon ring group, halogen atom, etc.

Specific examples of the derivatives of 5-member ring having a nitrogen atom represented by the general formula (B) or the general formula (B') include the following compounds, though not limited thereto.

-continued
(B-1) 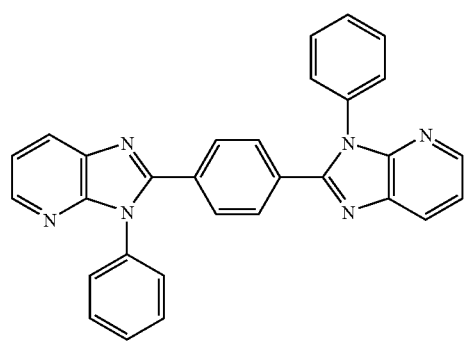
(B-5) 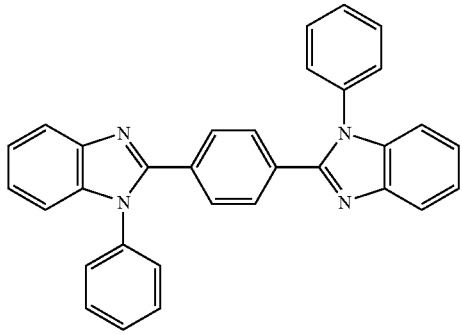
(B-2) 
(B-6) 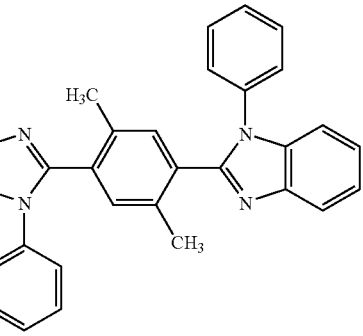
(B-3)
(B-7) 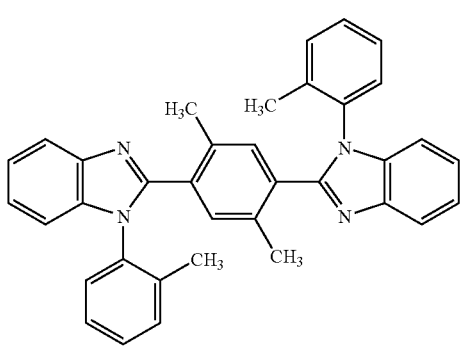
(B-4)
(B-8) 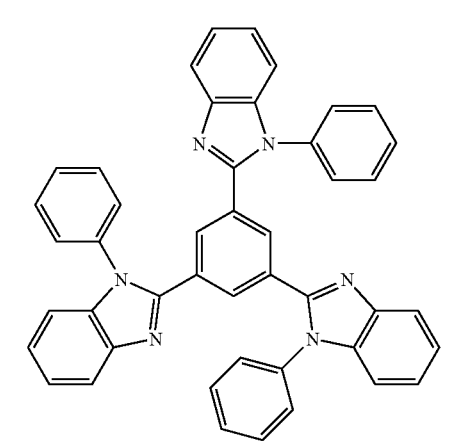

-continued
(B-9)
(B-10)
(B-11)
(B-12)
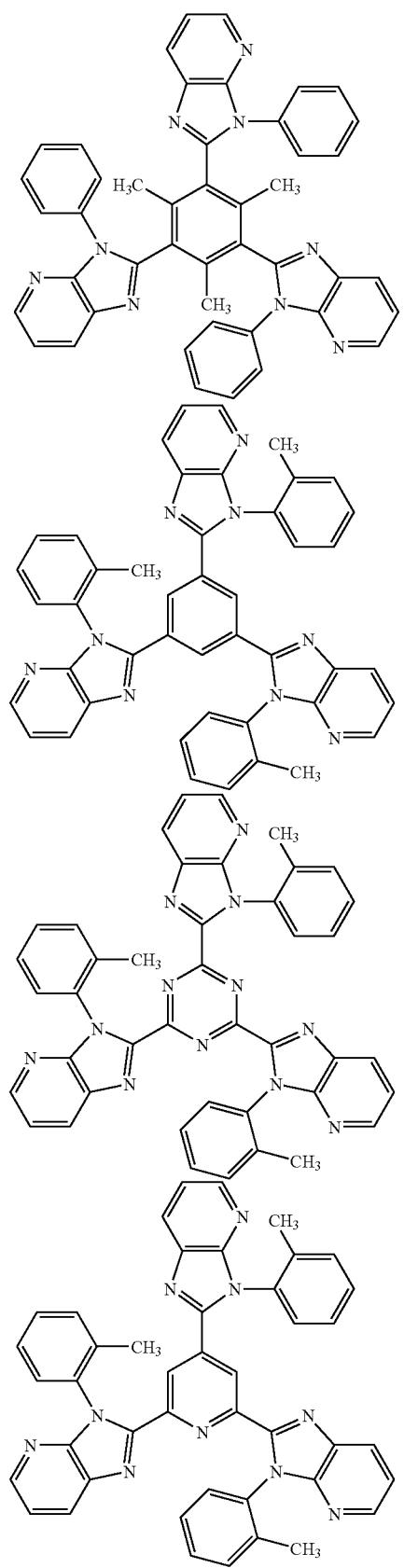
-continued
(B-13)
(B-14)
(B-15)
(B-16)
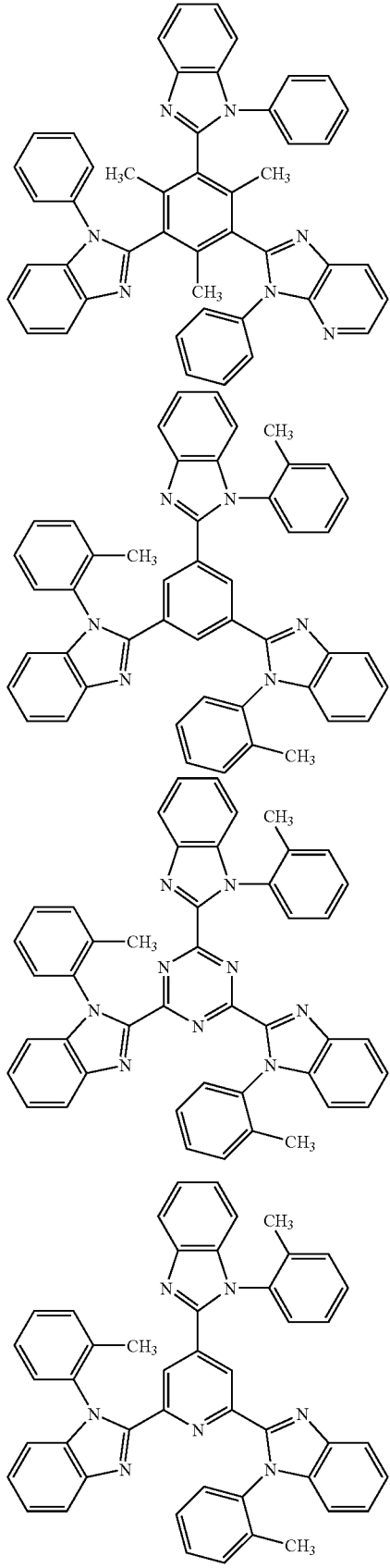

Further in the organic EL device of the present invention, it is preferable to employ an inorganic compound such as an insulating material or a semiconductor for an electron injecting layer. The electron injecting layer employing an insulating material or a semiconductor effectively prevents leak in the electric current and improves the electron injecting capability.

With regard to the electric insulator, an employment of at least one or more kinds of metal compound selected from the group consisting of alkaline metal chalcogenide, alkaline earth metal chalcogenide, halide of alkaline metal and halide of alkaline earth metal is preferable. It is preferable that the electron injecting layer is constituted with the above alkali metal chalcogenide since the electron injecting property can be improved. Preferable examples of the alkali metal chalcogenide include $L_{i2}O$ LiO, $Na_2S$ and $Na_2Se$. Preferable examples of the alkaline earth metal chalcogenide include CaO, BaO, SrO, BeO, BaS and CaSe. Preferable examples of the alkali metal halide include LiF, NaF, KF, LiCl, KCl and NaCl. Preferable examples of the alkaline earth metal halide include fluorides such as $CaF_2$, $BaF_2$, $SrF_2$, $MgF_2$ and $BeF_2$ and halides other than the fluorides.

Examples of the semiconductor constituting the electron injecting layer include oxides, nitrides and nitriding oxides containing at least one element selected from Ba, Ca, Sr, Yb, Al, Ga, In, Li, Na, Cd, Mg, Si, Ta, Sb and Zn, which are used singly or in combination of two or more. It is preferable that the inorganic compound constituting the electron transporting layer is in the form of a fine crystalline or amorphous insulating thin film. When the electron transporting layer is constituted with the above insulating thin film, a more uniform thin film can be formed and defective pixels such as dark spots can be decreased. Examples of the inorganic compound include the alkali metal chalcogenides, the alkaline earth metal chalcogenides, the alkali metal halides and the alkaline earth metal halides which are described above.

In the present invention, a reductive dopant may be added in the electron injecting or transporting layer.

It is preferable that the organic EL device of the present invention has a hole transporting layer between the light emitting layer and the anode and that the hole transporting layer comprises an arylamine derivative as a main component. Further, it is preferable that the triplet energy of the hole transporting material in the hole transporting layer falls within a range of from 2.52 to 3.7 eV, more desirably from 2.8 to 3.7 eV. An employment of the hole transporting material having the above triplet energy range enables to prevent quenching an excitation energy of the light emitting layer.

The above hole transporting material is preferably represented by the following general formulae (C) and (D):

wherein $Ar^7$ represents an aromatic group having 6 to 40 carbon atoms, $Ar^8$ and $Ar^9$ each independently represents hydrogen atom or an aromatic group having 6 to 40 carbon atoms respectively, and m represents an integer of 1 to 6.

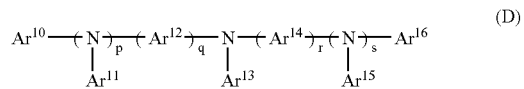

wherein $Ar^{10}$ and $Ar^{16}$ each represents an aromatic group having 6 to 40 carbon atoms, $Ar^{11}$ to $Ar^{15}$ each independently represents hydrogen atom or an aromatic group having 6 to 40 carbon atoms respectively, and condensation numbers p, q, r and a are each 0 or 1 respectively.

Among the aromatic group having 6 to 40 carbon atoms in the above general formulae (C) and (D), preferable examples of aryl group having 5 to 40 nuclear atoms include phenyl, naphthyl, anthranil, phenanthryl, pyrenyl, coronyl biphenyl, terphenyl, pyrrolyl, furanyl, thiophenyl, benz thiophenyl oxadiazolyl, diphenyl, anthranil, indolyl, carbazolyl, pyridyl, benz quinolyl, fluoranthenyl, acenaphtho fluoranthenyl, etc. Further, preferable examples of arylene group having 5 to 40 nuclear atoms include phenylene, naphthylene, anthranylene, phenanthrylene, pyrenylene, coronylene, biphenylene, terphenylene, pyrrolylene, franylene, thiophenylene, benz thiophenylene, oxadiazolilane, diphenylanthranilane, indolilane, carbazolilane, pyridylene, benzoquinolilane, fluoranthenylene, acenaphthofluoranthenylene, etc. Additionally, the aromatic group having 6 to 40 carbon atoms may be further substituted with a substituent. Preferable examples of the substituent include alkyl group having 1 to 6 carbon atoms (e.g. ethyl group, methyl group, i-propyl group, n-propyl group, s-butyl group, t-butyl group, pentyl group, hexyl group, cyclopentyl group, cyclohexyl group, etc.), alkoxyl group having 1 to 6 carbon atoms (e.g. ethoxy group, methoxy group, i-propoxy group, n-propoxy group, s-butoxy group, t-butoxy group, pentoxy group, hexyloxy group, cyclopentoxy group, cyclohexyloxy group, etc.), aryl group having 5 to 40 nuclear carbon atoms, amino group substituted with aryl group having 5 to 40 nuclear carbon atoms, ester group having 5 to 40 nuclear carbon atoms, ester group with alkyl group having 1 to 6 carbon atoms, cyano group, nitro group and halogen atom.

In the present invention, the anode in the organic EL device covers a role of injecting holes into a hole transport layer or a light emitting layer, and it is effective that the anode has a work function of 4.6 eV or greater. Specific examples of the material for the anode include indium tin oxide alloy (ITO), tin oxide (NESA), gold, silver, platinum, copper, etc. With regard to the cathode, its material preferably has a small work function with the aim of injecting electrons into an electron transport layer or into a light emitting layer. Although materials for the cathode of the organic EL device are not particularly specified, examples include indium, aluminum, magnesium, magnesium-indium alloy, magnesium-aluminum alloy, aluminum-lithium alloy, aluminum-scandium-lithium alloy, magnesium-silver alloy, etc.

The process for forming the layers in the, organic EL device of the present invention is not particularly limited. A conventional process such as the vacuum vapor deposition process and the spin coating process can be used. The organic thin film layer used in the organic EL device of the present invention can be formed in accordance with the vacuum vapor deposition process, the molecular beam epitaxy process (the MBE process) or, using a solution prepared by dissolving the compound represented by the foregoing general formulae (1) to (3) into a solvent, in accordance with a conventional coating process such as the dipping process, the spin coating process, the casting process, the bar coating process and the roller coating process.

The thickness of each layer in the organic thin film layer in the organic EL device of the present invention is not particularly limited. In general, an excessively thin layer tends to have defects such as pin holes, and an excessively thick layer requires a high applied voltage results in decreasing the efficiency. Therefore, a thickness within the range of several nanometers to 1 μm is preferable.

EXAMPLES

The present invention shall be explained below in further details with reference to examples.

Synthesis Example 1 (Synthesis of Compound (C5))

The route for synthesis of Compound (C5) is shown in the following.

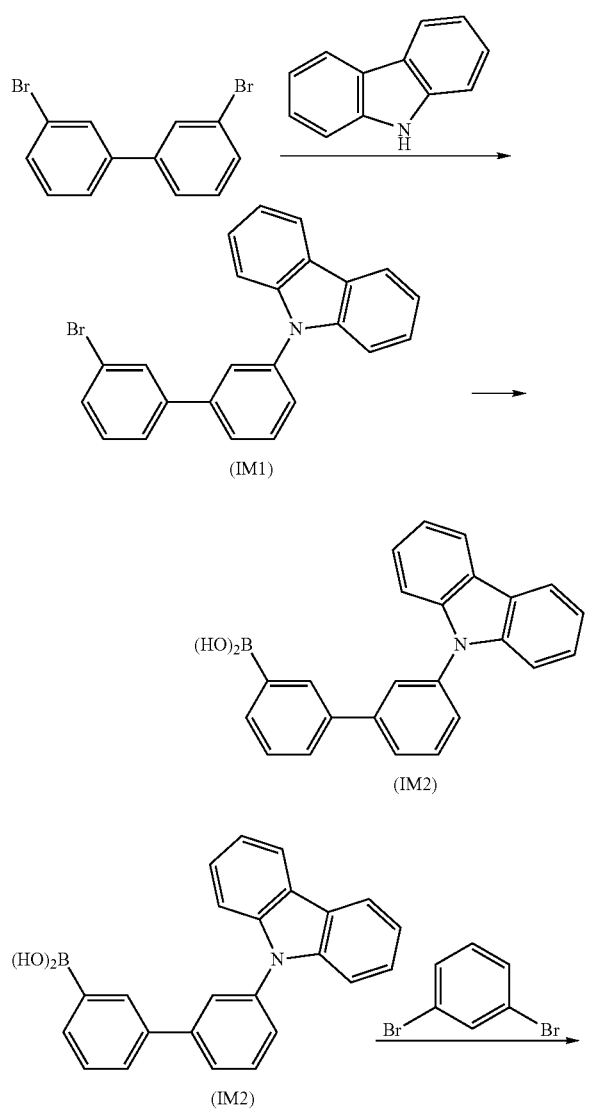

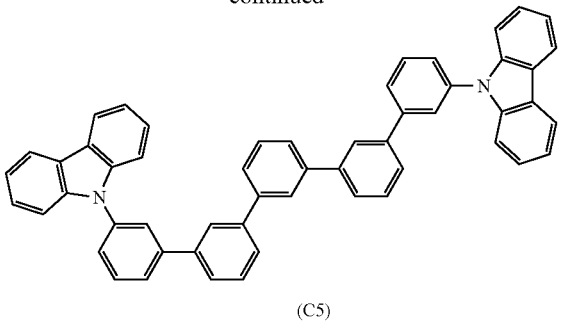

(1) Synthesis of Intermediate Compound (IM1)

Placing 3,3'-dibromobiphenyl in an amount of 50 g (160 mmol), carbazole in an amount of 18.4 g (110 mmol), copper iodide 3.0 g (16 mmol), potassium phosphate in an amount of 46.6 g (220 mmol), trans 1,2-cyclohexanediamine in an amount of 18.2 g (160 mmol) and 1,4-dioxane in an amount of 500 milliliter into a three neck flask having a capacity of 1 liter, the resultant solution was stirred under an atmosphere of argon gas at a temperature of 105° C. for 12 hours. Afterwards, cooling the reacted solution down to a room temperature and adding 160 milliliter of water, extractions were conducted with the use dichloro-methane for 3 times. After drying an organic layer with the use of unhydride magnesium sulfate, the solvent was concentrated under reduced pressure.

Treating residues in a silicagel column, dicarbazolyl substance, unreactant substance and so on were removed and purified resultantly obtaining 11.2 g of Intermediate Compound (IM1) (28 mmol; the yield: 25%). The result of the measurement about the resultant compound in accordance with Field Desorption Mass Spectrometry (FD-MS) is shown as the following:

FD-MS: calcd for $C_{24}H_{16}BrN=398$, found, m/z=399 (100), 397 (90)

(2) Synthesis of Intermediate Compound (IM2)

The Intermediate Compound (IM1) in an amount of 5.0 g (12.6 mmol) was dissolved into a mixed solvent of dehydrated toluene in an amount of 30 milliliter and dehydrated ether in an amount 30 milliliter among a three neck flask having a capacity of 200 milliliter, adding normal butyllithium hexane solution (1.6 M) in an amount of 10 milliliter (16 mmol) under an atmosphere of argon gas and at a temperature of −40° C., and the resultant solution was stirred at a temperature within a range of from −40° C. to 0° C. for 1 hour. Subsequently, the reaction solution was cooled down to −70° C., a solution obtained by diluting 8.7 milliliter (38 mmol) of triiodopropyl borate with 12 milliliter of ether was added dropwise spending 20 minutes and the resultant solution was stirred at −70° C. for 1 hour. Then, the temperature of the resultant solution was elevated up to a room temperature, followed by stirring the solution for 6 hours. Further, adding 35 milliliter of 5% hydrochloric acid, the resultant solution was stirred at a room temperature for 40 minutes. After the reaction fluid was separated into two layers, the organic layer was washed with a use of a saturated solution of sodium chloride and dried with anhydrous sodium sulfate. The organic solvent was removed by distillation under a reduced pressure until the amount of the organic solvent decreased to about one fifth of the original amount. The precipitated crystals were separated by filtration and washed with a use of a mixed solvent of toluene and n-hexane and n-hexane, successively, and 3.5 g (9.6 mmol; the yield: 76%) of Intermediate Compound (IM2) was obtained. The result of the measurement about the resultant compound in accordance with FD-MS is shown as the following:

FD-MS: calcd for $C_{24}H_{18}BNO_2$=363, found, m/z=363 ($M^+$, 100)

(3) Synthesis of Compound (C5))

Under the atmosphere of argon gas, metadibromobenzene in an amount of 1.0 g (4.2 mmol), Intermediate Compound (IM2) in an amount of 3.2 g (8.8 mmol), tetrakistriphenylphosphinepalladium 0 valence (Pd(PPh$_3$)$_4$) in an amount of 208 mg (0.18 mmol), dimethoxyethane in an amount of 100 milliliter and 10% by weight aqueous solution of sodium carbonate in an amount of 27 g (25 mmol) were placed into a three neck flask with a capacity of 200 milliliter, and the resultant solution was stirred at a temperature of 78° C. for 12 hours. After completion of the reaction, the solution was cooled down to a room temperature and precipitated solids were separated by filtration and were washed with a use of small amount of water, methanol and hexane (the yield: 3.4 g). Dissolving the filtrated solid into toluene, the resultant solution was separated and purified by means of a silicagel column resultantly obtaining 2.2 g of Compound (C5) (3.0 mmol; the yield: 74%). It was identified as the aimed compound in accordance with 90 MHz Nuclear Magnetic Resonance (NMR) and with Mass Analysis. The result of the measurement in accordance with FD-MS is shown as the following:

FD-MS: calcd for $C_{54}H_{96}N_2$-712, found, m/z=712 ($M^+$, 100)

Synthesis Example 2 (Synthesis of Compound (C8))

The route for synthesis of Compound (C8) is shown in the following.

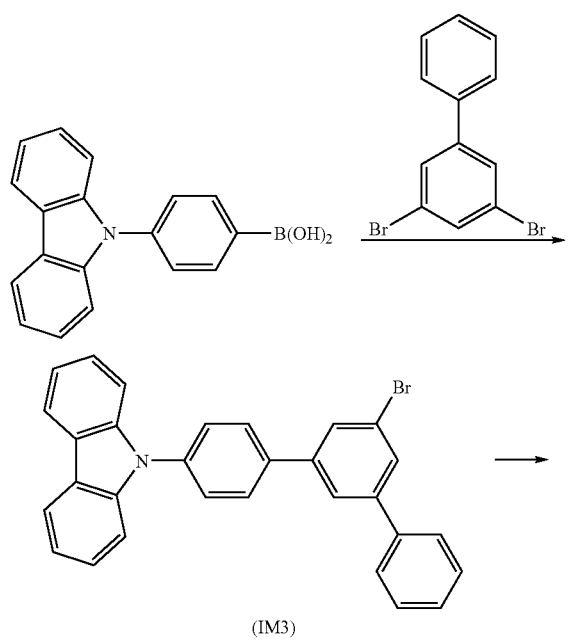

(IM3)

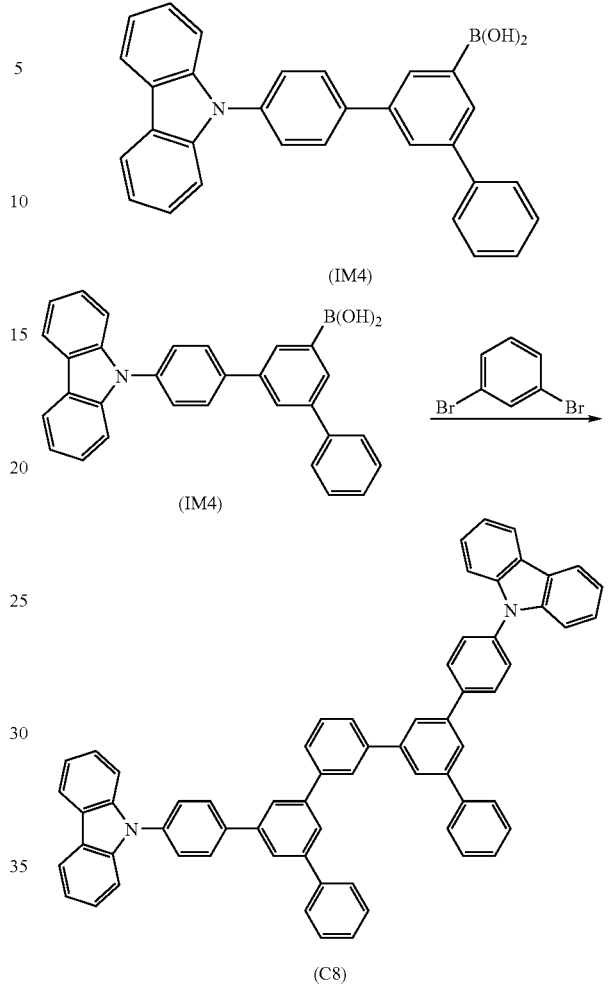

(C8)

Under the atmosphere of Argon gas, 3,5-dibromobiphenyl in an amount of 6.2 g (20 mmol), para-(carbazoly-9-yl) phenylboronic acid in an amount of 5.8 g (20 mmol), tetrakistriphenylphosphinepalladium 0 valence (Pd(PPh$_3$)$_4$) in an amount of 460 mg (0.4 mmol), dimethoxyethane in an amount of 100 milliliter and 10% by weight aqueous solution of sodium carbonate in an amount of 64 g (60 mmol) were placed into a three neck flask with a capacity of 200 milliliter, and the resultant solution was stirred at a temperature of 78° C. for 10 hours.

After completion of the reaction, the solution was cooled down to a room temperature and precipitated solids were separated by filtration. Adding toluene in an amount of 100 milliliter into the filtrate, an organic layer was washed by means of a separatory funnel with a use of water and a saturated solution of sodium chloride successively. The organic layer was dried with a use of sulfuric magnesium anhydride and was filtrated, followed by depressurized concentration, resultantly obtaining a brown viscous solid. The brown viscous solid was purified by means of silicagel column, and 5.2 g of Intermediate Compound (IM3) was obtained (11 mmol; the yield: 55%). The result of the measurement about the resultant compound in accordance with FD-MS is shown as the following:

FD-MS: calcd for $C_{30}H_{20}BrN$=474, found, m/z=475 (100), 473 (90)

(2) Synthesis of Intermediate Compound (IM4)

The Intermediate Compound (IM3) in an amount of 3.0 g (6.3 mmol) was dissolved into a mixed solvent of dehydrated toluene in an amount of 30 milliliter and dehydrated ether in an amount 30 milliliter among a three neck flask having a capacity of 200 milliliter, adding normal butyllithium hexane solution (1.6 M) in an amount of 4.3 milliliter (6.8 mmol) under an atmosphere of argon gas and at a temperature of −40° C., and the resultant solution was stirred at a temperature within a range of from −40° C. to 0° C. for 1 hour. Subsequently, the reaction solution was cooled down to −70° C., a solution obtained by diluting 4.2 milliliter (18 mmol) of tri-isopropyl borate with 6 milliliter of ether was added dropwise spending 20 minutes and the resultant solution was stirred at −70° C. for 1 hour. Then, the temperature of the resultant solution was elevated up to a room temperature, followed by stirring the solution for 6 hours. Further, adding 15 milliliter of 5% hydrochloric acid, the resultant solution was stirred at a room temperature for 30 minutes. After the reaction fluid was separated into two layers, the organic layer was washed with a use of a saturated solution of sodium chloride and dried with anhydrous sodium sulfate. The organic solvent was removed by distillation under a reduced pressure until the amount of the organic solvent decreased to about one fifth of the original amount. The precipitated crystals were separated by filtration and washed with a mixed solvent of toluene and n-hexane and n-hexane, successively, and 1.9 g (4.3 mmol; the yield: 69%) of Intermediate Compound (IM4) was obtained. The result of the measurement about the resultant compound in accordance with FD-MS is shown as the following:

FD-MS: calcd for $C_{30}H_{22}BNO_2$=439, founds m/z=439 (M⁺, 100)

(3) Synthesis of Compound (C8))

Under the atmosphere of argon gas, metadibromobenzene in an amount of 0.47 g (2.0 mmol), Intermediate Compound (IM4) in an amount of 1.8 g (4.1 mmol), tetrakistriphenylphosphinepalladium 0 valence (Pd(PPh₃)₄) in an amount of 104 mg (0.09 mmol), dimethoxyethane in an amount of 50 milliliter and 10% by weight aqueous solution of sodium carbonate in an amount of 14 g (12 mmol) were placed into a three neck flask with a capacity of 200 milliliter, and the resultant solution was stirred at a temperature of 78° C. for 12 hours. After completion of the reaction, the solution was cooled down to a room temperature and precipitated solids were separated by filtration and were washed with a use of small amount of water, methanol and hexane (the yield: 1.8 g). Dissolving the filtered solid into toluene, the resultant solution was separated and purified by means of a silicagel column resultantly obtaining 1.4 g of Compound (C8) (1.6 mmol, the yield: 81%). It was identified as the aimed compound in accordance with 90 MHz NMR and with Mass Analysis. The result of the measurement in accordance with FD-MS is shown as the following:

FD-MS: calcd for $C_{66}H_{44}N_2$=864, found, m/z=864 [M⁺, 100]

Synthesis Example 3 (Synthesis of Compound (C14))

The route for synthesis of Compound (C14) is shown in the following.

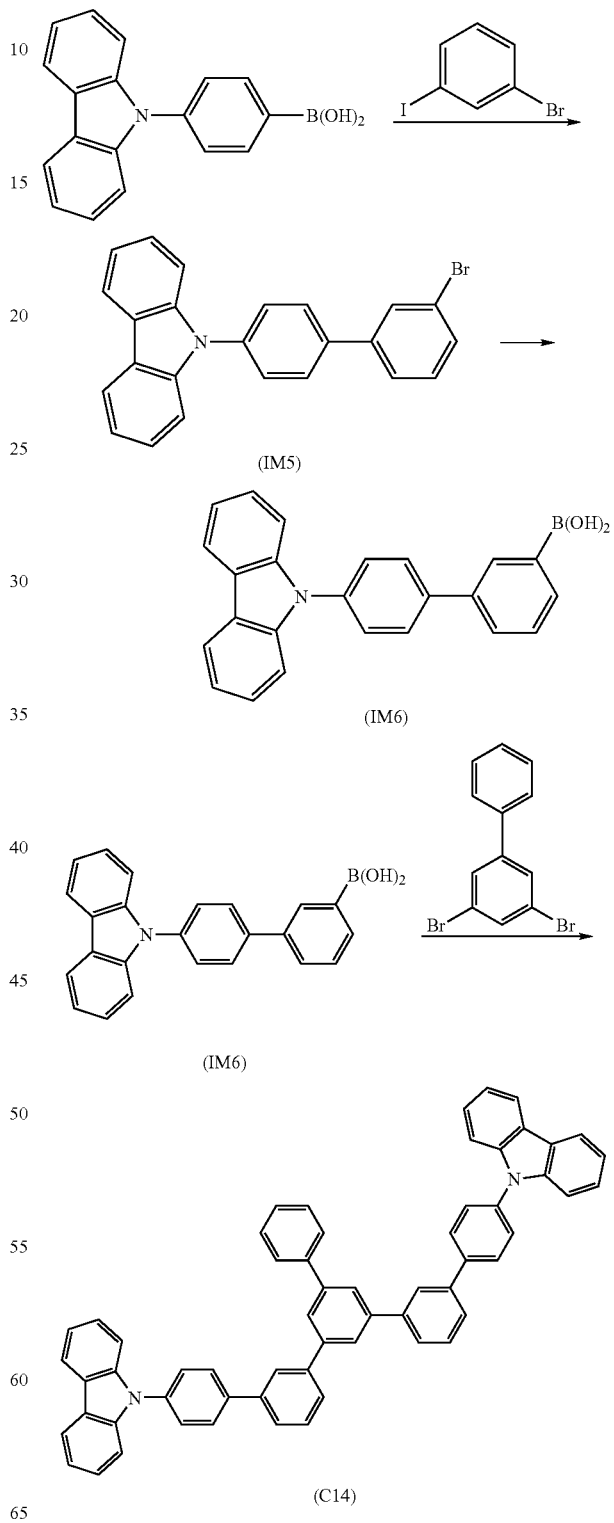

(1) Synthesis of Intermediate Compound (IM5)

Under the atmosphere of argon gas, 1-bromo-3-iodebenzene in an amount of 5.0 g (18 mmol), para-(carbazolyl-9-yl) phenylboronic acid in an amount of 5.2 g (18 mmol), tetrakistriphenylphosphinepalladium 0 valence (Pd(PPh$_3$)$_4$) in an amount of 414 mg (0.36 mmol), dimethoxyethane in an amount of 100 milliliter and 10% by weight aqueous solution of sodium carbonate in an amount of 58 g (54 mmol) were placed into a three neck flask with a capacity of 300 milliliter, and the resultant solution was stirred at a temperature of 80° C. for 12 hours. After completion of the reaction, the solution was cooled down to a room temperature and adding toluene in an amount of 100 milliliter into the filtrate, an organic layer was washed by means of a separatory funnel with a use of water and a saturated solution of sodium chloride successively. The organic layer was dried with a use of sulfuric magnesium anhydride and was filtrated, followed by depressurized concentration, resultantly obtaining yellowish brown solid. The yellowish brown solid was purified by means of silicagel column, and 5.1 g of Intermediate Compound (IM5) was obtained (13 mmol; the yield: 72%). The result of the measurement about the resultant compound in accordance with FD-MS is shown as the following:

FD-MS: calcd for $C_{24}H_{16}BrN=398$, found, m/z=399 (100), 397 (93)

(2) Synthesis of Intermediate Compound (IM6)

The Intermediate Compound (IM5) in an amount of 5.0 g (12.6 mmol) was dissolved into a mixed solvent of dehydrated toluene in an amount of 30 milliliter and dehydrated ether in an amount 30 milliliter among a three neck flask having a capacity of 200 milliliter, adding normal butyllithium hexane solution (1.6 M) in an amount of 10 milliliter (16 mmol) under an atmosphere of argon gas and at a temperature of −40° C., and the resultant solution was stirred at a temperature within a range of from −40° C. to 0° C. for 1 hour. Subsequently, the reaction solution was cooled down to −70° C., a solution obtained by diluting 8.7 milliliter (38 mmol) of triisopropyl borate with 12 milliliter of ether was added dropwise spending 20 minutes and the resultant solution was stirred at −70° C. for 1 hour. Then, the temperature of the resultant solution was elevated up to a room temperature, followed by stirring the solution for 6 hours. Further, adding 30 milliliter of 5% hydrochloric acid, the resultant solution was stirred at a room temperature for 40 minutes. After the reaction fluid was separated into two layers, the organic layer was washed with a use of a saturated solution of sodium chloride and dried with anhydrous sodium sulfate. The organic solvent was removed by distillation under a reduced pressure until the amount of the organic solvent decreased to about one fifth of the original amount. The formed crystals were separated by filtration and washed with a mixed solvent of toluene and n-hexane and n-hexane, successively, and 3.8 g (10 mmol; the yield: 79%) of Intermediate Compound (IM6) was obtained. The result of the measurement about the resultant compound in accordance with FD-MS is shown as the following:

FD-MS: calcd for $C_{24}H_{18}BNO_2=363$, found, m/z=363 (M$^+$, 100)

(3) Synthesis of Compound (C14))

Under the atmosphere of argon gas, 3,5-dibromobiphenyl in an amount of 1.7 g (5.4 mmol), Intermediate Compound (IM6) in an amount of 3.6 g (10 mmol), tetrakistriphenylphosphinepalladium 0 valence (Pd(PPh$_3$)$_4$) in an amount of 230 mg (0.2 mmol), dimethoxyethane in an amount of 60 milliliter and 10% by weight aqueous solution of sodium carbonate in an amount of 54 g (50 mmol) were placed into a three neck flask having a capacity of 200 milliliter, and the resultant solution was stirred at a temperature of 80° C. for 14 hours. After completion of the reaction, the solution was cooled down to a room temperature and precipitated crystals were separated by filtration. The resultant crystals were washed with a use of water, methanol and hexane successively thereby obtaining 3.9 g of crystals. Further, the resultant compound was heated and dissolved into toluene, left standing at a room temperature until re-crystallized, thereby obtaining 2.7 g of Compound (C14) (3.4 mmol; the yield: 63%). It was identified as the aimed compound in accordance with 90 MHz NMR and with Mass Analysis. The result of the measurement in accordance with FD-MS is shown as the following:

FD-MS: calcd for $C_{60}H_{40}N_2=788$, found, m/z=788 (M$^+$, 100)

Synthesis Example 4 (Synthesis of Compound (C22))

The route for synthesis of Compound (C22) is shown in the following.

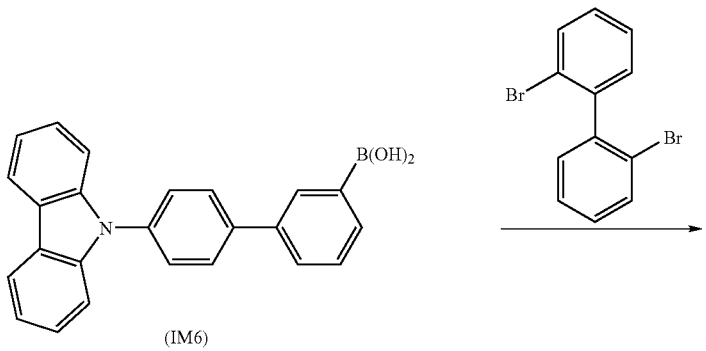

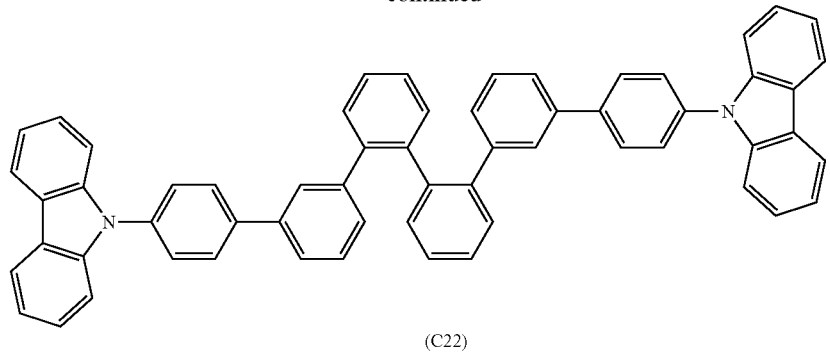

(C22)

Under the atmosphere of argon gas, 2,2-dibromobiphenyl in an amount of 1.5 g (4.8 mmol), Intermediate Compound (IM6) in an amount of 3.1 g (8.6 mmol), tetrakistriphenylphosphinepalladium 0 valence (Pd(PPh$_3$)$_4$) in an amount of 200 mg (0.17 mmol), dimethoxyethane in an amount of 60 milliliter and 10% by weight aqueous solution of sodium carbonate in an amount of 58 g (55 mmol) were placed into a three neck flask having a capacity of 200 milliliter, and the resultant solution was stirred at a temperature of 78° C. for 36 hours. After completion of the reaction, the solution was cooled down to a room temperature and precipitated crystals were separated by filtration. The resultant crystals were washed with a use of water, methanol and hexane successively thereby obtaining 2.8 g of crystals. Further, the resultant compound was heated and dissolved into toluene, left standing at a room temperature until re-crystallized, thereby obtaining 1.8 g of Compound (C22) (2.3 mmol; the yield: 48%). It was identified as the aimed compound in accordance with 90 MHz NMR and with Mass Analysis. The result of the measurement in accordance with FD-MS is shown as the following:

FD-MS: calcd for $C_{60}H_{40}N_2$=788, found, m/z=788 (M$^+$, 100)

Synthesis Example 5 (Synthesis of Compound (C66))

The route for synthesis of Compound (C66) is shown in the following.

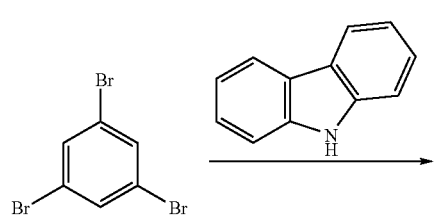

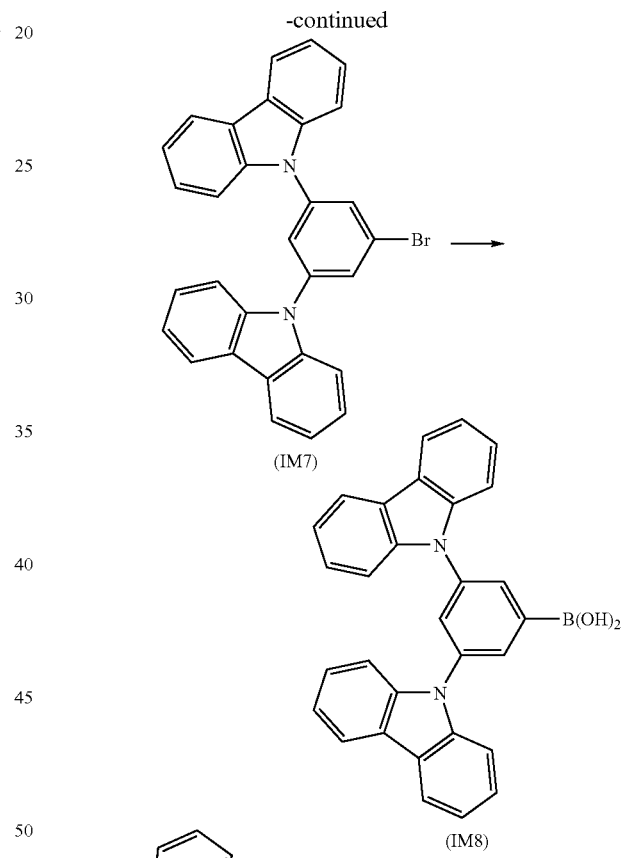

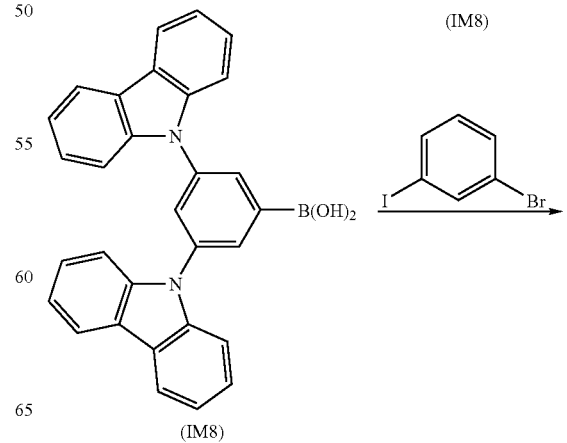

(IM8)

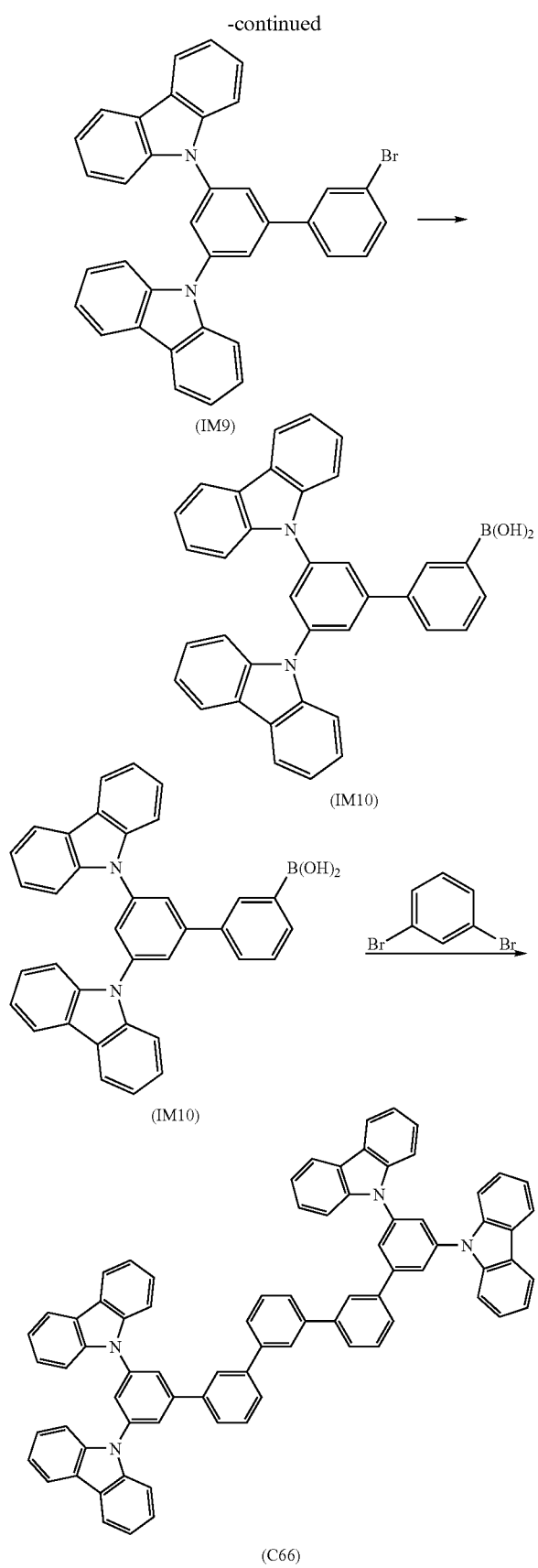

(1) Synthesis of Intermediate Compound (IM7)

Placing 1,3,5-tribromobenzene in an amount of 70 g (0.22 mol), carbazole in an amount of 73.6 g (0.44 mol), copper iodide 4.2 g (22 mmol), potassium phosphate in an amount of 187 g (0.88 mol), trans 1,2-cyclohexanediamine in an amount of 25 g (0.22 mol) and 1,4-dioxane in an amount of 700 milliliter into a three neck flask having a capacity of 2 liter, the resultant solution was stirred under an atmosphere of argon gas at a temperature of 104° C. for 16 hours. Afterwards, the solution was cooled down to a room temperature and adding water in an amount of 600 milliliter, extracted with a use of methylene, an organic layer was washed with a use of water. The organic layer was dried with a use of sulfuric magnesium anhydride and was filtrated, followed by depressurized concentration until it became to slurry state. The resultant solid was filtered and the filtrate was further concentrated under reduced pressure. Dissolving the residues into 300 milliliter of toluene, the resultant solution was purified by means of a silicagel column resultantly obtaining 22 g of Intermediate Compound (IM7) (45 mmol; the yield: 20%). The result of the measurement about the resultant compound in accordance with FD-MS is shown as the following:

FD-MS: calcd for $C_{30}H_{19}BrN_2$=487, found, m/z=488 (100), 486 (95)

(2) Synthesis of Compound (IM8))

Under the atmosphere of argon gas, Intermediate Compound (IM7) in an amount of 9.0 g (18 mmol), dehydrated toluene in an amount of 100 milliliter and dehydration diethyl ether in an amount of 100 milliliter were placed into a three neck flask having a capacity of 300 milliliter, and the resultant solution was cooled down to a temperature of −10° C. while stirring. Normal butyllithium (1.6M hexane solution) in an amount of 14.8 milliliter (23 mmol) was dripped into the resultant solution spending 10 minutes. After stirring the resultant solution for 2 hours, a solution obtained by diluting 10.4 g (56 mmol) of triisopropyl borate with 25 milliliter of ether was added dropwise spending 20 minutes and the resultant solution was stirred at a room temperature for 8 hours. Then, the solution was cooled down to 0° C., and a dilute hydrochloric acid prepared by diluting 4 milliliter of concentrated hydrochloric acid with 100 milliliter of water was added to make the solution acidic. The solution was separated into two layers by means of a separatory funnel and then, an organic layer was washed with a use of water and a saturated solution of sodium chloride each in an amount of 100 milliliter successively. The organic layer was separated again and dried with a use of sulfuric magnesium anhydride. The solution was depressingly concentrated after filtration and then, the resultant viscous solid was dissolved into 30 milliliter of tetrahydrofuran (THF), and adding 100 milliliter of hexane, precipitated crystals were filtered under reduced pressure. The filtrate was further concentrated and the resultant viscous substance was dissolved into THF and after adding hexane, the same operation as the above description was carried out resultantly obtaining totally 5.9 g of Intermediate Compound (IM8) (13 mmol; the yield: 71%). The result of the measurement about the resultant compound in accordance with FD-MS is shown as the following:

FD-MS: calcd for $C_{30}H_{21}BN_2O_2$=452, found, m/z=452 (100)

(3) Synthesis of Intermediate Compound (IM9)

Under the atmosphere of argon gas, 1-bromo-3-iodebenzene in an amount of 5.0 g (18 mmol), Intermediate Compound (IM8) in an amount of 8.1 g (18 mmol), tetrakistriphenylphosphinepalladium 0 valence (Pd(PPh$_3$)$_4$) in an amount of 414 mg (0.36 mmol), dimethoxyethane in an amount of 100 milliliter and 10% by weight aqueous solution of sodium carbonate in an amount of 58 g (54 mmol) were placed into a three neck flask with a capacity of 300 milliliter, and the resultant solution was stirred at a temperature of 80° C. for 10 hours. After completion of the reaction, the solution was cooled down to a room temperature and adding toluene in an amount of 100 milliliter into the filtrate, an organic layer was washed by means of a separatory funnel with a use of water and a saturated solution of sodium chloride successively. The organic layer was dried with a use of sulfuric magnesium anhydride and was filtrated, followed by depressurized concentration, resultantly obtaining yellowish brown solid. The yellowish brown solid was purified by means of silicagel column, and 9.2 g of Intermediate Compound (IM9) was obtained (16 mmol; the yield: 88%). The result of the measurement about the resultant compound in accordance with FD-MS is shown as the following:

FD-MS: calcd for $C_{37}H_{27}BrN_2$=579, found, m/z=580 (100), 578 (90)

(4) Synthesis of Intermediate Compound (IM10)

Under the atmosphere of argon gas, Intermediate Compound (IM9) in an amount of 6.0 g (10 mmol), dehydrated toluene in an amount of 70 milliliter and dehydrated diethyl ether in an amount of 70 milliliter were placed into a three neck flask having a capacity of 300 milliliter, and the resultant solution was cooled down to a temperature of −10° C. while stirring. Normal butyllithium (1.6M hexane solution) in an amount of 7.5 milliliter (12 mmol) was dripped into the resultant solution spending 10 minutes. After stirring the resultant solution for 2 hours, a solution obtained by diluting 5.6 g (30 mmol) of triisopropyl borate with 20 milliliter of ether was added dropwise spending 10 minutes and the resultant solution was stirred at a room temperature for 6 hours. Then, the solution was cooled down to 0° C., and a dilute hydrochloric acid prepared by diluting 4 milliliter of concentrated hydrochloric acid with 100 milliliter of water was added to make the solution acidic. The solution was separated into two layers by means of a separatory funnel and then, an organic layer was washed with a use of water and a saturated solution of sodium chloride each in an amount of 70 milliliter successively. The organic layer was separated again and dried with a use of sulfuric magnesium anhydride. The solution was depressingly concentrated after filtration and then, the resultant viscous solid was dissolved into 20 milliliter of THF, and adding 70 milliliter of hexane, precipitated crystals were filtered under reduced pressure. The filtrate was further concentrated and the resultant viscous substance was dissolved into THF and after adding hexane, the same operation as the above description was carried out resultantly obtaining totally 4.1 g of Intermediate Compound (IM10) (7.5 mmol; the yield: 75%). The result of the measurement about the resultant compound in accordance with FD-MS is shown as the following:

FD-MS: calcd for $C_{37}H_{29}BN_2O_2$=544, found, m/z=544 (100)

(5) Synthesis of Compound (C66))

Under the atmosphere of argon gas, 1,3-dibromobenzene in an amount of 640 mg (2.7 mmol), Intermediate Compound (IM6) in an amount of 3.0 g (5.5 mmol), tetrakistriphenylphosphinepalladium 0 valence (Pd(PPh$_3$)$_4$) in an amount of 127 mg (0.11 mmol), dimethoxyethane in an amount of 50 milliliter and 10% by weight aqueous solution of sodium carbonate in an amount of 17 g (16 mmol) were placed into a three neck flask with a capacity of 200 milliliter, and the resultant solution was stirred at a temperature of 80° C. for 14 hours. After completion of the reaction, the solution was cooled down to a room temperature and precipitated crystal was separated by filtration. The resultant crystals were washed with a use of a water, methanol and hexane successively thereby obtaining 2.5 g of crystals. Further, the resultant compound was heated and dissolved into toluene, left standing at a room temperature until re-crystallized, thereby obtaining 2.0 g of Compound (C66) (1.9 mmol; the yield: 71%). It was identified as the aimed compound in accordance with 90 MHz NMR and with Mass Analysis. The result of the measurement in accordance with FD-MS is shown as the following:

FD-MS: calcd for $C_{78}H_{50}N_4$=1042, found, m/z=1042 (M$^+$, 100), 1043 (80)

Synthesis Example 6 (Synthesis of Compound (C26))

The route for synthesis of Compound (C26) is shown in the following.

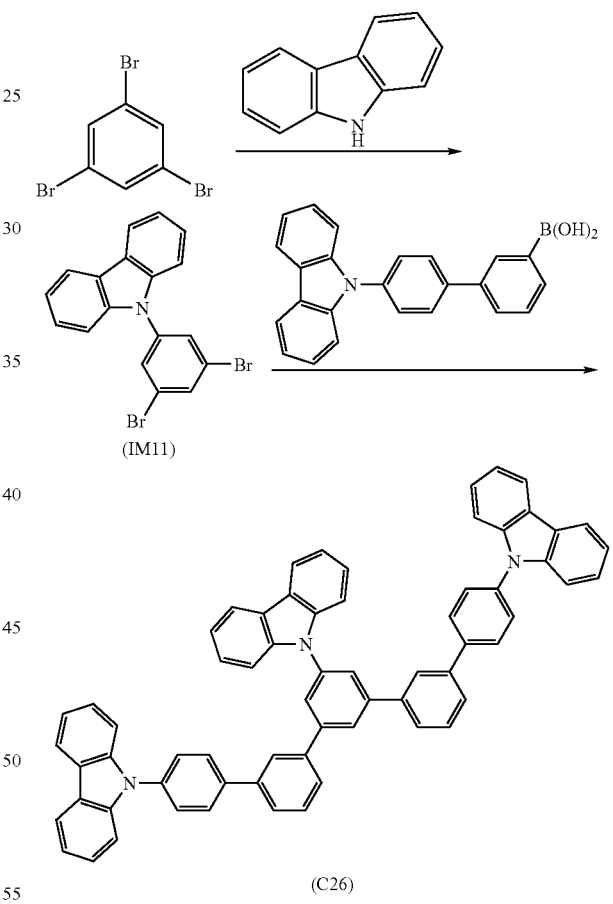

(1) Synthesis of Intermediate Compound (IM11)

Under the atmosphere of argon gas, 1,3,5-tribromobenzene in an amount of 30 g (94 mmol), carbazole in an amount of 18.8 g (60 mmol), copper iodide 0.6 g (3 mmol), potassium phosphate in an amount of 25.5 g (120 mol), trans-1,2-cyclohexanediamine in an amount of 3.4 g (30 mmol) and 1,4-dioxane in an amount of 200 milliliter were placed into a three neck flask having a capacity of 500 milliliter, and the resultant solution was refluxed under heating for 16 hours while stirring at a temperature of 105° C. Afterwards, the solution was cooled down to a room temperature and adding water in an amount of 150 milliliter, extracted with a use of methylene chloride, an organic layer was washed with a use of a water. The organic layer was dried with a use of sulfuric magnesium anhydride and was filtered, followed by depressurized concentration until it became to slurry state. The resultant solid was filtered and the filtrate was further concentrated under reduced pressure. Dissolving the residues into toluene, the resultant solution was purified by means of a silicagel column resultantly obtaining 17 g of Intermediate Compound (IM11) (42 mmol; the yield: 71%). The result of the measurement about the resultant compound in accordance with FD-MS is shown as the following:

FD-MS: calcd for $C_{18}H_{11}Br_2N$=401, found, m/z=401 (M+, 100)

(2) Synthesis of Compound (C26))

Under the atmosphere of argon gas, Intermediate Compound (IM11) in an amount of 1.2 g (3.0 mmol), Intermediate Compound (IM6) in an amount of 2.6 g (6 mmol), tetrakistriphenylphosphinepalladium 0 valence (Pd(PPh₃)₄) in an amount of 173 mg (0.15 mmol), dimethoxyethane in an amount of 40 milliliter and 10% by weight aqueous solution of sodium carbonate in an amount of 20 g (18 mmol) were placed into a three neck flask having a capacity of 100 milliliter, and the resultant solution was stirred at a temperature of 80° C. for 13 hours. After completion of the reaction, the solution was cooled down to a room temperature and precipitated crystals were separated by filtration. The resultant crystals were washed with a use of a water, methanol and hexane successively thereby obtaining 1.9 g of crystals. Further, the resultant compound was heated and dissolved into toluene, left standing at a room temperature until re-crystallized, thereby obtaining 1.4 g of Compound (C26) (1.6 mmol; the yield: 53%). It was identified as the aimed compound in accordance with 90 MHz NMR and with Mass Analysis. The result of the measurement in accordance with FD-MS is shown as the following:

FD-MS: calcd for $C_{66}H_{43}N_3$=877, found, m/z=877 (M+, 100)

Synthesis Example 7 (Synthesis of Compound (C33))

The route for synthesis of Compound (C33) is shown in the following.

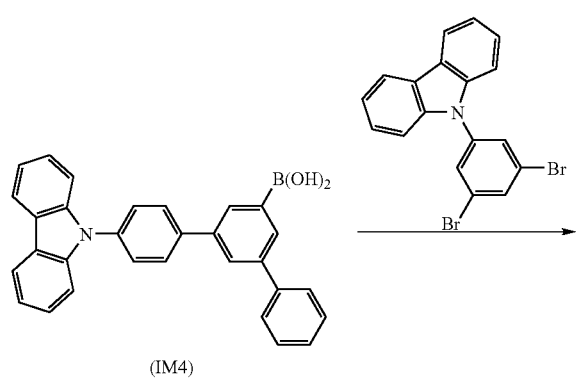

(IM4)

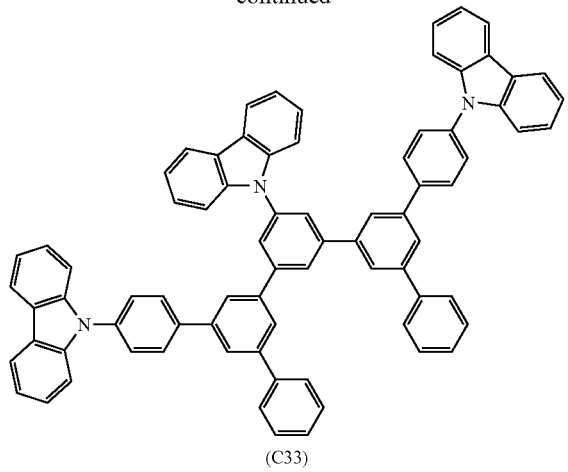

(C33)

Under the atmosphere of argon gas, Intermediate Compound (IM11) in an amount of 1.2 g (3.0 mmol), Intermediate Compound (IM4) in an amount of 2.6 g (6 mmol), tetrakistriphenylphosphinepalladium 0 valence Pd(PPh₃)₄) in an amount of 172 mg (0.15 mmol), dimethoxyethane in an amount of 40 milliliter and 10% by weight aqueous solution of sodium carbonate in an amount of 20 g (18 mmol) were placed into a three neck flask having a capacity of 100 milliliter, and the resultant solution was stirred at a temperature of 80° C. for 16 hours. After completion of the reaction, the solution was cooled down to a room temperature and precipitated crystals were separated by filtration. The resultant crystals were washed with a use of a water, methanol and hexane successively thereby obtaining 2.7 g of crystals. Further, the resultant compound was heated and dissolved into toluene, left standing at a room temperature until re-crystallized, thereby obtaining 2.1 g of Compound (C33) (2.0 mmol; the yield: 68%). It was identified as the aimed compound in accordance with 90 MHz NMR and with Mass Analysis. The result of the measurement in accordance with FD-MS is shown as the following:

FD-MS: calcd for $C_{78}H_{51}N_3$=1029, found, m/z=1029 (M+, 100)

Synthesis Example 8 (Synthesis of Compound (C57))

The route for synthesis of Compound (C57) is shown in the following.

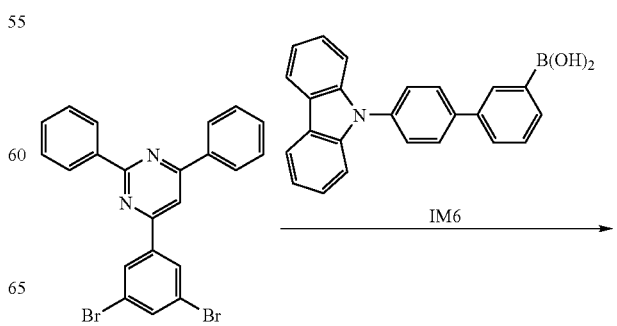

IM6

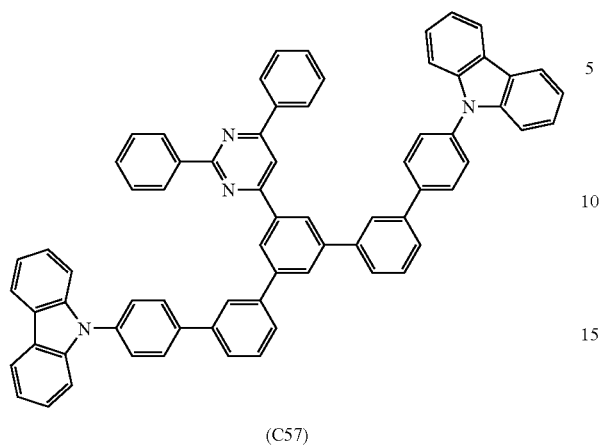

(C57)

Under the atmosphere of argon gas, Intermediate Compound (IM6) in an amount of 2.0 g (5.4 mmol), 2,6-diphenyl-4-(3,5-dibromo phenyl)-pyrimidine in an amount of 1.2 g (2.6 mmol), tetrakistriphenylphosphinepalladium 0 valence (Pd (PPh$_3$)$_4$) in an amount of 150 mg (0.13 mmol), dimethoxyethane in an amount of 40 milliliter and 10% by weight aqueous solution of sodium carbonate in an amount of 17 g (16 mmol) were placed into a three neck flask having a capacity of 100 milliliter, and the resultant solution was stirred at a temperature of 80° C. for 16 hours. After completion of the reaction, the solution was cooled down to a room temperature and precipitated crystals were separated by filtration. The resultant crystals were washed with a use of a water, methanol and hexane successively thereby obtaining 2.0 g of crystals. Further, the resultant compound was heated and dissolved into toluene, left standing at a room temperature until recrystallized, thereby obtaining 1.5 g of Compound (C57) (1.6 mmol; the yield: 61%). It was identified as the aimed compound in accordance with 90 MHz NMR and with Mass Analysis. The result of the measurement in accordance with FD-MS is shown as the following:

FD-MS: calcd for C$_{70}$H$_{46}$N$_4$=942, found, m/z=942 (M$^+$, 100)

Synthesis Example 9 (Synthesis of Compound (C5)')

The route for synthesis of Compound (C5)' is shown in the following.

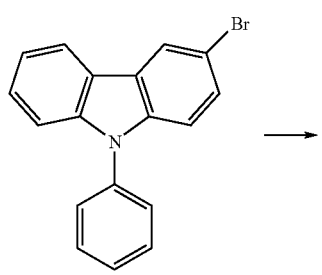

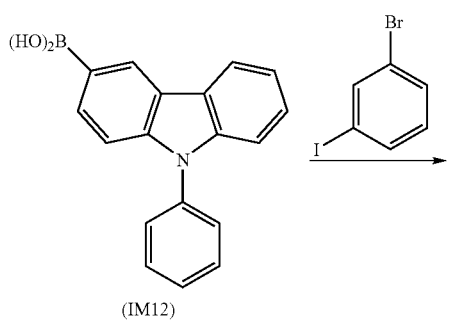

(IM12)

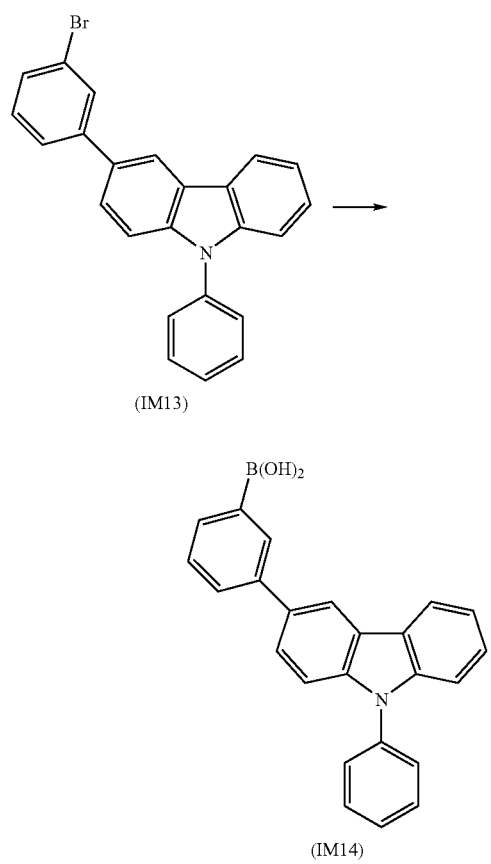

(IM13)

(IM14)

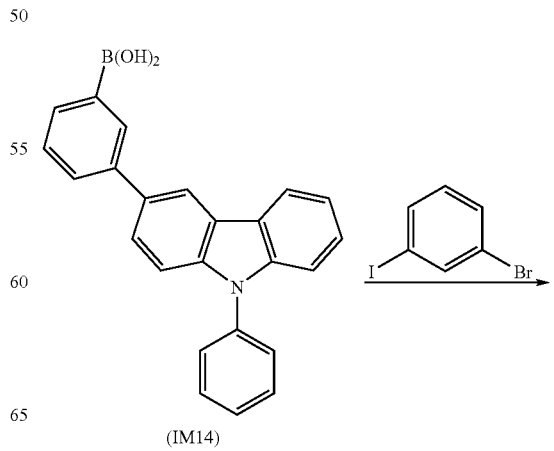

(IM14)

-continued

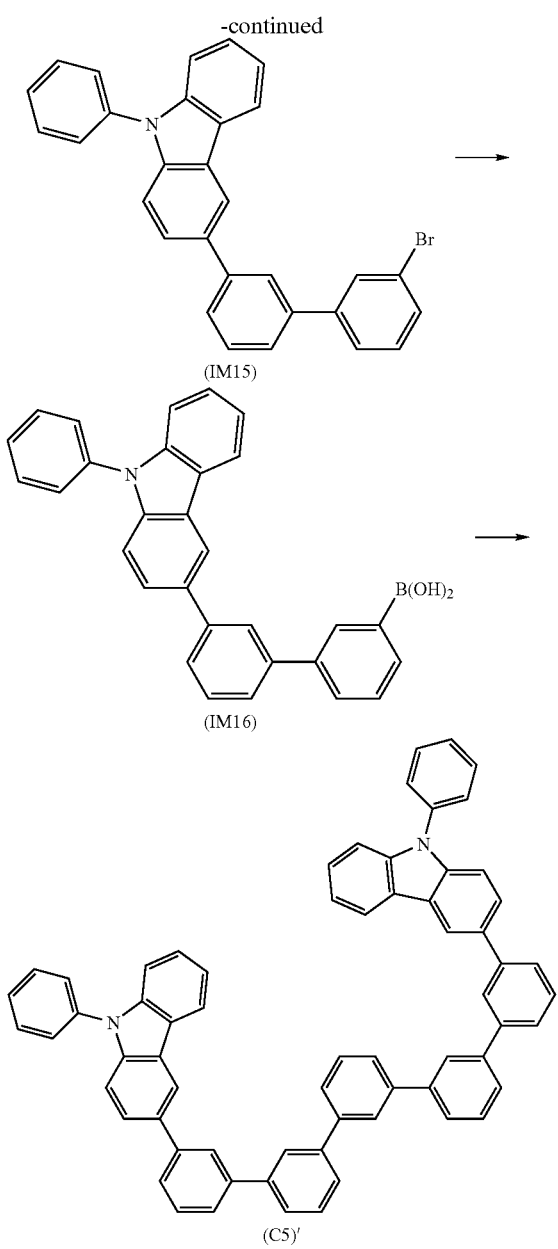

(IM15)

(IM16)

(C5)'

(1) Synthesis of Intermediate Compound (IM12)

Under the atmosphere of argon gas, 3-bromo-9-phenylcarbazole in an amount of 25 g (78 mmol), dehydrated toluene in an amount of 250 milliliter and dehydrated diethyl ether in an amount of 250 milliliter were placed into a three neck flask having a capacity of 1 liter, and the resultant solution was cooled down to a temperature of −20° C. while stirring. Normal butyllithium (1.6M hexane solution) in an amount of 50 milliliter (80 mmol) was dripped into the resultant solution spending 20 minutes. After stirring the resultant solution for 2 hours, a solution obtained by diluting 44 g (234 mmol) of triisopropyl borate with 50 milliliter of ether was added dropwise spending 20 minutes and the resultant solution was heated up to a room temperature, followed by stirring for 6 hours. Then, the solution was cooled down to 0° C., and a dilute hydrochloric acid prepared by diluting 10 milliliter of concentrated hydrochloric acid with 200 milliliter of water was added to make the solution acidic. The solution was separated into two layers by means of a separatory funnel and then, an organic layer was washed with a use of water and a saturated solution of sodium chloride each in an amount of 200 milliliter successively. The organic layer was separated again and dried with a use of sulfuric magnesium anhydride. The solution was depressingly concentrated after filtration and then, the resultant viscous solid was once dissolved into THF, and adding hexane for precipitation, precipitated crystals were filtered under reduced pressure. Further concentrating the filtrate, the same operation as the above description was carried out, totally 16 g of Intermediate Compound (IM12) was obtained (56 mmol; the yield: 71%). The result of the measurement about the resultant compound in accordance with FD-MS is shown as the following:

FD-MS: calcd for $C_{18}H_{14}BNO_2$=414, found, m/z=414 (100)

(2) Synthesis of Intermediate Compound (IM13)

Under the atmosphere of argon gas, 1-bromo-3-iodebenzene in an amount of 8.5 g (30 mmol), Intermediate Compound (IM12) in an amount of 12 g (29 mmol), tetrakistriphenylphosphinepalladium 0 valence (Pd(PPh$_3$)$_4$) in an amount of 1.7 g (1.45 mmol), dimethoxyethane in an amount of 300 milliliter and 10% by weight aqueous solution of sodium carbonate in an amount of 96 g (90 mmol) were placed into a three neck flask with a capacity of 1 liter, and the resultant solution was stirred at a temperature of 80° C. for 12 hours. After completion of the reaction, the solution was cooled down to a room temperature and adding toluene in an amount of 250 milliliter into the filtrate, an organic layer was separate into two layers by means of a separatory funnel, and was washed with a use of water and a saturated solution of sodium chloride successively. The organic layer was dried with a use of sulfuric magnesium anhydride and was filtered, followed by depressurized concentration, resultantly obtaining dark brown viscous solid. The dark brown viscous solid was purified by means of silicagel column, and 9.7 g of Intermediate Compound (IM13) was obtained (24 mmol the yield: 84%). The result of the measurement about the resultant compound in accordance with FD-MS is shown as the following:

FD-MS: calcd for $C_{24}H_{16}BrN$=398, found, m/z=399 (100), 397 (90)

(3) Synthesis of Intermediate Compound (IM14)

The Intermediate Compound (IM13) in an amount of 9.0 g (22.7 mmol) was dissolved into a mixed solvent of dehydrated toluene in an amount of 60 milliliter and dehydrated ether in an amount 60 milliliter among a three neck flask having a capacity of 500 milliliter, adding normal butyllithium hexane solution (1.6 M) in an amount of 18 milliliter (29 mmol) under an atmosphere of argon gas and at a temperature of −20° C., and the resultant solution was stirred at a temperature within a range of from −20° C. to 0° C. for 2 hours. Subsequently, the reaction solution was cooled down to −40° C., a solution obtained by diluting 15.7 milliliter (68 mmol) of triisopropyl borate with 20 milliliter of ether was added dropwise spending 20 minutes and the resultant solution was stirred at −40° C. for 1 hour. Then, the temperature of the resultant solution was elevated up to a room temperature, followed by stirring the solution for 8 hours. Furthermore, adding 4% hydrochloric acid to the solution, the resultant solution was and stirred at a room temperature for 20 minutes. After the reaction fluid was separated into two layers, the organic layer was washed with a use of a saturated solution of sodium chloride and dried with anhydrous sodium sulfate. The organic solvent was removed by distillation under a reduced pressure until the amount of the organic solvent decreased to about one fifth of the original amount. The formed crystals were separated by filtration and washed with a mixed solvent of toluene and n-hexane and n-hexane, successively, and 6.4 g (17.6 mmol; the yield: 78%) of Intermediate Compound (IM14) was obtained. The result of the measurement about the resultant compound in accordance with FD-MS is shown as the following:

FD-MS: calcd for $C_{24}H_{18}BNO_2$=363, found, m/z=363 ($M^+$, 100)

(4) Synthesis of Intermediate Compound (IM15)

Under the atmosphere of argon gas, 1-bromo-3-iodebenzene in an amount of 5.1 g (18 mmol), Intermediate Compound (IM14) in an amount of 6.2 g (17 mmol), tetrakistriphenylphosphinepalladium 0 valence ($Pd(PPh_3)_4$) in an amount of 980 mg (0.85 mmol), dimethoxyethane in an amount of 150 milliliter and 10% by weight aqueous solution of sodium carbonate in an amount of 54 g (51 mmol) were placed into a three neck flask with a capacity of 1 liter, and the resultant solution was stirred at a temperature of 80° C. for 14 hours. After completion of the reaction, the solution was cooled down to a room temperature and adding toluene in an amount of 150 milliliter into the filtrate, an organic layer was separate into two layers by means of a separatory funnel and was washed with a use of water and a saturated solution of sodium chloride successively. The organic layer was dried with a use of sulfuric magnesium anhydride and was filtered, followed by depressurized concentration, resultantly obtaining a dark brown viscous solid. The dark brown viscous solid was purified by means of silicagel column, and 4.1 g of Intermediate Compound (IM15) was obtained (8.6 mmol; the yield: 51%). The result of the measurement about the resultant compound in accordance with FD-MS is shown as the following:

FD-MS: calcd for $C_{30}H_{20}BrN$=474, found, m/z=474 (100)

(5) Synthesis of Intermediate Compound (IM16)

The Intermediate Compound (IM15) in an amount of 4.0 g (8.4 mmol) was dissolved into a mixed solvent of dehydrated toluene in an amount of 45 milliliter and dehydrated ether in an amount 45 milliliter among a three neck flask having a capacity of 200 milliliter, adding normal butyllithium hexane solution (1.6 M) in an amount of 5.6 milliliter (9.0 mmol) under an atmosphere of argon gas and at a temperature of −20° C., and the resultant solution was stirred at a temperature within a range of from −20° C. to 0° C. for 1 hour. Subsequently, the reaction solution was cooled down to −20° C., a solution obtained by diluting 5.5 milliliter (24 mmol) of triisopropyl borate with 10 milliliter of ether was added dropwise spending 20 minutes and the resultant solution was stirred at −20° C. for 1 hour. Then, the temperature of the resultant solution was elevated up to a room temperature, followed by stirring the solution for 8 hours. Furthermore, adding 4% hydrochloric acid to the solution, the resultant solution was and stirred at a room temperature for 40 minutes. After the reaction fluid was separated into two layers, the organic layer was washed with a use of a saturated solution of sodium chloride and dried with anhydrous sodium sulfate. The organic solvent was removed by distillation under a reduced pressure until the amount of the organic solvent decreased to about one fifth of the original amount. The formed crystals were separated by filtration and washed with a mixed solvent of toluene and n-hexane and n-hexane, successively, and 2.4 g (6.5 mmol; the yield: 65%) of Intermediate Compound (IM16) was obtained. The result of the measurement about the resultant compound in accordance with FD-MS is shown as the following:

FD-MS: calcd for $C_{30}H_{22}BNO_2$=439, found, m/z=439 ($M^+$, 100)

(6) Synthesis of Compound (C5)'

Under the atmosphere of argon gas, metadibromobenzene in an amount of 640 mg (2.7 mmol), Intermediate Compound (IM16) in an amount of 2.4 g (5.5 mmol), tetrakistriphenylphosphinepalladium 0 valence ($Pd(PPh_3)_4$) in an amount of 318 mg (0.28 mmol), dimethoxyethane in an amount of 120 milliliter and 10% by weight aqueous solution of sodium carbonate in an amount of 17 g (16.5 mmol) were placed into a three neck flask with a capacity of 200 milliliter, and the resultant solution was stirred at a temperature of 78° C. for 16 hours. After completion of the reaction, the solution was cooled down to a room temperature and precipitated solids were separated by filtration and were washed with a use of small amount of water, methanol and hexane. Dissolving the filtrated solid into toluene, the resultant solution was separated and purified by means of a silicagel column resultantly obtaining 1.9 g of Compound (C5) (2.2 mmol; the yield: 81%). It was identified as the aimed compound in accordance with 90 MHz NMR and with Mass Analysis. The result of the measurement in accordance with FD-MS is shown as the following:

FD-MS: calcd for $C_{66}H_{44}N_2$=864, found, m/z=864 ($M^+$, 100)

Example 1

Fabrication of an Organic EL Device: Green Light Emission

A glass substrate of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode which had been cleaned was attached to a substrate holder of a vacuum vapor deposition apparatus. On the surface of the cleaned substrate at the side having the transparent electrode, a film of TPD232 having a thickness of 60 nm was formed so that the formed film covered the transparent electrode. The formed film of TPD232 worked as the hole injecting layer. Then, on the formed film of TPD232, a film of TBDB below having a thickness of 30 nm was formed. The formed film of TBDB worked as the hole transporting layer. On the formed film of TBDB, a film having a thickness of 30 nm of the foregoing Compound (C5) as a host material was vapor deposited to form a light emitting layer. Simultaneously, the-above metal complex Compound (K-13) was added as a phosphorus photoluminescent Ir metal complex dopant. A concentration of Compound (K-13) in the light emitting layer was 5% by weight. The formed film worked as a light emitting layer. On the film formed above, a film of the foregoing Compound (A-7) having a thickness 10 nm was formed. The formed film of (A-7) worked as the hole barrier layer. On the film formed above, a film of 8-hydroxyquinoline aluminum complex (Alq) below having a thickness of 40 nm was formed. The film of Alq worked as the electron injecting layer. Subsequently, lithium fluoride being alkali metal halide was vapor deposited up to 0.2 nm in thickness and then, aluminum was vapor deposited up to 150 nm in thickness. The Al/LiF worked as a cathode. An organic EL device was fabricated in the manner described above.

The device fabricated above was examined by feeding electric current. Green light was emitted at a luminance of 102 cd/m² under a voltage of 5.5 V and a current density of 0.23 mA/cm². The CIE chromaticity coordinates were (0.30, 0.63), and the current efficiency was 44.3 cd/A. Further, as a result of subjecting the device to a continuous test by feeding a constant electric current starting at an initial luminance of 5000 cd/m², it was confirmed that the half lifetime that the luminance reduced to the half value: 2500 cd/m² was 821 hours. The results are shown in Table 1.

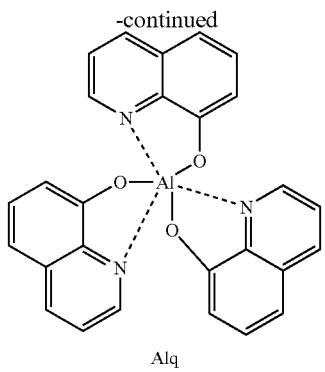

Alq

Examples 2 to 8

Fabrication of Organic EL Devices: Green Light Emission

Organic EL devices were fabricated in accordance with the same procedures as those conducted in Example 1 except that compounds shown in Table 1 were used in place of Compound (C5), and the voltage, the current density, the luminance, the current efficiency, the chromaticity and the half lifetime of the luminance were measured in accordance with the same methods as those conducted in Example 1. The results are shown in Table 1.

Comparative Example 1

An organic EL device was fabricated in accordance with the same procedure as conducted in Example 1 except that a publicly known compound (CBP) below were used in place of Compound (C5), and the voltage, the current density, the luminance, the current efficiency, the chromaticity and the half lifetime of the luminance were measured in accordance with the same methods as those conducted in Example 1. The results are shown in Table 1.

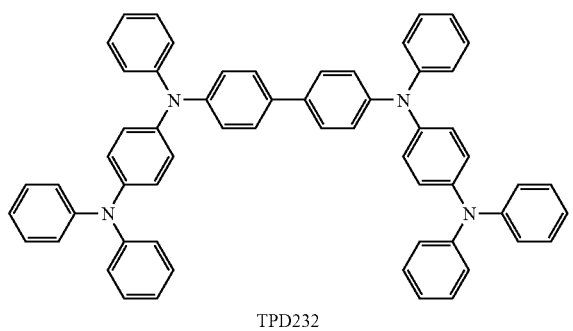

TPD232

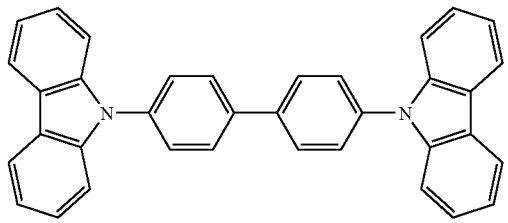

CBP

Comparative Example 2

An organic EL device was fabricated in accordance with the same procedure as conducted in Example 1 except that a publicly known compound (CMTTP) below were used in place of Compound (C5), and the voltage, the current density, the luminance, the current efficiency, the chromaticity and the half lifetime of the luminance were measured in accordance with the same methods as those conducted in Example 1. The results are shown in Table 1.

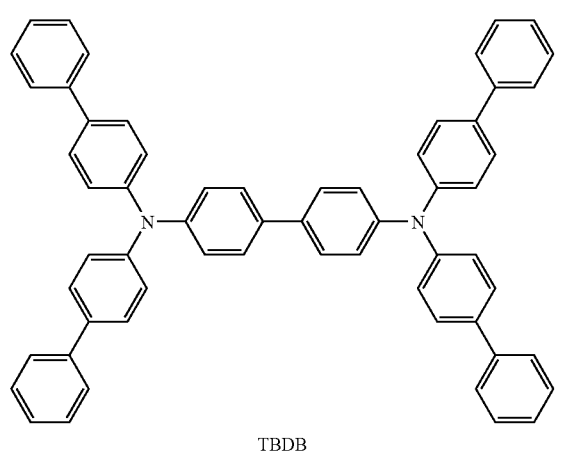

TBDB

TABLE 1

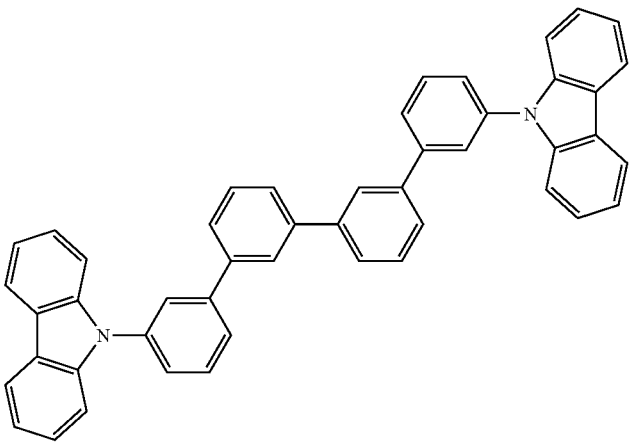

CMTTP

| | Host material in the Light emitting Layer | Voltage (V) | Current Density (mA/cm$^2$) | L (cd/m$^2$) | C. E. (cd/A) | Chromaticity Coordinate (x, y) | Half Lifetime (hours) Initial Luminance: 5000 cd/m$^2$ |
|---|---|---|---|---|---|---|---|
| Example 1 | (C5) | 5.5 | 0.23 | 102 | 44.3 | (0.30, 0.63) | 821 |
| Example 2 | (C8) | 5.4 | 0.20 | 105 | 52.5 | (0.31, 0.62) | 1210 |
| Example 3 | (C14) | 5.5 | 0.24 | 103 | 42.9 | (0.31, 0.62) | 1336 |
| Example 4 | (C22) | 5.7 | 0.26 | 100 | 38.4 | (0.30, 0.64) | 984 |
| Example 5 | (C26) | 5.4 | 0.22 | 101 | 45.9 | (0.31, 0.62) | 816 |
| Example 6 | (C57) | 5.3 | 0.23 | 102 | 44.3 | (0.31, 0.62) | 920 |
| Example 7 | (C66) | 5.4 | 0.24 | 103 | 42.9 | (0.31, 0.63) | 895 |
| Example 8 | (C5)' | 5.4 | 0.26 | 101 | 38.8 | (0.32, 0.61) | 886 |
| Comparative Example 1 | (CBP) | 5.5 | 0.32 | 106 | 33.1 | (0.32, 0.61) | 442 |
| Comparative Example 2 | (CMTTP) | 5.5 | 0.39 | 100 | 25.6 | (0.33, 0.61) | 403 |

Notification:
In Table 1, "L" means Luminance and "C. E." means Currents Efficiency.

As shown in Table 1, it was verified that the organic EL device with the use of the material for organic EL device of the present invention emits green light with an enhanced current efficiency and with a prolonged lifetime.

Example 9

Fabrication of an Organic EL Device: Blue Light Emission

A glass substrate of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode which had been cleaned was attached to a substrate holder of a vacuum vapor deposition apparatus. On the surface of the cleaned substrate at the side having the transparent electrode, a film of TPD232 having a thickness of 62 nm was formed so that the formed film covered the transparent electrode. The formed film of TPD232 worked as the hole injecting layer. Then, on the formed film of TPD232, a film of TCTA below having a thickness of 10 nm was formed. The formed film of TCTA worked as the hole transporting layer. On the formed film of TCTA, a film having a thickness of 30 nm of the foregoing Compound (C8) as a host material was vapor deposited to form a light emitting layer. Simultaneously, the foregoing metal complex (K-10) was added as a phosphorus photoluminescent Ir metal complex dopant. A concentration of (K-10) in the light emitting layer was 7.5% by weight. The formed film worked as a light emitting layer. On the film formed above, a film of the above (A-7) having a thickness 30 nm was formed. The film of Alq worked as the electron injecting layer. Subsequently, lithium fluoride being alkali metal halide was vapor deposited up to 0.2 nm in thickness and then, aluminum was vapor deposited up to 150 nm in thickness. The Al/LiF worked as a cathode. An organic EL device was fabricated in the manner described above.

The device fabricated above was examined by feeding electric current. Blue light was emitted at a luminance of 103 cd/m$^2$ under a voltage of 6.8 V and a current density of 0.37 mA/cm$^2$. The CIE chromaticity coordinates were (0.18, 0.38), and the current efficiency was 27.8 cd/A. Further, as a result of subjecting the device to a continuous test by feeding a constant electric current starting at an initial luminance of 500 cd/m$^2$, it was confirmed that the half lifetime that the luminance reduced to the half value: 250 cd/m$^2$ was 235 hours. The results are shown in Table 2.

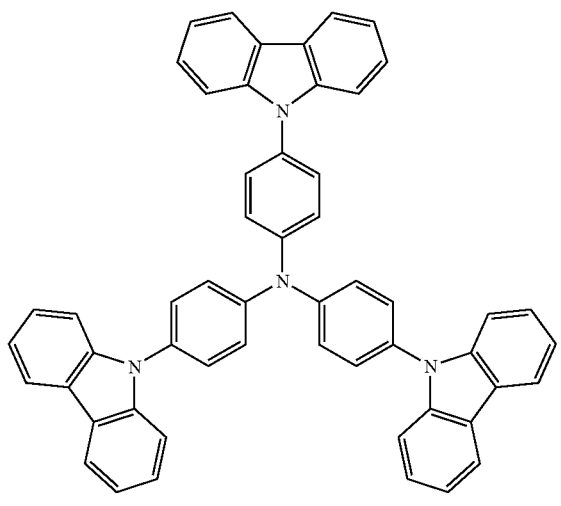

TCTA

Examples 10 to 12

Fabrication of Organic EL Device s: Blue Light Emission

Organic EL devices were fabricated in accordance with the same procedures as those conducted in Example 9 except that compounds shown in Table 2 were used in place of Compound (C8), and the voltage, the current density, the luminance, the current efficiency, the chromaticity and the half lifetime of the luminance were measured in accordance with the same methods as those conducted in Example 1. The results are shown in Table 2.

Comparative Example 3

An organic EL device was fabricated in accordance with the same procedur as conducted in Example 9 except that the above publicly known compound (CBP) was used in place of Compound (C8), and the voltage, the current density, the luminance, the current efficiency, the chromaticity and the half lifetime of the luminance were measured in accordance with the same methods as those conducted in Example 9. The results are shown in Table 2.

Comparative Example 4

An organic EL device was fabricated in accordance with the same procedure as conducted in Example 9 except that the above publicly known compound (CMTTP) was used in place of Compound (C8), and the voltage, the current density, the luminance, the current efficiency, the chromaticity and the half lifetime of the luminance were measured in accordance with the same methods as those conducted in Example 9. The results are shown in Table 2.

Comparative Example 5

An organic EL device was fabricated in accordance with the same procedure as conducted in Example 9 except that the publicly known compound (CTP) below was used in place of Compound (C8), and the voltage, the current density, the luminance, the current efficiency, the chromaticity and the half lifetime of the luminance were measured in accordance with the same methods as those conducted in Example 9. The results are shown in Table 2.

TABLE 2

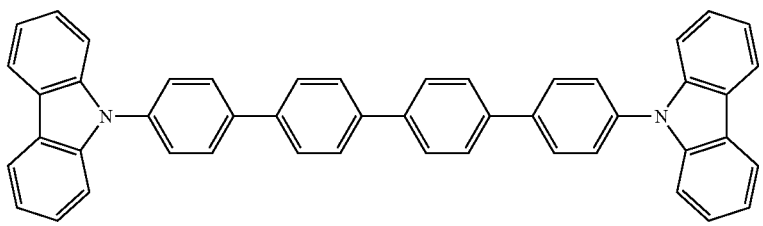

CTP

| | Host material in the Light emitting Layer | Voltage (V) | Current Density (mA/cm$^2$) | L (cd/m$^2$) | C. E. (cd/A) | Chromaticity Coordinate (x, y) | Half Lifetime (hours) Initial Luminance: 5000 cd/m$^2$ |
|---|---|---|---|---|---|---|---|
| Example 9 | (C8) | 6.8 | 0.37 | 103 | 27.8 | (0.18, 0.38) | 235 |
| Example 10 | (C14) | 6.8 | 0.35 | 101 | 28.9 | (0.18, 0.38) | 238 |
| Example 11 | (C26) | 6.5 | 0.32 | 101 | 31.5 | (0.17, 0.36) | 242 |
| Example 12 | (C33) | 6.6 | 0.32 | 104 | 32.5 | (0.17, 0.36) | 284 |
| Comparative Example 3 | (CBP) | 6.8 | 0.63 | 100 | 15.8 | (0.17, 0.38) | 103 |
| Comparative Example 4 | (CMTTP) | 6.8 | 0.44 | 103 | 23.4 | (0.18, 0.38) | 118 |
| Comparative Example 5 | (CTP) | 10.2 | 11.2 | 84 | 0.75 | (0.20, 0.40) | 6 |

Notification:
In Table 2, "L" means Luminance and "C. E." Current Efficiency.

As shown in Table 2, it was verified that the organic EL device with the use of the material for organic EL device of the present invention emits green light with an enhanced current efficiency and with a prolonged lifetime.

What is claimed is:

1. An organic electroluminescence device
comprising an anode, a cathode and an least one organic thin film layer comprising a light emitting layer sandwiched between the anode and the cathode, wherein the light emitting layer comprises a host material and a phosphorescent material and wherein the host material comprises a material for an organic electroluminescence device which comprises a compound represented by any one of following general formulae (1) to (3):

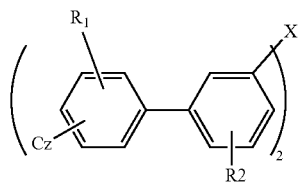

(1)

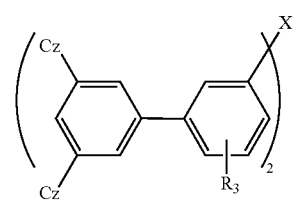

(2)

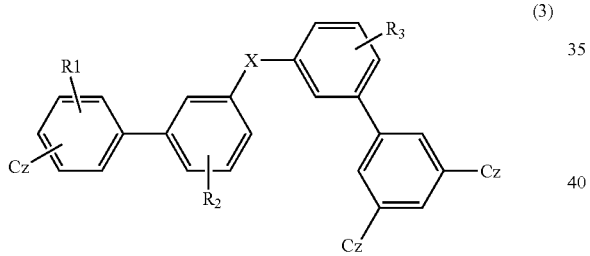

(3)

wherein $R_1$ to $R_3$ each independently represents a hydrogen atom, a halogen atom, an alkyl group having 1 to 40 carbon atoms and further may have a substituent, a heterocyclic group having 3 to 30 carbon atoms and further may have a substituent, an alkoxy group having 1 to 40 carbon atoms and further may have a substituent, an aryl group having 6 to 40 carbon atoms and further may have a substituent, an aryloxy group having 6 to 40 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent;

each of $R_1$ to $R_3$ may plurally exist, and an adjacent group may form a saturated or an unsaturated ring structure between each other respectively;

X is a group expressed by any one of following general formulae (4) to (9),

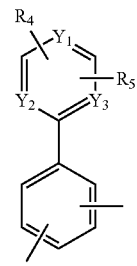

(4)

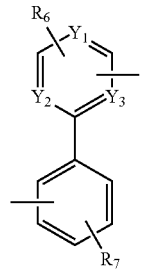

(5)

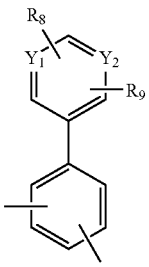

(6)

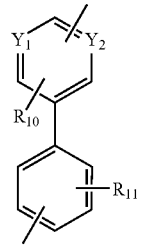

(7)

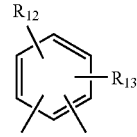

(8)

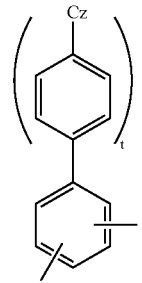

(9)

wherein $R_4$ to $R_{13}$ each independently represents a hydrogen atom, a halogen atom, an alkyl group having 1 to 40 carbon atoms and further may have a substituent, a heterocyclic group having 3 to 30 carbon atoms and further may have a substituent, an alkoxy group having 1 to 40 carbon atoms and further may have a substituent, an aryl group having 6 to 40 carbon atoms and further may have a substituent, an aryloxy group having 6 to 40 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent;

each of $R_4$ to $R_{13}$ may plurally exist, and an adjacent group may form a saturated or an unsaturated ring structure between each other respectively;

$Y_1$ to $Y_3$ each independently represents —CR or a nitrogen atom while R represents a hydrogen atom, a group which bonds to X in any one of the above general formulae (1) to (3), or any one of $R_4$, $R_5$, $R_6$, $R_8$, $R_9$ and $R_{10}$; and when any of $Y_1$ to $Y_3$ represents an nitrogen atom, it exists at least 2 in the same group; t is an integer of 0 or 1;

Cz is a group expressed by a following general formula (10) or a following general formula (11):

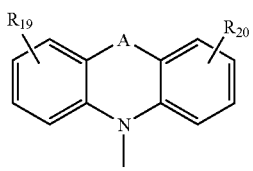

(10)

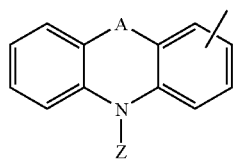

(11)

wherein A represents a single bond, —$(CR_{14}R_{15})n$—, —$SiR_{16}R_{17}$—, —$NR_{18}$—, —O— or —S—; while a couple of $R_{14}$ and $R_{15}$, and a couple of $R_{16}$ and $R_{17}$ may bond each other to form a saturated or an unsaturated ring structure; and n represents an integer of 1 to 3;

wherein $R_{14}$ to $R_{20}$ each independently represents a hydrogen atom, a halogen atom, an alkyl group having 1 to 30 carbon atoms and further may have a substituent, a heterocyclic group having 3 to 20 carbon atoms and further may have a substituent, an alkoxy group having 1 to 30 carbon atoms and further may have a substituent, an aryl group having 6 to 40 carbon atoms and further may have a substituent, an aryloxy group having 6 to 30 carbon atoms and further may have a substituent, an aralkyl group having 7 to 40 carbon atoms and further may have a substituent, an alkenyl group having 2 to 40 carbon atoms and further may have a substituent, an alkylamino group having 1 to 80 carbon atoms and further may have a substituent, an arylamino group having 6 to 80 carbon atoms and further may have a substituent, an aralkylamino group having 7 to 80 carbon atoms and further may have a substituent, an alkylsilyl group having 3 to 10 carbon atoms and further may have a substituent, and an arylsilyl group or a cyano group having 6 to 30 carbon atoms and further may have a substituent;

each of $R_{19}$ to $R_{20}$ may plurally exist, and an adjacent group may form a saturated or an unsaturated ring structure between each other respectively; and Z represents an alkyl group having 1 to 20 carbon atoms which may be substituted, an aryl group having 1 to 18 carbon atoms which may be substituted or an aralkyl group having 7 to 40 carbon atoms which may be substituted.

2. The organic electroluminescence device according to claim 1, wherein a reductive dopant is added in an interfacial region between said cathode and said organic thin film layer.

3. The organic electroluminescence device according to claim 1, which further comprises an electron injecting layer between said light emitting layer and said cathode and wherein the electron injecting layer comprises a nitrogen atom-containing ring derivative.

* * * * *